United States Patent
Kim et al.

(10) Patent No.: US 9,537,108 B2
(45) Date of Patent: *Jan. 3, 2017

(54) HETEROCYCLIC COMPOUND AND ORGANIC LIGHT-EMITTING DEVICE INCLUDING THE SAME

(71) Applicant: SAMSUNG DISPLAY CO., LTD., Yongin, Gyeonggi-Do (KR)

(72) Inventors: Soo-Yon Kim, Yongin (KR); Seok-Hwan Hwang, Yongin (KR); Young-Kook Kim, Yongin (KR); Jun-Ha Park, Yongin (KR); Hye-Jin Jung, Yongin (KR); Eun-Young Lee, Yongin (KR); Sang-Hyun Han, Yongin (KR); Jin-O Lim, Yongin (KR); Eun-Jae Jeong, Yongin (KR); Jong-Hyuk Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 335 days.

This patent is subject to a terminal disclaimer.

(21) Appl. No.: 14/250,818

(22) Filed: Apr. 11, 2014

(65) Prior Publication Data

US 2014/0361267 A1   Dec. 11, 2014

(30) Foreign Application Priority Data

Jun. 7, 2013  (KR) .................. 10-2013-0065466

(51) Int. Cl.
*H01L 51/00* (2006.01)
*H01L 51/50* (2006.01)

(52) U.S. Cl.
CPC ....... *H01L 51/0072* (2013.01); *H01L 51/0094* (2013.01); *H01L 51/5016* (2013.01); *H01L 51/5072* (2013.01)

(58) Field of Classification Search
None
See application file for complete search history.

(56) References Cited

U.S. PATENT DOCUMENTS 7,429,372 B2    9/2008   Pez et al.
2012/0235123 A1  9/2012   Lee et al.
(Continued)

FOREIGN PATENT DOCUMENTS

KR    10-2011-0015836 A    2/2011
KR    10-2011-0122051 A    11/2011

OTHER PUBLICATIONS

2009 Fall Assembly and Symposium. vol. 34, No. 2, 2009.
(Continued)

*Primary Examiner* — J. L. Yang
(74) *Attorney, Agent, or Firm* — Lee & Morse, P.C.

(57) ABSTRACT

Provided is a heterocyclic compound represented by Formula 1 below and an organic light-emitting device including the same.

<Formula 1>

(Continued)

In Formula 1, $R_1$ to $R_8$ are each independently a hydrogen atom, a deuterium atom, a substituted or unsubstituted $C_1$ to $C_{60}$ alkyl group, a substituted or unsubstituted $C_3$ to $C_{60}$ cycloalkyl group, a substituted or unsubstituted $C_2$ to $C_{60}$ heteroaryl group, a substituted or unsubstituted $C_6$ to $C_{60}$ aryl group, or a substituted or unsubstituted $C_6$ to $C_{60}$ condensed polycyclic group, with the proviso that $R_2$ is not

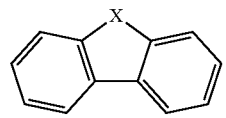

wherein X is O, S, or Se.

20 Claims, 1 Drawing Sheet

(56) References Cited

U.S. PATENT DOCUMENTS

2013/0056720 A1 3/2013 Kim et al.
2014/0361254 A1* 12/2014 Hwang ............... H01L 51/0067
  257/40

OTHER PUBLICATIONS

Aldrich internet: 4H-benzo[def]carbazole http://www.sigmaaldrich.com/catalog/product/aldrich/ph007423?lang=ko&region=KR.
Appl. Phys. Lett. 1999, 75, 4.
Appl. Phys. Lett. 2000, 77, 904.
Appl. Phys. Lett. 2002, 81, 162.
Nature, 1998, 395, 151-154 Abstract.

* cited by examiner

| SECOND ELECTRODE |
|:---:|
| EIL |
| ETL |
| EML |
| HTL |
| HIL |
| FIRST ELECTRODE |

HETEROCYCLIC COMPOUND AND ORGANIC LIGHT-EMITTING DEVICE INCLUDING THE SAME

CROSS-REFERENCE TO RELATED APPLICATION

Korean Patent Application No. 10-2013-0065466, filed on Jun. 7, 2013, in the Korean Intellectual Property Office, and entitled: "Heterocyclic Compound and Organic Light-Emitting Device Including the Same," is incorporated by reference herein in its entirety.

BACKGROUND

1. Field

Embodiments relate to a heterocyclic compound and an organic light-emitting device including the same.

2. Description of the Related Art

Organic light-emitting devices (OLEDs), which are self-emitting devices, may have advantages such as wide viewing angles, excellent contrast, quick response, high brightness, excellent driving voltage characteristics, and provide full color images.

SUMMARY

According to an embodiment, provided is a heterocyclic compound represented by Formula 1:

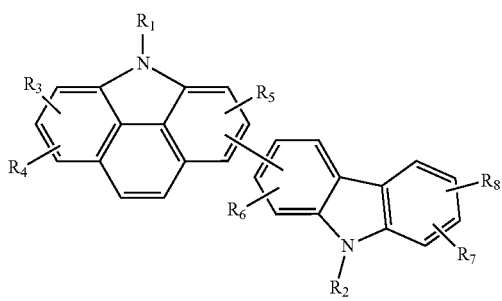

<Formula 1> wherein in Formula 1, $R_1$ to $R_8$ are each independently a hydrogen atom, a deuterium atom, a substituted or unsubstituted $C_1$ to $C_{60}$ alkyl group, a substituted or unsubstituted $C_3$ to $C_{60}$ cycloalkyl group, a substituted or unsubstituted $C_2$ to $C_{60}$ heteroaryl group, a substituted or unsubstituted $C_5$ to $C_{60}$ aryl group, or a substituted or unsubstituted $C_6$ to $C_{60}$ condensed polycyclic group, with the proviso that $R_2$ is not

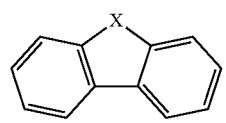

wherein X is O, S, or Se.

The heterocyclic compound of Formula 1 may be represented by Formula 2 below:

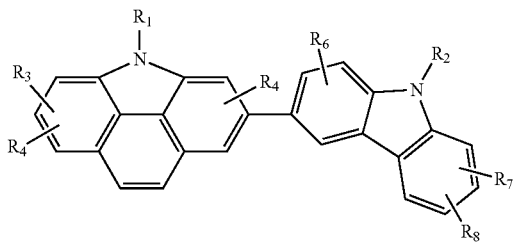

<Formula 2> wherein $R_1$ to $R_8$ in Formula 2 are the same as defined for Formula 1.

The heterocyclic compound of Formula 1 may be represented by Formula 3 below:

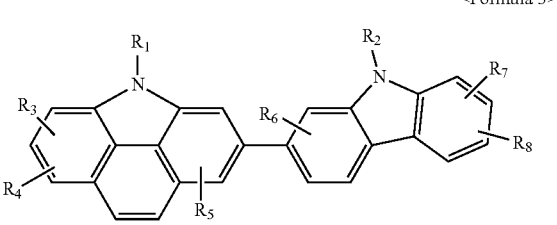

<Formula 3> wherein $R_1$ to $R_8$ in Formula 3 are the same as defined for Formula 1.

The heterocyclic compound of Formula 1 may be represented by Formula 4 below:

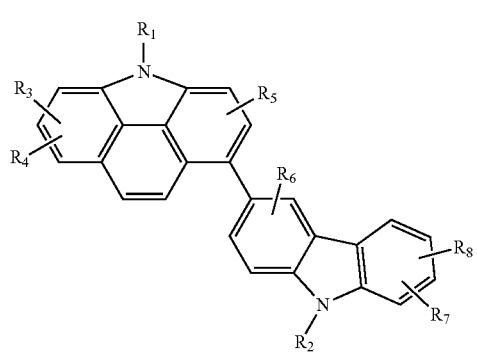

<Formula 4> wherein $R_1$ to $R_8$ in Formula 4 are the same as defined for Formula 1.

The heterocyclic compound of Formula 1 may be represented by Formula 5 below:

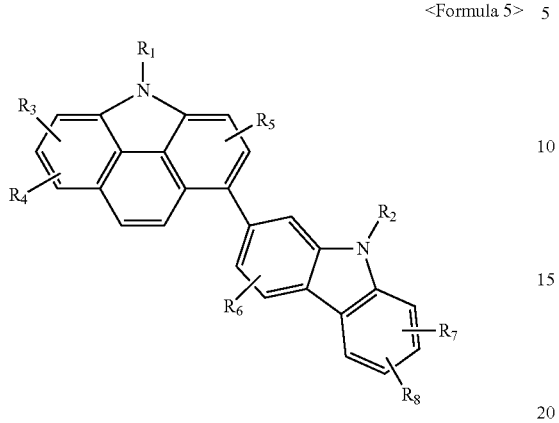

<Formula 5> wherein $R_1$ to $R_8$ in Formula 5 are the same as defined for Formula 1.

In Formula 1, $R_1$ and $R_2$ may each independently be any one of Formulae 2a to 2d below

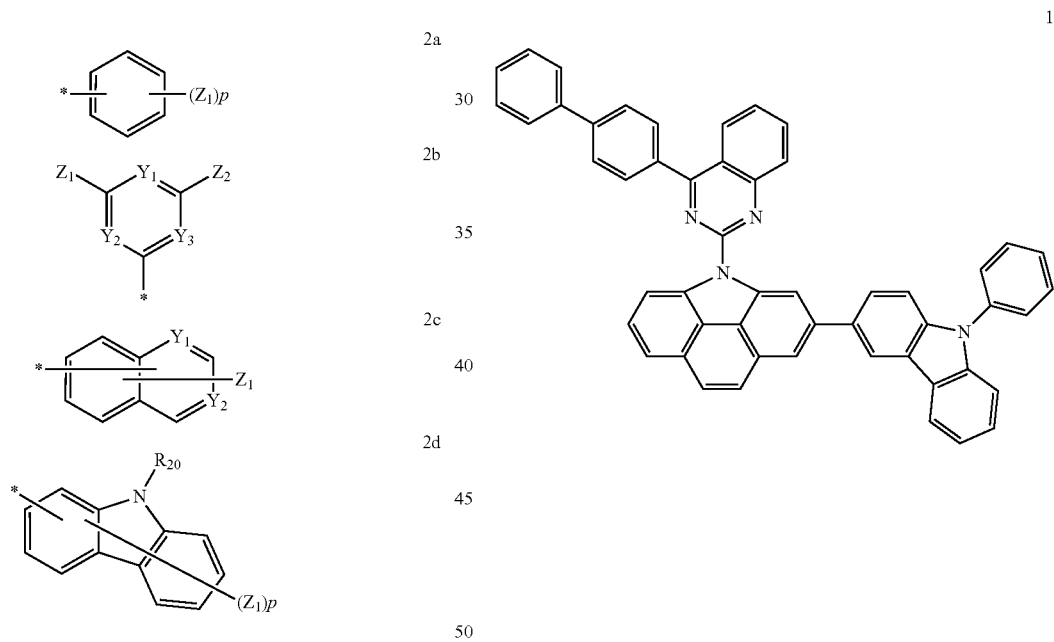

wherein in Formulae 2a to 2d,
$Y_1$ to $Y_3$ are each independently N or CH;
$Z_1$, $Z_2$, and $R_{20}$ are each independently a hydrogen atom, a deuterium atom, a substituted or unsubstituted $C_1$ to $C_{20}$ alkyl group, a $C_1$ to $C_{20}$ alkylsilyl group, a $C_1$ to $C_{20}$ arylsilyl, a substituted or unsubstituted $C_6$ to $C_{20}$ aryl group, a substituted or unsubstituted $C_2$ to $C_{20}$ heteroaryl group, a substituted or unsubstituted $C_6$ to $C_{20}$ condensed polycyclic group, an amino group substituted with a $C_6$ to $C_{20}$ aryl group or a $C_2$ to $C_{20}$ heteroaryl group, a halogen group, a cyano group, a nitro group, a hydroxyl group, or a carboxyl group, and each $Z_1$ in Formulae 2a to 2d may be identical to or different from each other;
p is an integer of 1 to 7; and
* indicates a binding.

In Formula 1 $R_3$ to $R_8$ may each independently be a hydrogen atom or a deuterium atom.

The compound of Formula 1 may be any one of compounds below:

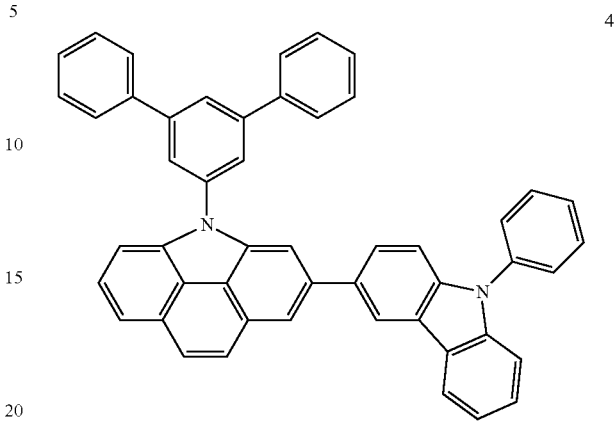

4

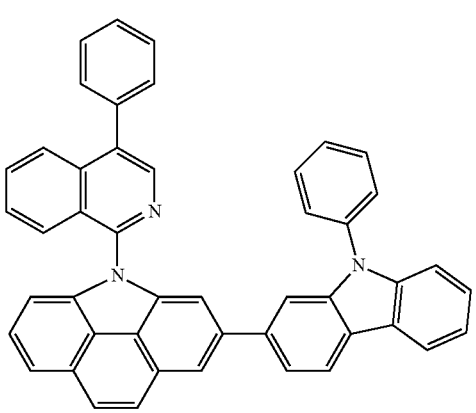

26

29
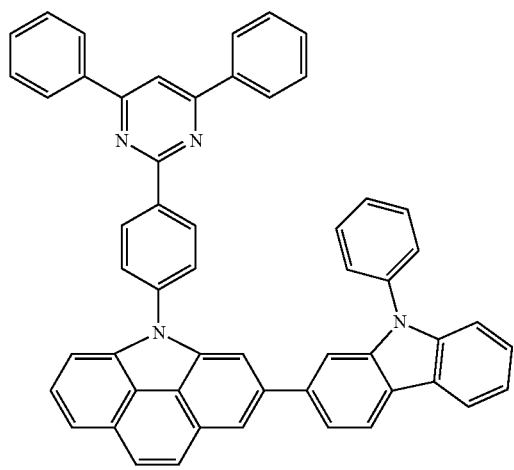
31
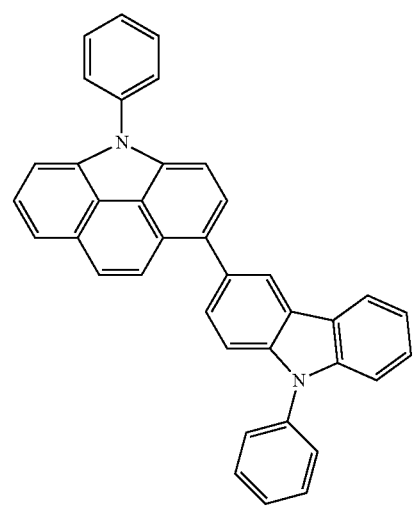
41
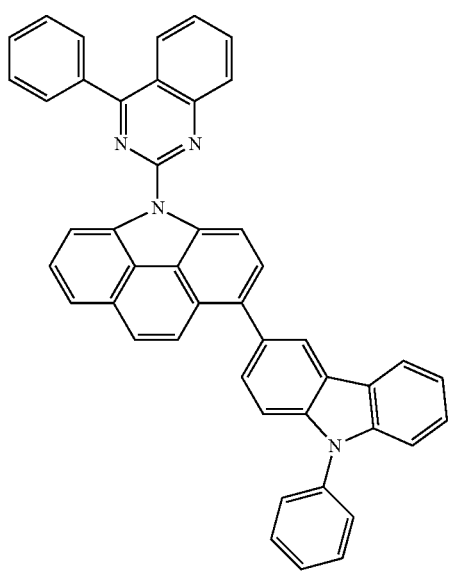
52
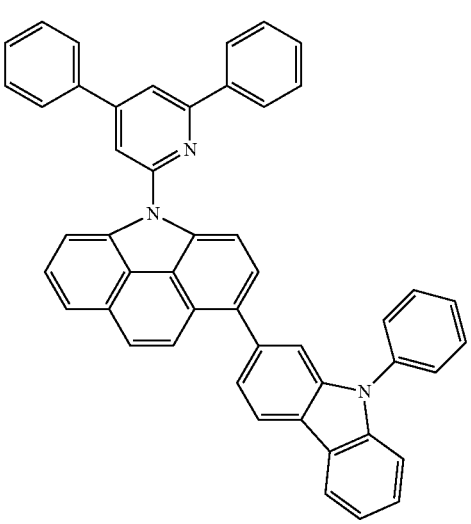
65
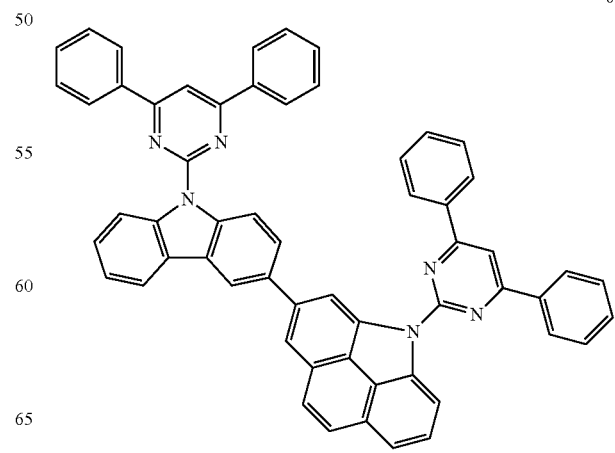
69

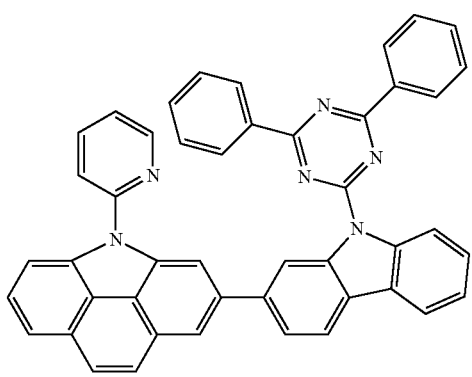

83

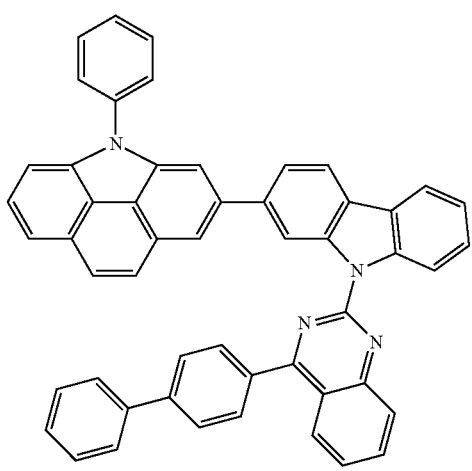

91

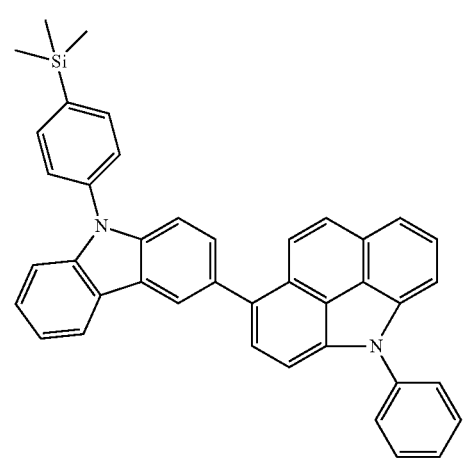

95

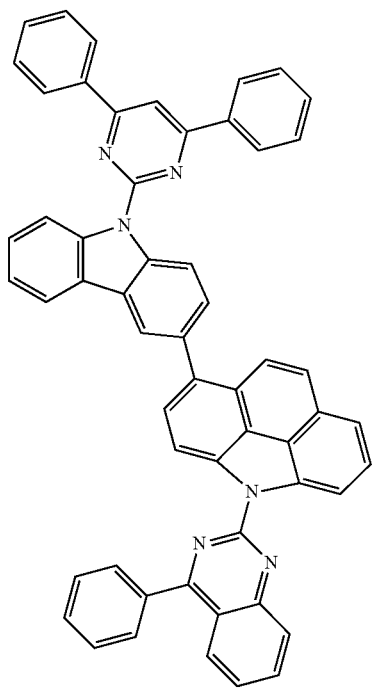

104

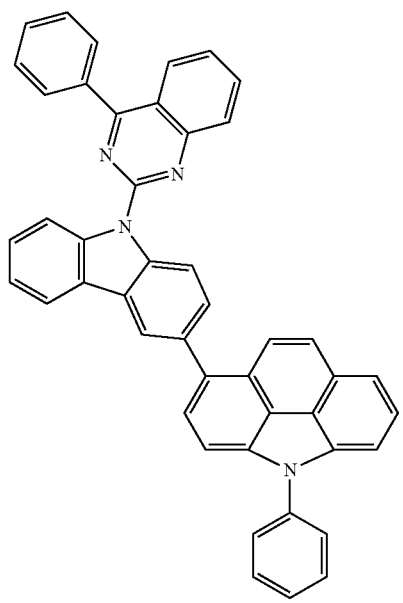

107

In an embodiment, provided is an organic light-emitting device including: a first electrode; a second electrode; and an organic layer interposed between the first electrode and the second electrode, wherein the organic layer includes the heterocyclic compound.

The organic layer may be an emission layer or an electron transport layer.

The organic layer may include an emission layer, an electron injection layer, an electron transport layer, a functional layer having an electron injection capability and an electron transport capability, a hole injection layer, a hole transport layer, or a functional layer having a hole injection capability and a hole transportation capability. The emission layer may include an anthracene-based compound, an arylamine-based compound, or a styryl-based compound.

The organic layer may include an emission layer, an electron injection layer, an electron transport layer, a functional layer having an electron injection capability and an electron transport capability, a hole injection layer, a hole transport layer, or a functional layer having a hole injection capability and a hole transportation capability. The emission layer may include a red layer, a green layer, a blue layer, or a white layer, one of which includes a phosphorescent compound.

The hole injection layer, the hole transport layer, or the functional layer having a hole injection capability and a hole transport capability may include a charge-generation material.

The charge-generation material may be a p-dopant.

The p-dopant may be a quinone derivative.

The p-dopant may be a metal oxide.

The p-dopant may be a compound containing a cyano group.

The organic layer may include an electron transport layer, and the electron transport layer may further comprise a metal oxide.

The organic layer may be formed by coating the heterocyclic compound.

According to another embodiment, provided is a flat panel display apparatus including the organic light-emitting device, wherein the first electrode of the organic light-emitting device is electrically connected to a source electrode or a drain electrode of a thin film transistor.

BRIEF DESCRIPTION OF THE DRAWINGS

Features will become apparent to those of skill in the art by describing in detail exemplary embodiments with reference to the attached drawings in which:

FIG. 1 is a schematic view of an organic light-emitting device according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration.

A compound according to an embodiment is represented by Formula 1 below:

<Formula 1>

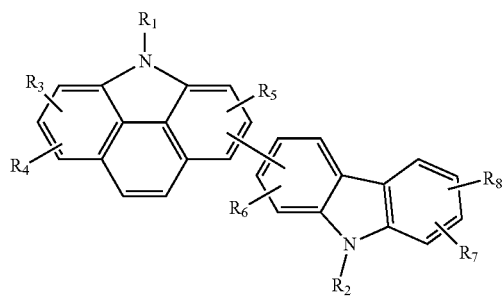

wherein in Formula 1, $R_1$ to $R_8$ are each independently a hydrogen atom, a deuterium atom, a substituted or unsubstituted $C_1$ to $C_{60}$ alkyl group, a substituted or unsubstituted $C_3$ to $C_{60}$ cycloalkyl group, a substituted or unsubstituted $C_2$ to $C_{60}$ heteroaryl group, a substituted or unsubstituted $C_5$ to $C_{60}$ aryl group, or a substituted or unsubstituted $C_6$ to $C_{60}$ condensed polycyclic group, with the proviso that $R_2$ is not wherein X is O, S, or Se,

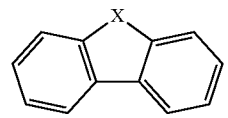

The compound represented by Formula 1 may be represented by Formula 2, Formula 3, Formula 4, or Formula 5:

<Formula 2>

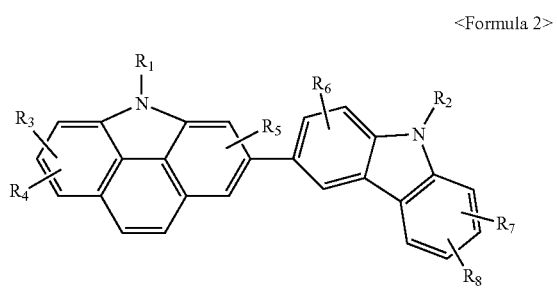

<Formula 3>

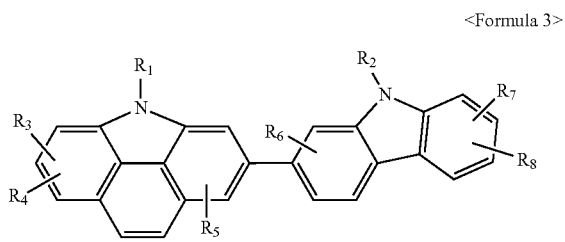

<Formula 4>

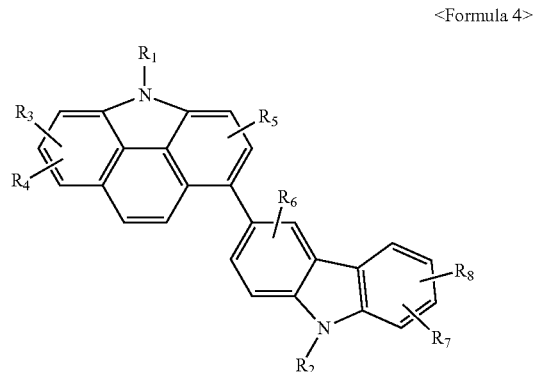

<Formula 5>

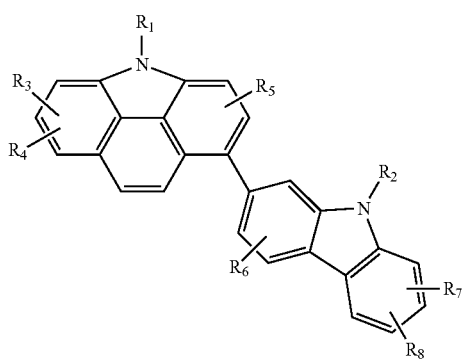

wherein R₁ to R₈ are the same as described above.

Hereinafter, substituents of the heterocyclic compound of Formula 1 will be described in detail.

According to an embodiment, R₁ and R₂ in Formula 1 may each independently be any one of Formulae 2a to 2d:

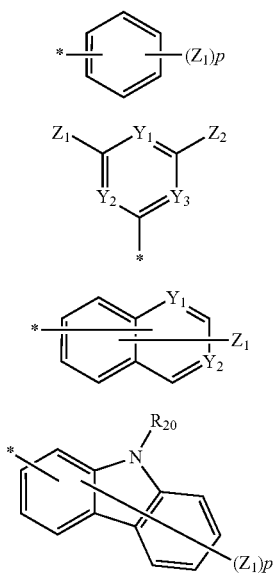

wherein in Formulae 2a to 2d,

Y₁ to Y₃ are each independently N or CH;

Z₁, Z₂, and R₂₀ are each independently a hydrogen atom, a deuterium atom, a substituted or unsubstituted C₁ to C₂₀ alkyl group, a C₁ to C₂₀ alkylsilyl group, a C₁ to C₂₀ arylsilyl, a substituted or unsubstituted C₆ to C₂₀ aryl group, a substituted or unsubstituted C₂ to C₂₀ heteroaryl group, a substituted or unsubstituted C₆ to C₂₀ condensed polycyclic group, an amino group substituted with a C₆ to C₂₀ aryl group or a C₂ to C₂₀ heteroaryl group, a halogen group, a cyano group, a nitro group, a hydroxyl group, or a carboxyl group, and each Z₁ in Formulae 2a to 2d may be identical to or different from each other;

p is an integer of 1 to 7; and * indicates a binding.

According to another embodiment, R₃ to R₈ in Formula 1 may each independently be a hydrogen atom or a deuterium atom.

Hereinafter, definitions of representative substituents from among substituents used herein will be presented (the number of carbon numbers restricting a substituent is not limited, and does not limit properties of the substituent, and unless defined otherwise, the definition of the substituent is consistent with a general definition thereof).

The unsubstituted $C_1$ to $C_{60}$ alkyl group used herein may be a linear or branched alkyl group, and examples thereof include a methyl group, an ethyl group, a propyl group, an isobutyl group, a sec-butyl group, a pentyl group, an iso-amyl group, a hexyl group, a heptyl, an octyl, a nonanyl, and a dodecyl, and at least one hydrogen atom of the alkyl group may be substituted with a deuterium atom, a halogen atom, a hydroxyl group, a nitro group, a cyano group, an amino group, an amidino group, a hydrazine, a hydrazone, a carboxyl group or salt thereof, a sulfonic acid or salt thereof, a phosphoric acid or salt thereof, a $C_1$ to $C_{10}$ alkyl group, a $C_1$ to $C_{10}$ alkoxy group, a $C_2$ to $C_{10}$ alkenyl group, a $C_2$ to $C_{10}$ alkynyl group, a C6 to 16 aryl group, or a $C_2$ to $C_{16}$ heteroaryl group.

The unsubstituted $C_2$ to $C_{60}$ alkenyl group used herein refers to an unsubstituted alkyl group having one or more carbon double bonds at a center or end thereof. Examples thereof are ethenyl, prophenyl, and butenyl. At least one hydrogen atom of the unsubstituted alkenyl group may be substituted with the same substituents as described in connection with the substituted alkyl group.

The unsubstituted $C_2$ to $C_{60}$ alkynyl group used herein refers to an unsubstituted alkyl group having one or more carbon triple bonds at a center or end thereof. Examples thereof are acetylene, propylene, phenylacetylene, naphthylacetylene, isopropylacetylene, t-butylacetylene, and diphenylacetylene. At least one hydrogen atom of the unsubstituted alkynyl group may be substituted with the same substituents as described in connection with the substituted alkyl group.

The unsubstituted $C_3$ to $C_{60}$ cycloalkyl group used herein refers to a $C_3$ to $C_{60}$ cyclic alkyl group, and at least one hydrogen atom of the cycloalkyl group may be substituted with the same substituents as described in connection with the $C_1$ to $C_{60}$ alkyl group.

The unsubstituted $C_1$ to $C_{60}$ alkoxy group used herein refers to a group having —OA (wherein A is the unsubstituted C1 to $C_{60}$ alkyl group), and examples thereof include ethoxy, ethoxy, isopropyloxy, butoxy, and pentoxy. At least one hydrogen atom of the unsubstituted alkoxy group may be substituted with the same substituents as described in connection with the alkyl group.

The unsubstituted $C_6$ to $C_{60}$ aryl group used herein refers to a carbocyclic aromatic system having at least one aromatic ring, and when the number of rings is two or more, the rings may be fused to each other or may be linked to each other via, for example, a single bond. The term 'aryl' includes an aromatic system, such as phenyl, naphthyl, or anthracenyl. Also, at least one hydrogen atom of the aryl may be substituted with the same substituents described in connection with the $C_1$ to $C_{60}$ alkyl group.

Examples of a substituted or unsubstituted $C_6$ to $C_{60}$ aryl group are a phenyl group, a $C_1$ to $C_{10}$ alkylphenyl group (for example, an ethylphenyl group), a biphenyl group, a $C_1$ to $C_{10}$ alkylbiphenyl group, a $C_1$ to $C_{10}$ akoxybiphenyl group, o-, m-, and p-tolyl groups, o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a $C_1$ to $C_{10}$ alkylnaphthyl group (for example, methylnaphthyl group), a $C_1$ to $C_{10}$ akoxynaphthyl group (for example, methoxynaphthyl group), n anthracenyl group, an azrenyl group, a heptalenyl group, an acenaphthylenyl group, a phenalenyl group, a fluorenyl group, an anthraquinolinyl group, a methylan anthryl group, a phenanthryl group, a triphenylenyl group, a pyrenyl group, a chrysenyl group, an ethyl-chrysenyl group, a picenyl group, a perylenyl group, a chloroperylenyl group, a pentaphenyl group, a pentasenyl group, a tetraphenylenyl group, a hexaphenyl group, a hexacenyl group, a rubicenyl group, a coroneryl group, trinaphthylenyl group, a heptaphenyl group, a heptalenyl group, a piranthrenyl group, and an obarenyl group.

The unsubstituted $C_2$-$C_{60}$ heteroaryl group used herein includes at least one hetero atom selected from nitrogen (N), oxygen (O), phosphorous (P), and sulfur (S), and when the group has two or more rings, the rings may be fused to each other or may be linked to each other via, for example, a single bond. Examples of the unsubstituted $C_2$-$C_{60}$ heteroaryl group are a pyrazolyl group, an imidazolyl group, a oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, and a dibenzothiophene group. Also, at least one hydrogen atom of the heteroaryl may be substituted with the same substituents described in connection with the $C_1$ to $C_{60}$ alkyl group.

The $C_6$ to $C_{60}$ unsubstituted aryloxy group used herein refers to a group represented by —$OA_1$, wherein $A_1$ is the $C_6$ to $C_{60}$ aryl group. An example of the aryloxy group is a phenoxy group. At least one hydrogen atom of the aryloxy may be substituted with the same substituents described in connection with the $C_1$ to $C_{60}$ alkyl group.

The $C_6$ to $C_{60}$ unsubstituted arylthio group used herein refers to a group represented by —$SA_1$, wherein $A_1$ is the $C_6$ to $C_{60}$ aryl group. Examples of the arylthio group are a benzenethio group are a naphthylthio group. At least one hydrogen atom of the arylthio group may be substituted with the same substituents described in connection with the $C_1$ to $C_{60}$ alkyl group.

The unsubstituted $C_6$ to $C_{60}$ condensed polycyclic group used herein refers to a substituent having two or more rings formed by fusing at least one aromatic ring and/or at least one non-aromatic ring or a substituent in which a unsaturated group is present in a ring but a conjugated system does not exist, and the condensed polycyclic group overall does not have an orientation, which is why the condensed polycyclic group is distinguished from the aryl group or the heteroaryl group.

Detailed examples of the heterocyclic compound represented by Formula 1 are provided below.

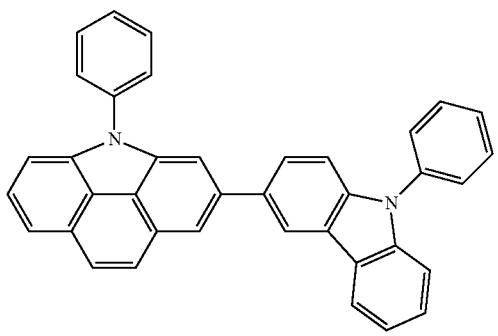

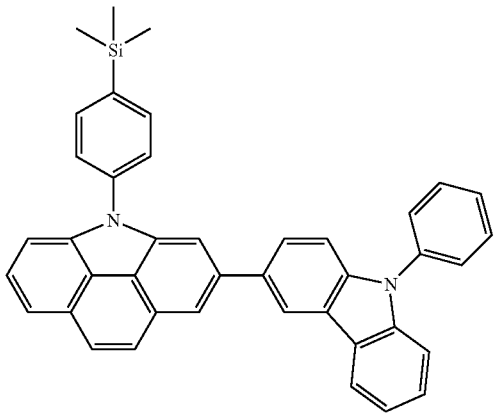

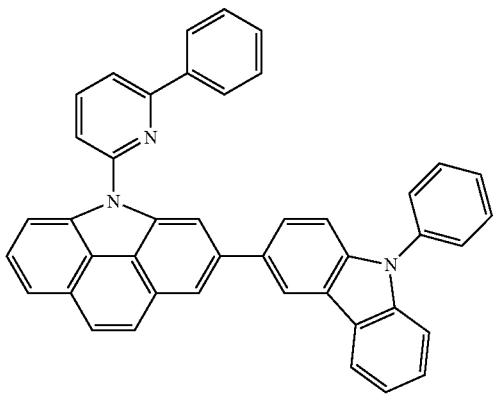

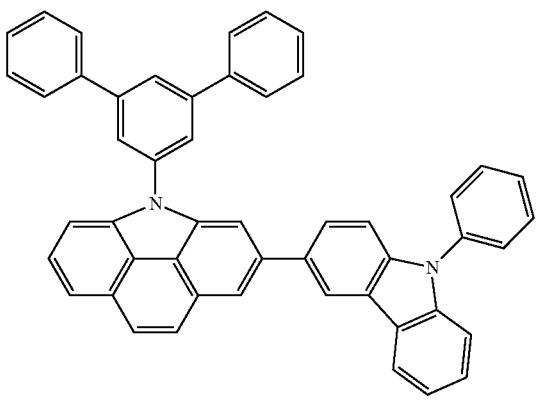

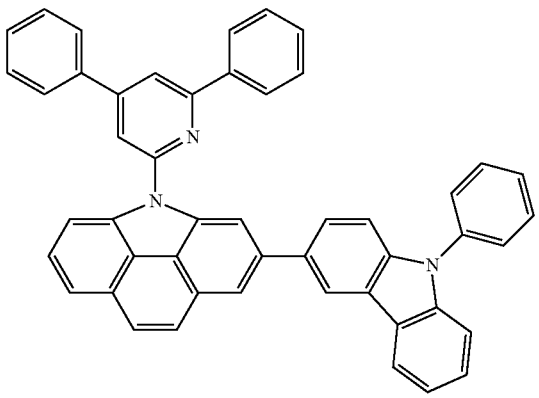

6
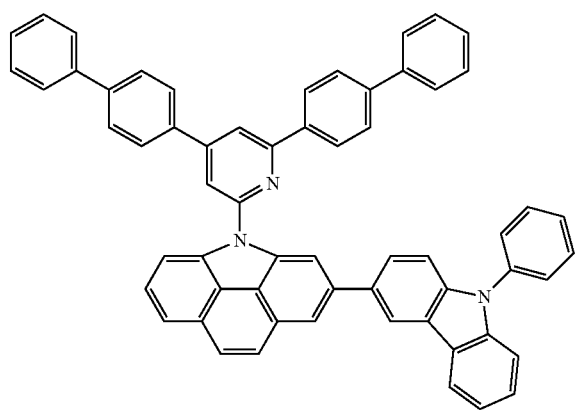
7
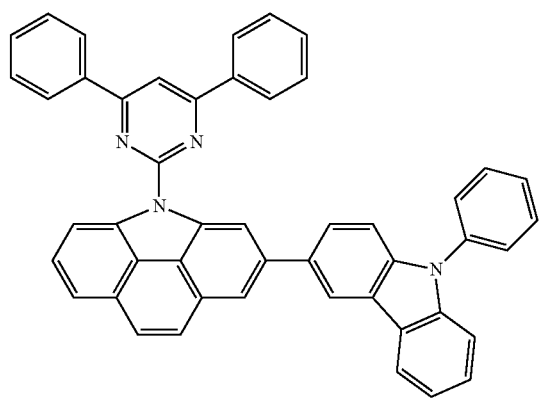
8
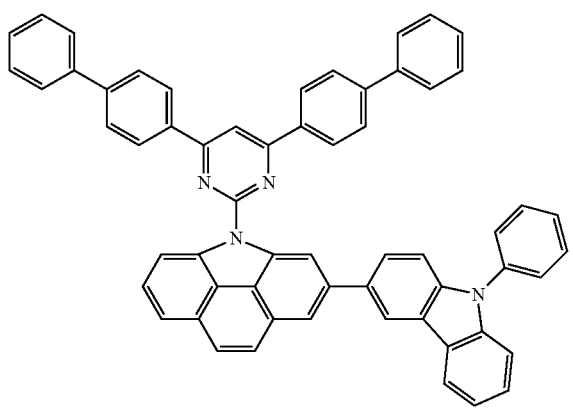
9
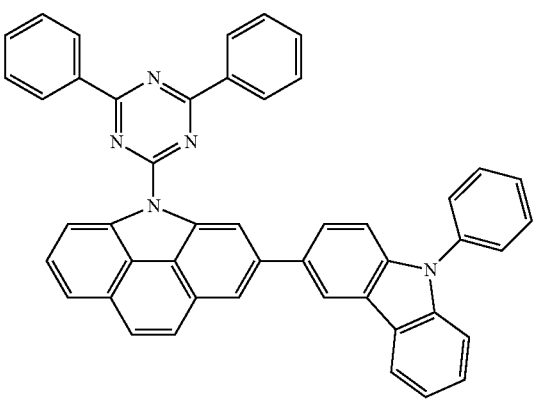
10
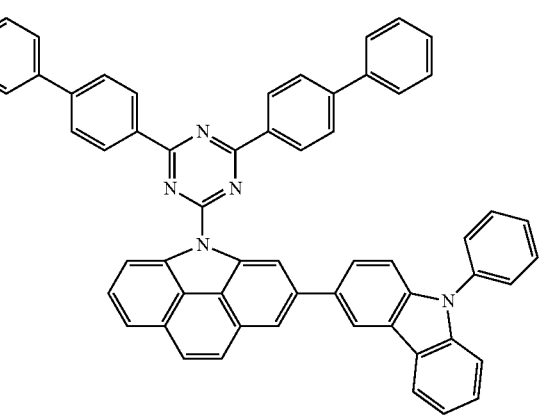
11
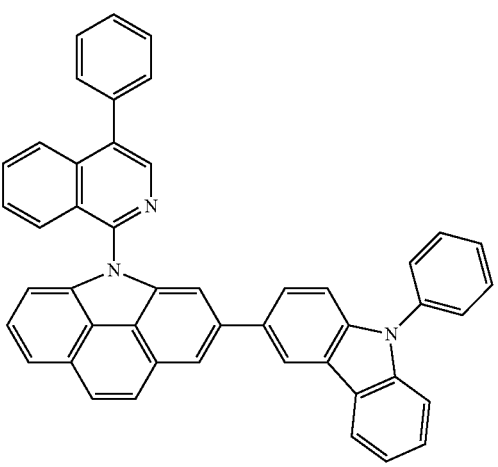

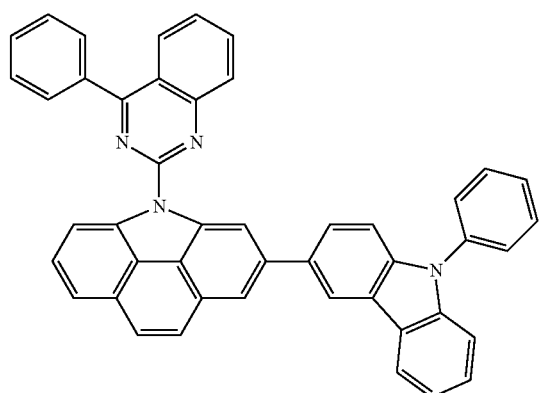
12
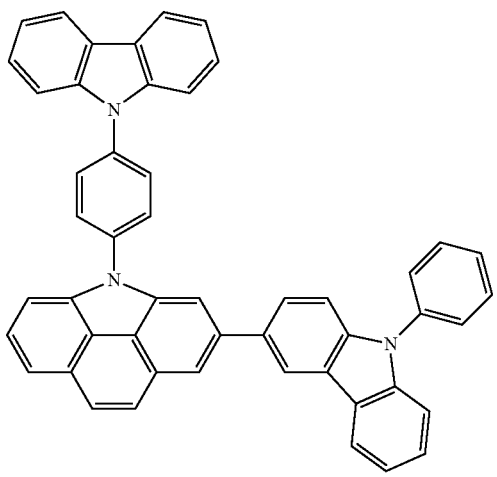
15
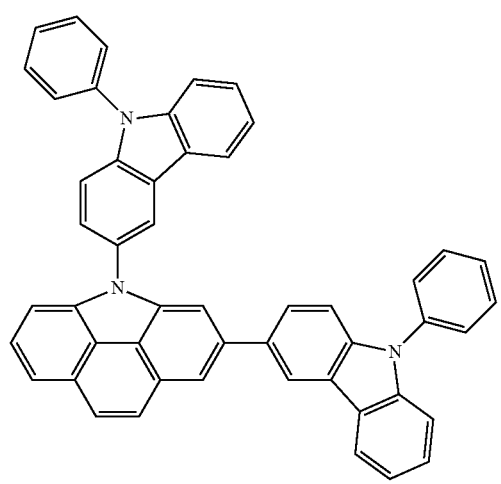
13
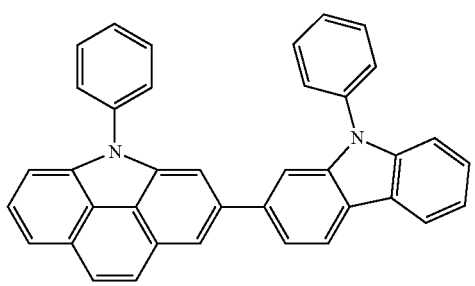
16
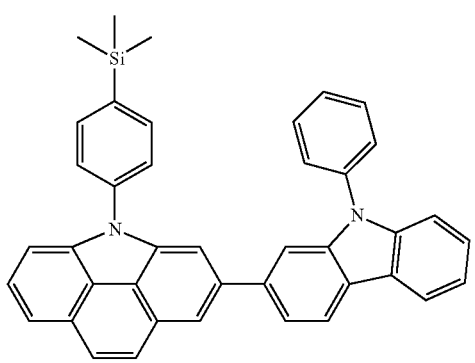
17
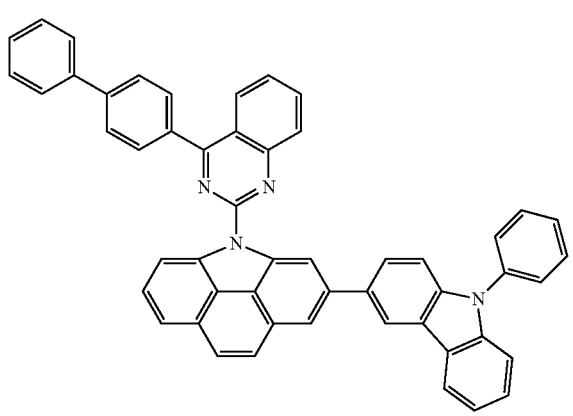
14
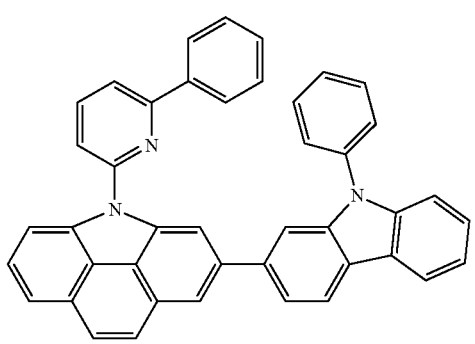
18

19
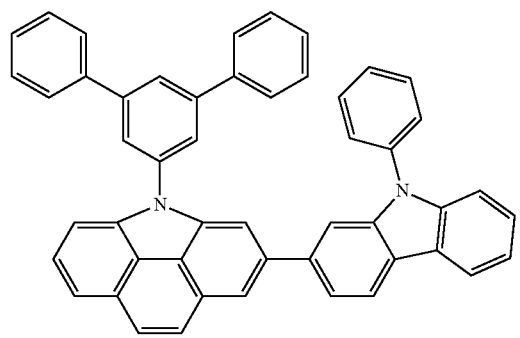
20
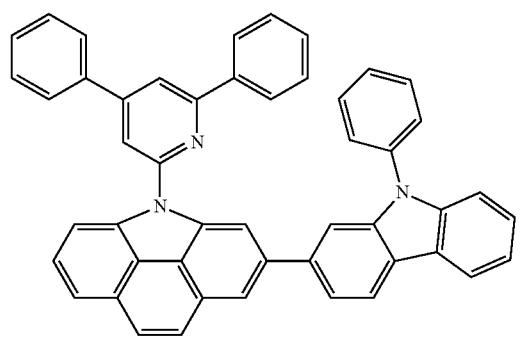
21
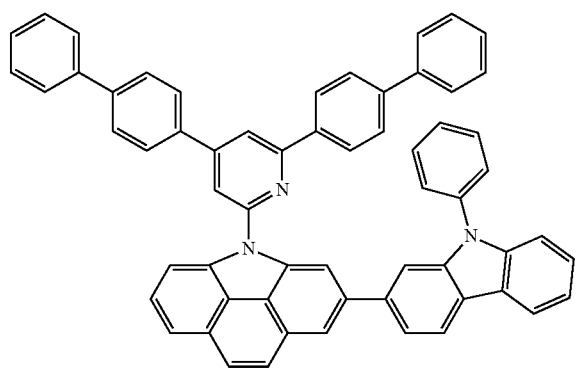
22
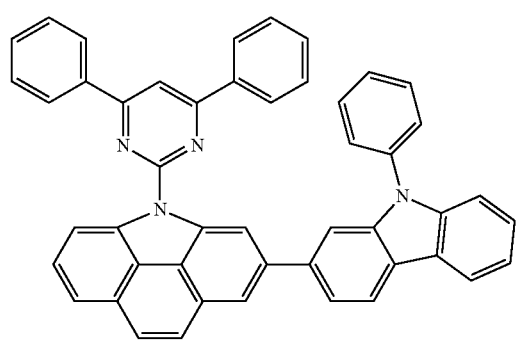
23
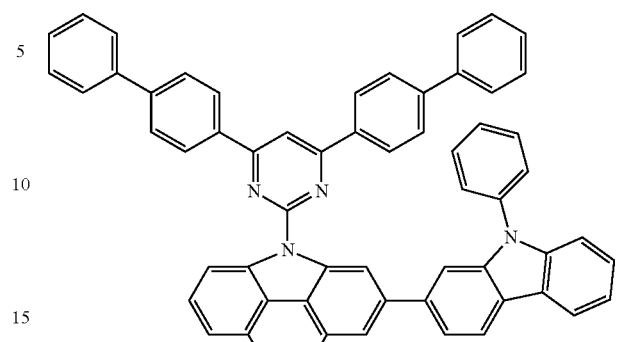
24
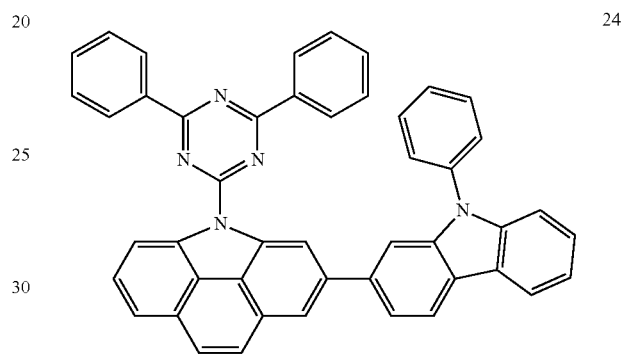
25
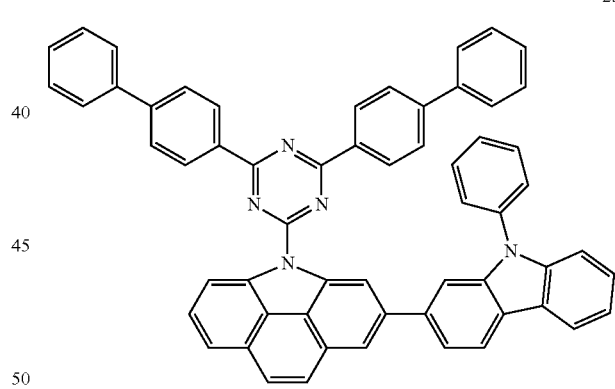
26
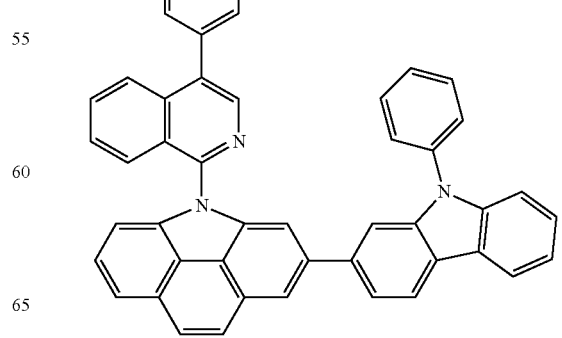

27
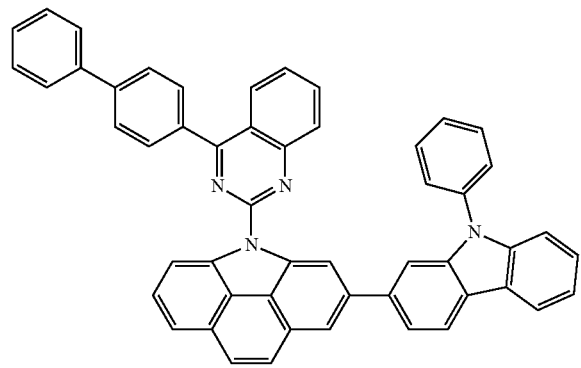
28
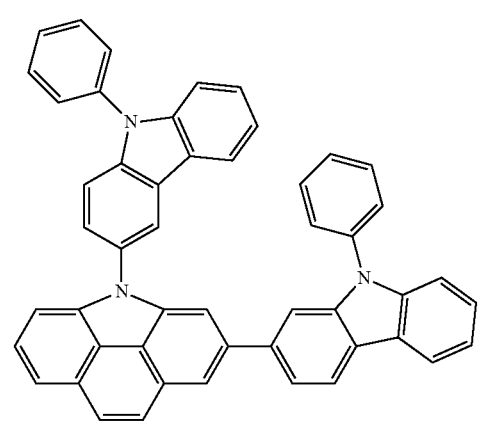
29
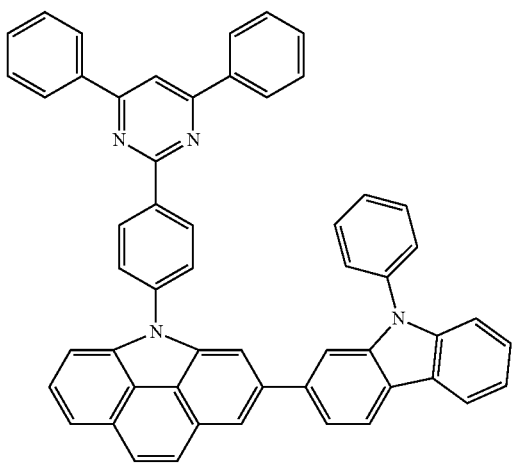
30
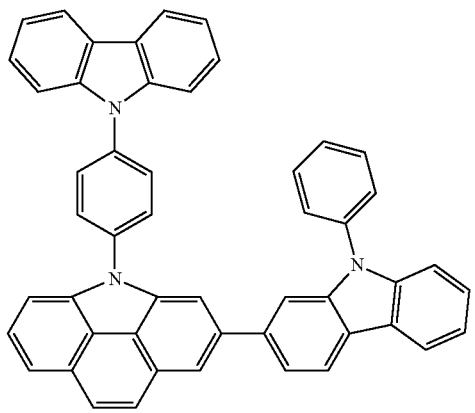
31
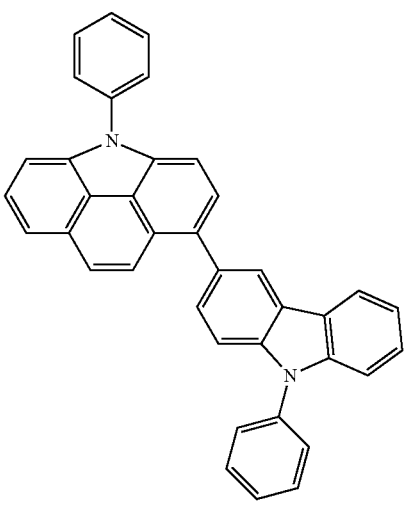
32
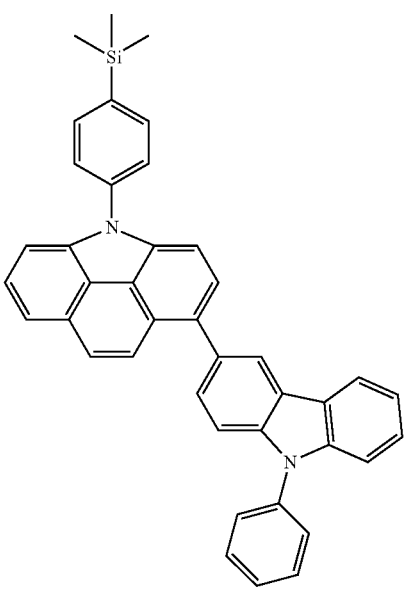

33
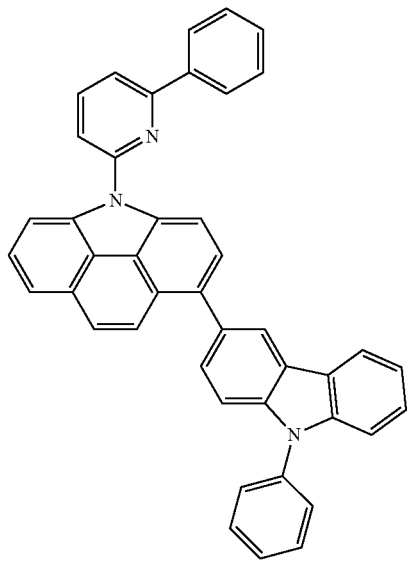
34
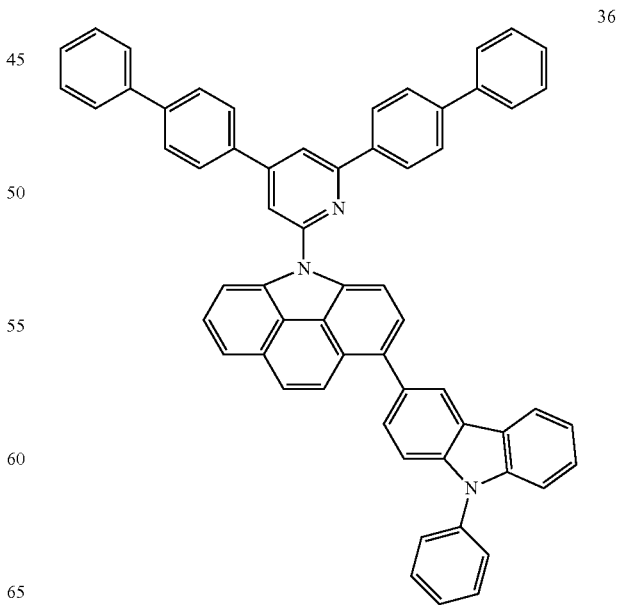
35
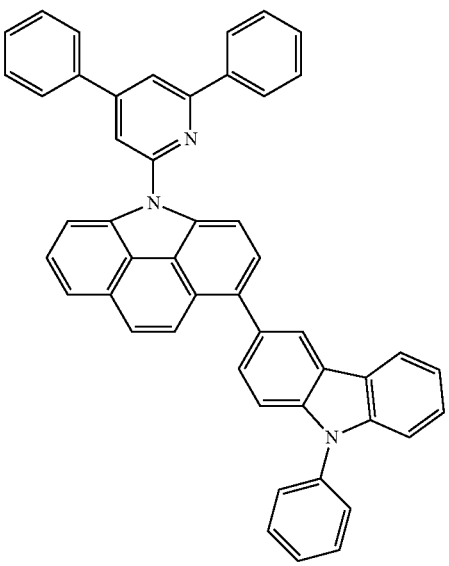
36
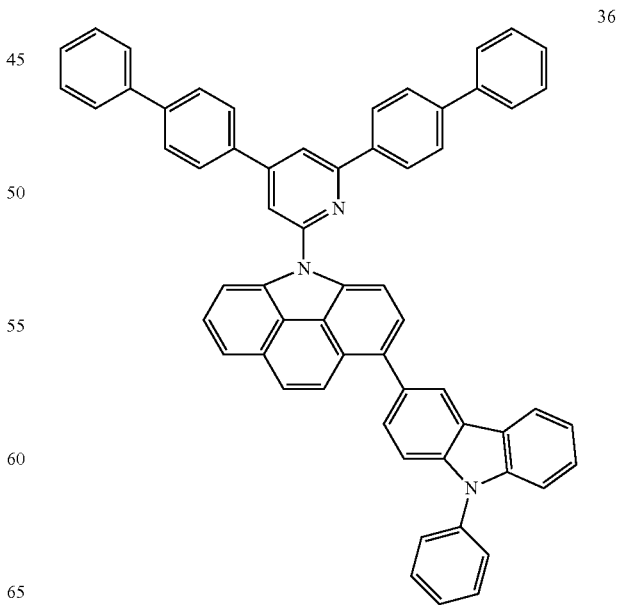

37
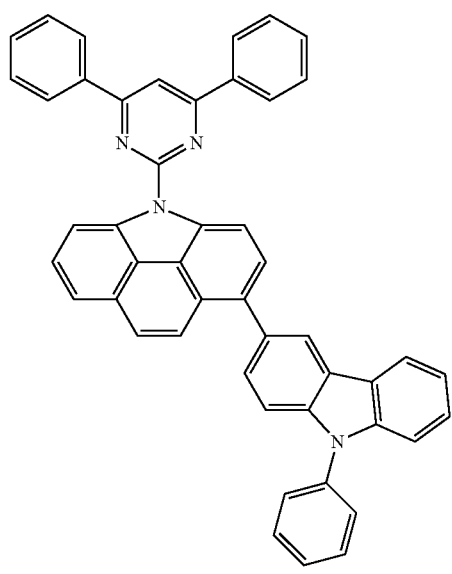
38
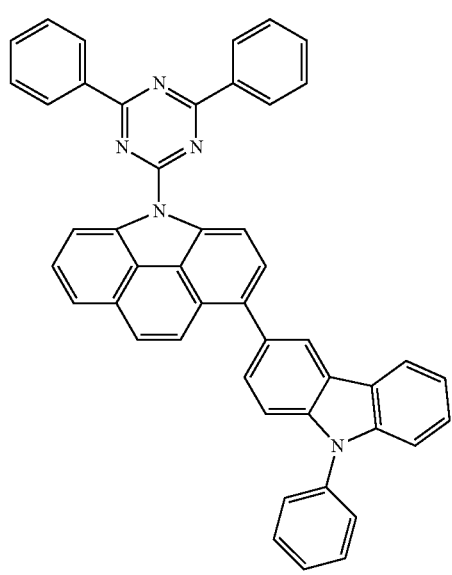
39
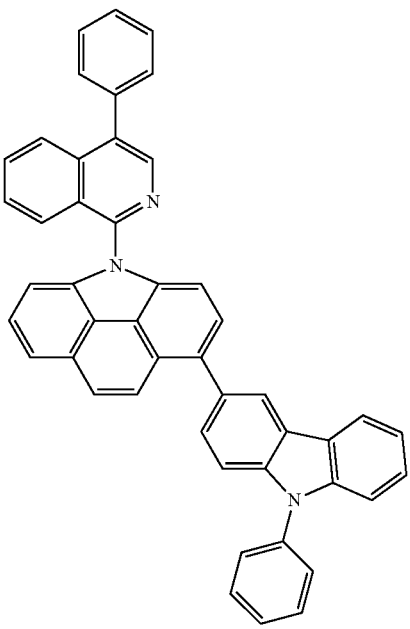
40
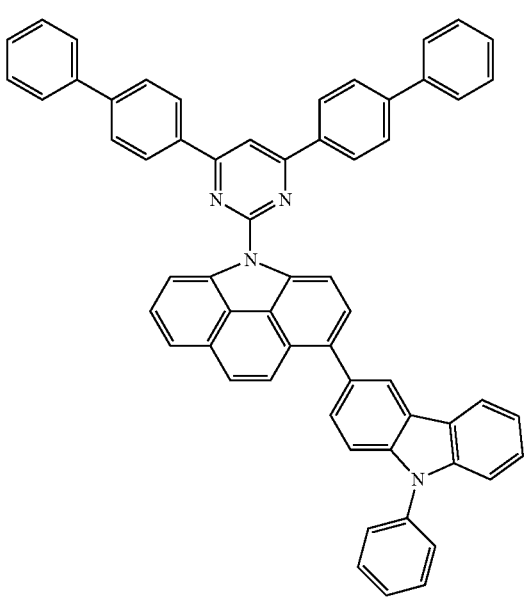

41
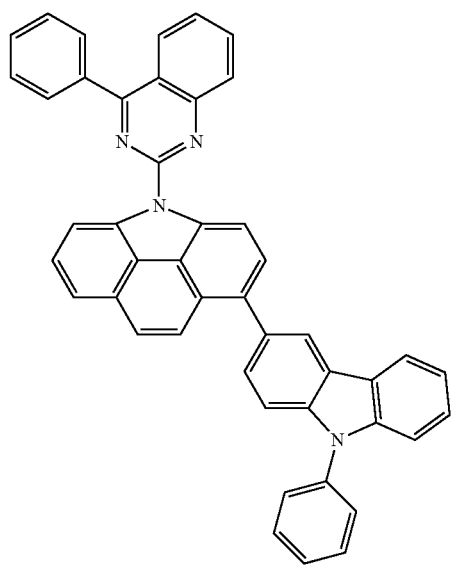
43
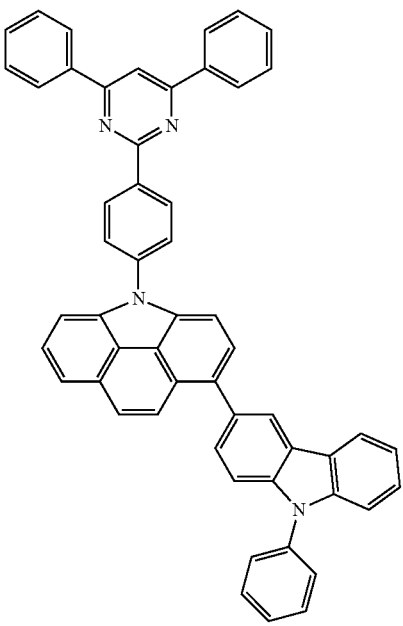
42
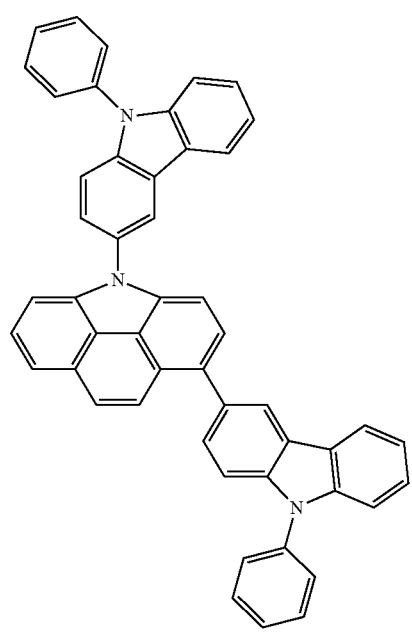
44
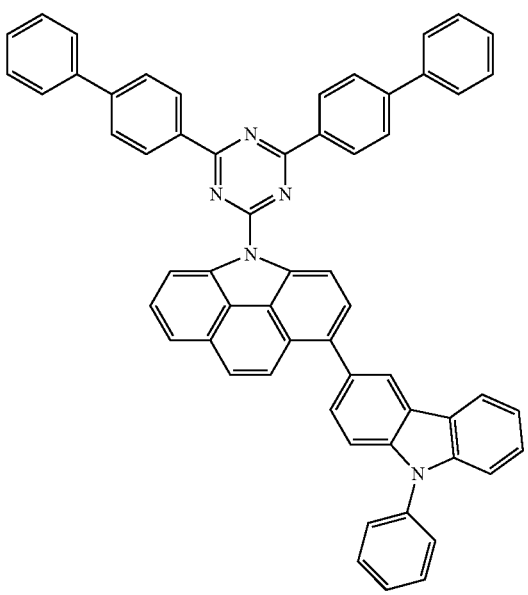

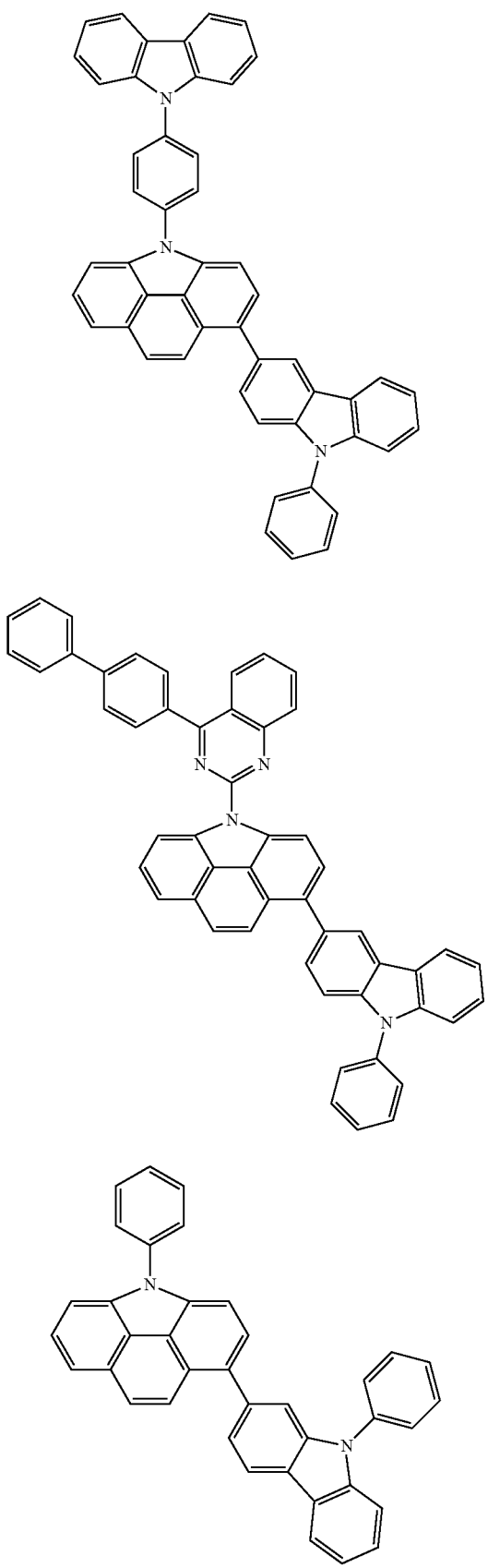
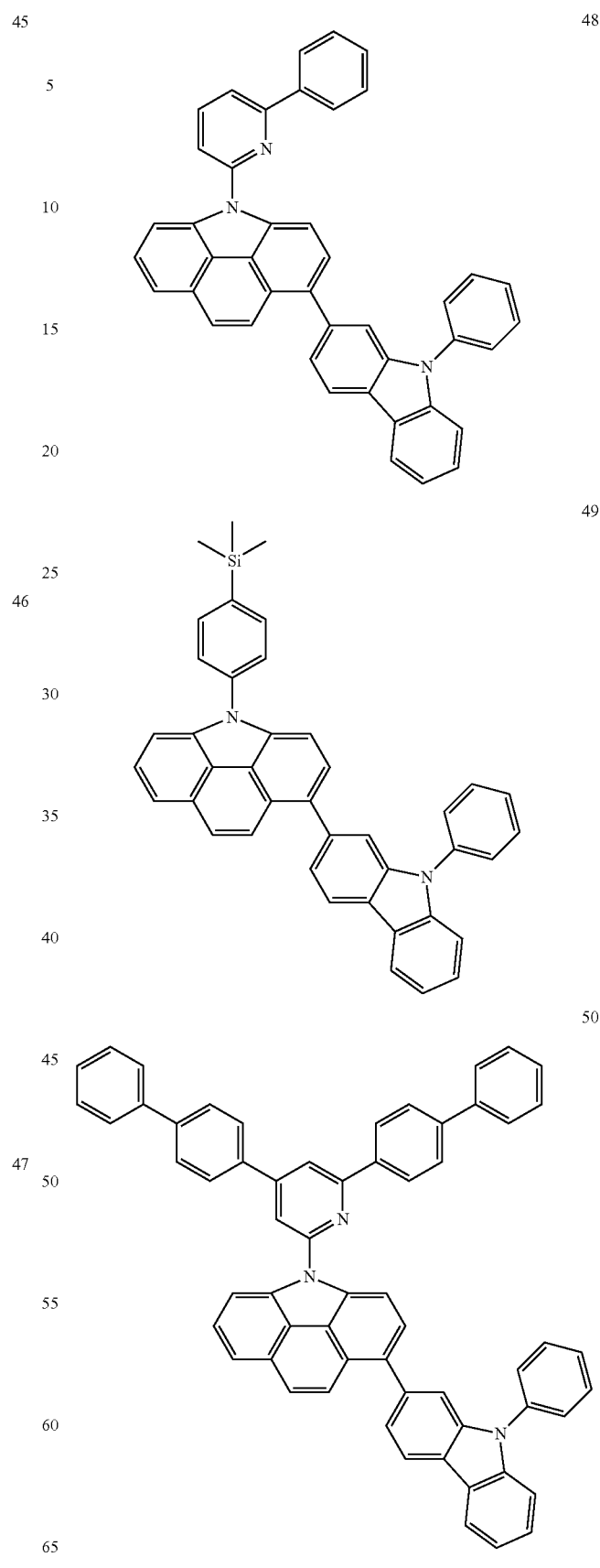

51
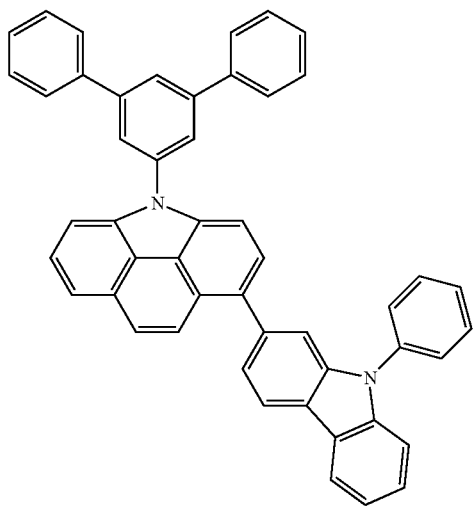
52
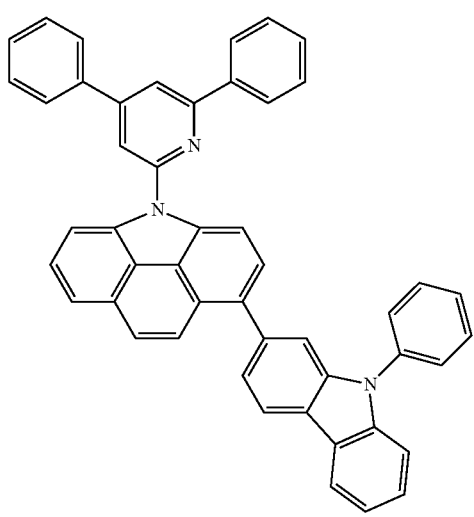
53
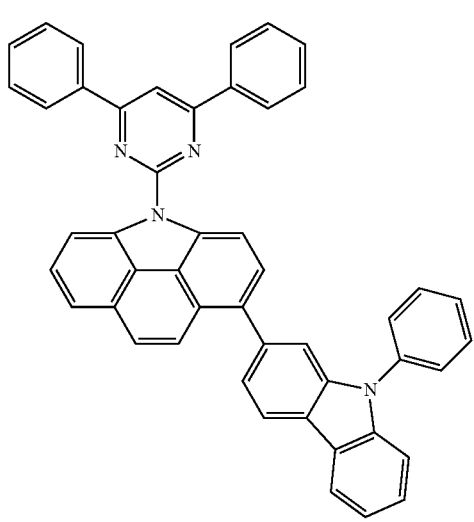
54
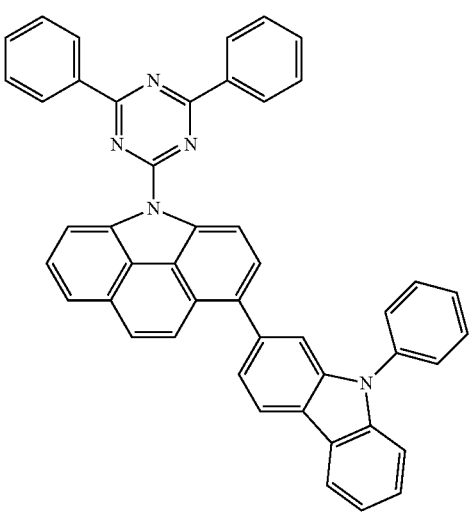
55
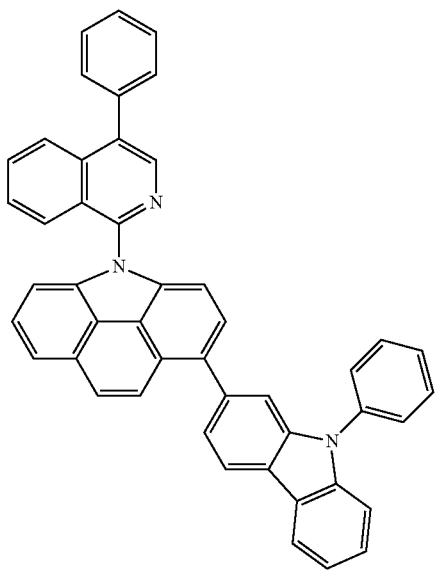
56
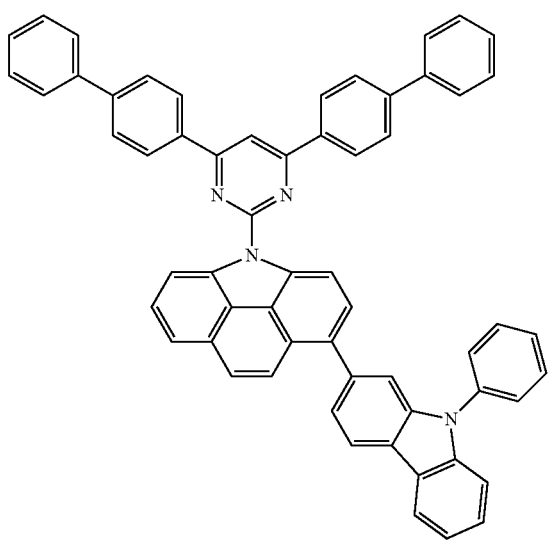

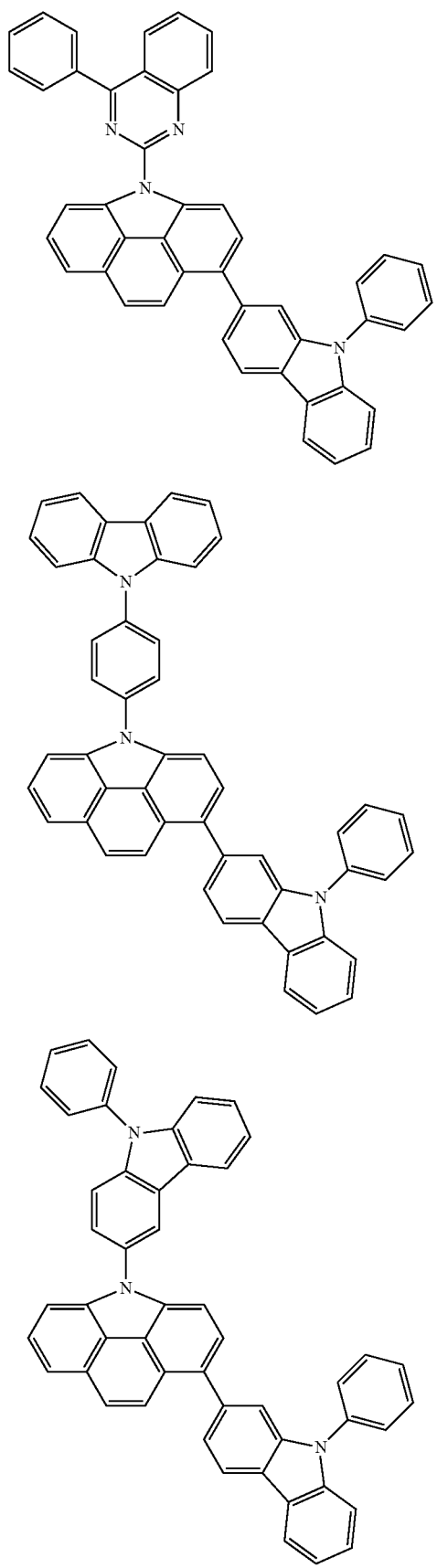
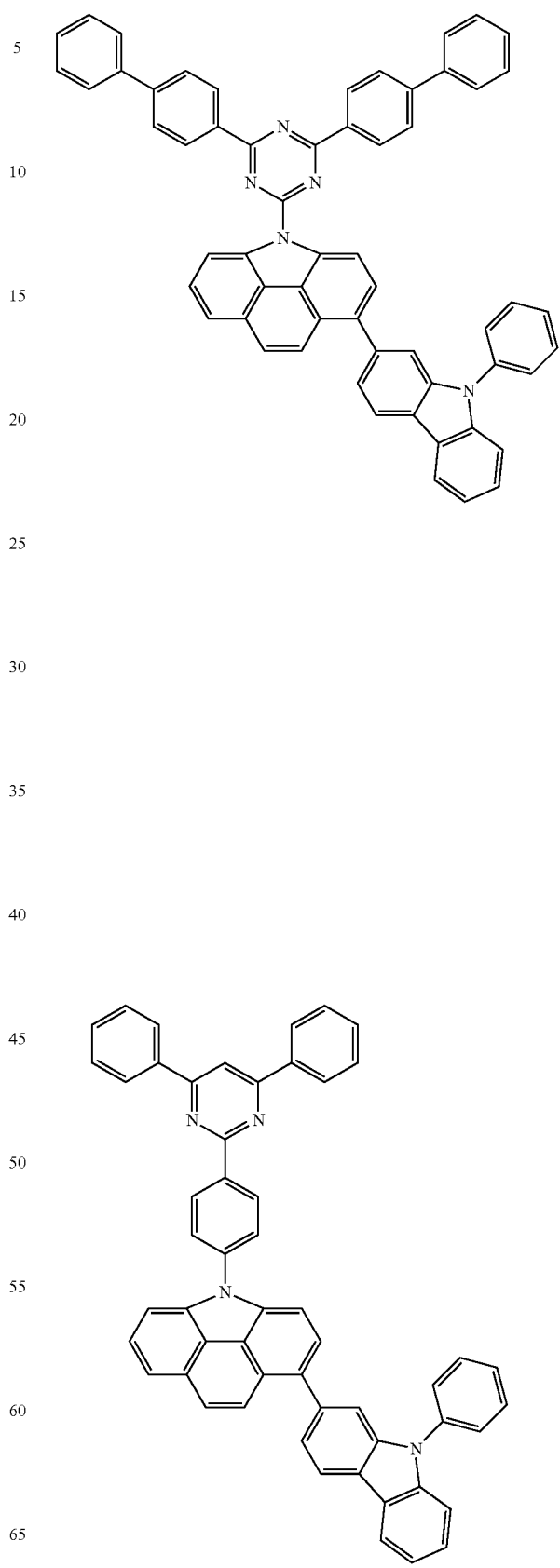

-continued
62
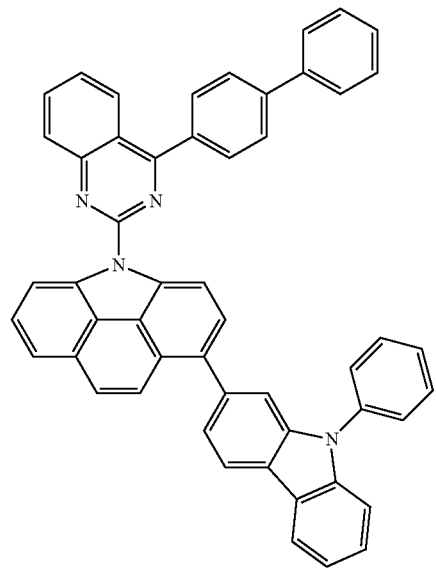
63
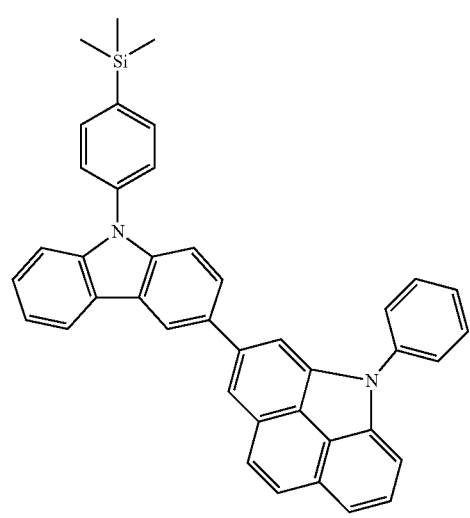
64
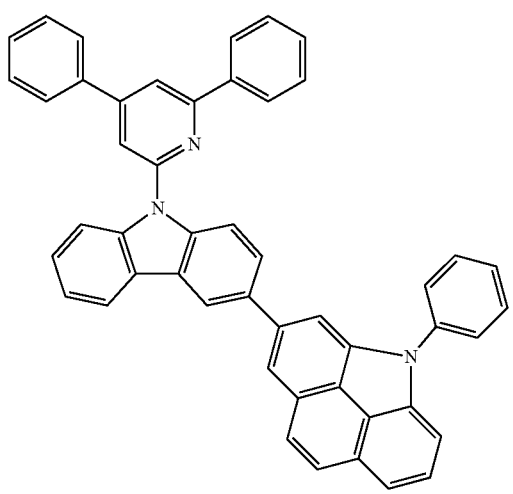
-continued
65
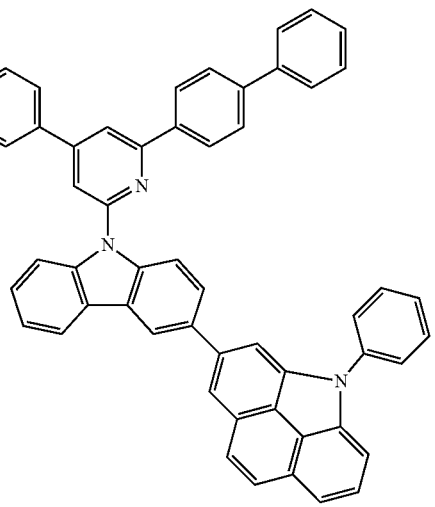
66
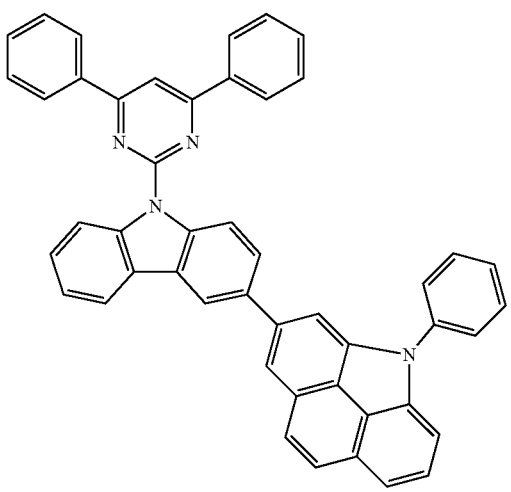
67
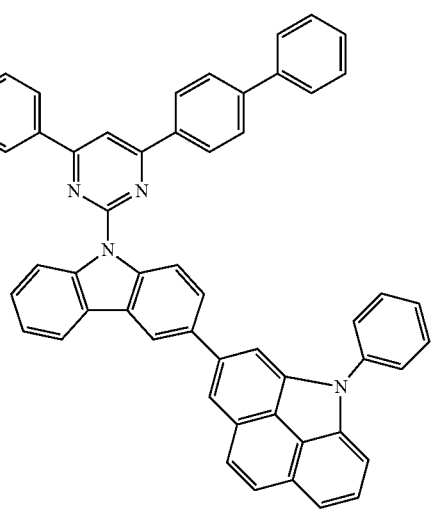

68
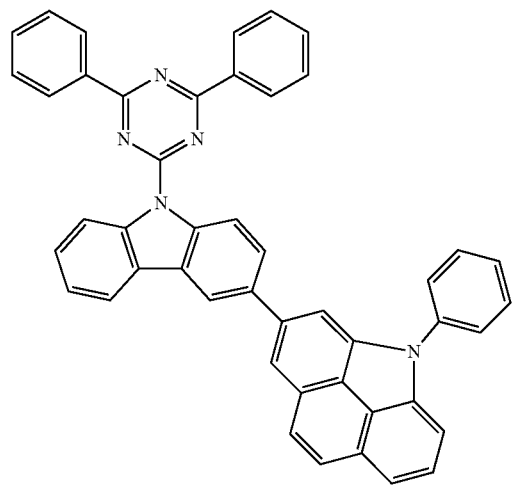
71
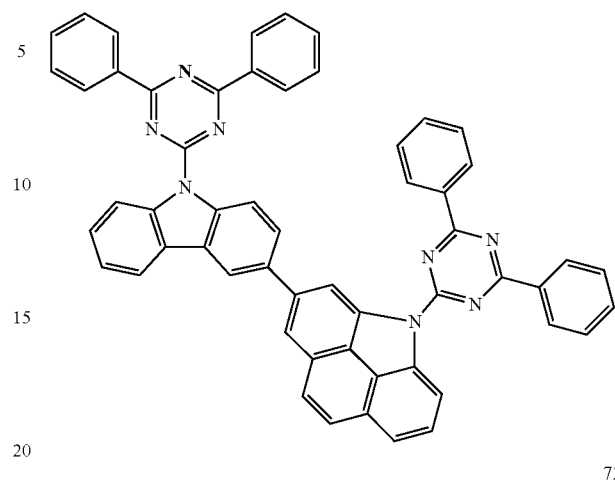
69
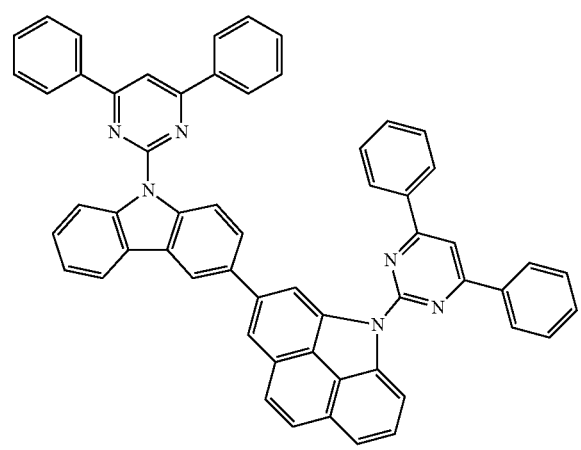
72
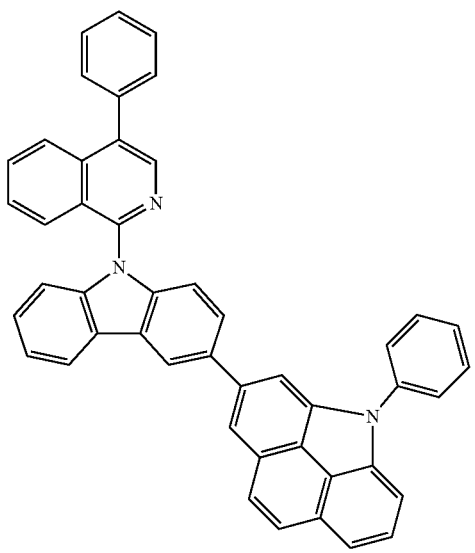
70
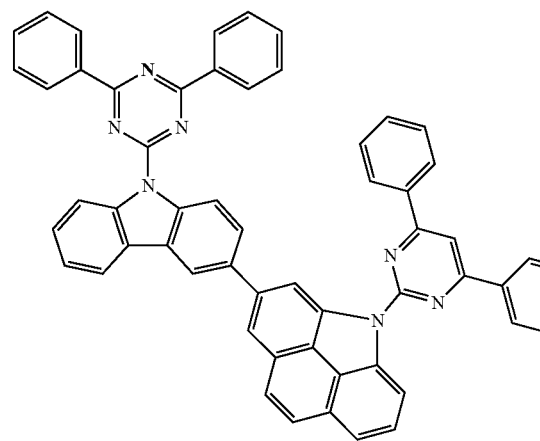
73
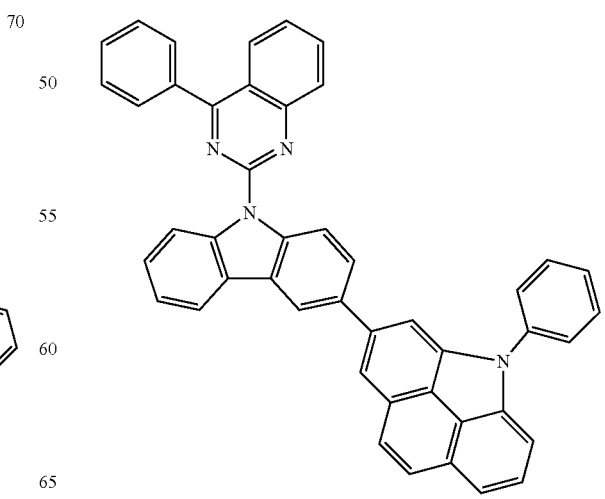

74
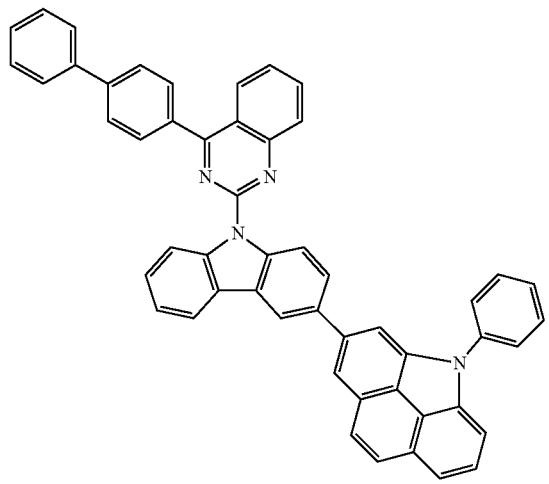
75
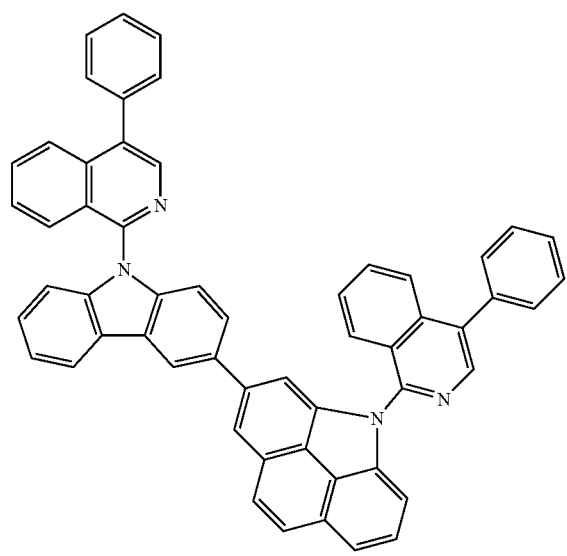
76
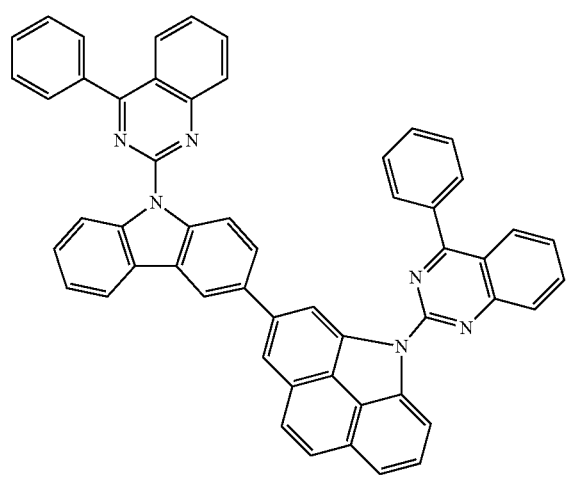
77
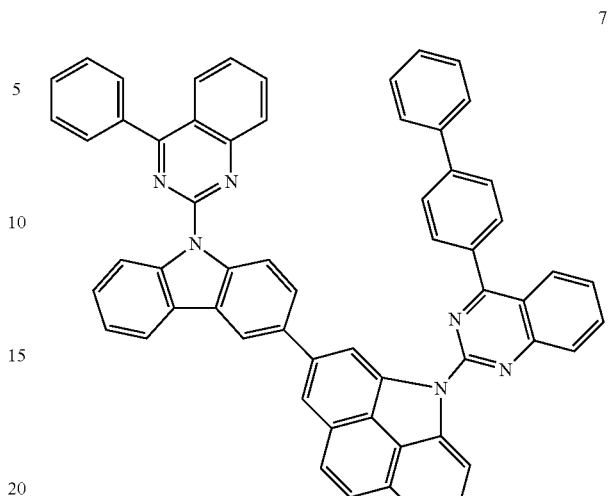
78
79
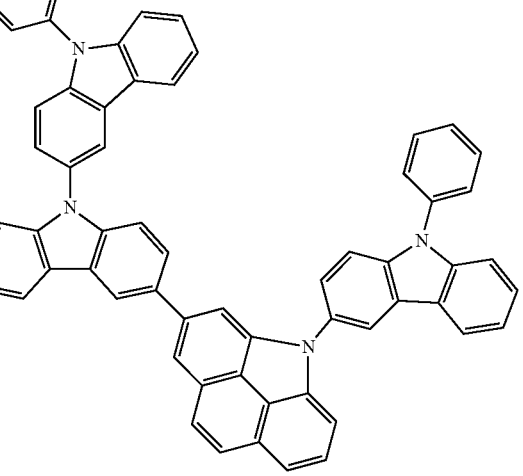

-continued
80
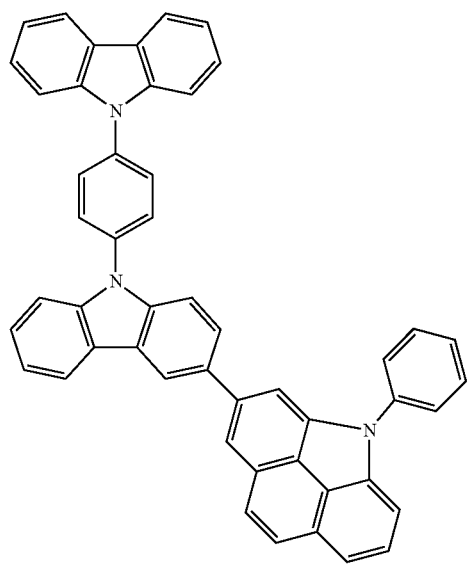
81
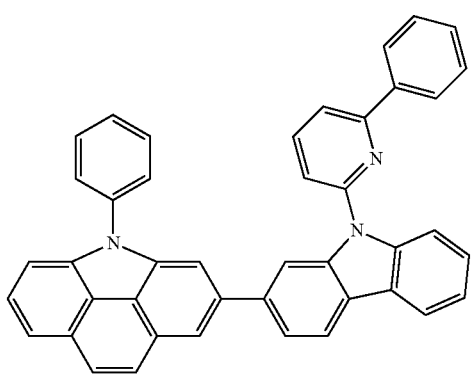
82
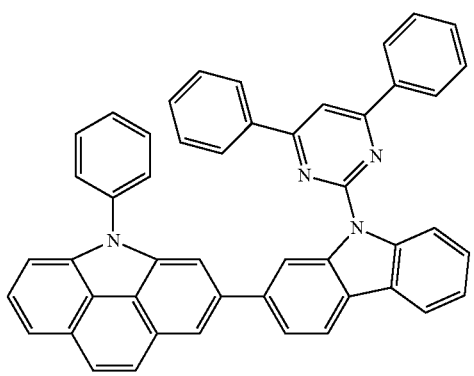
-continued
83
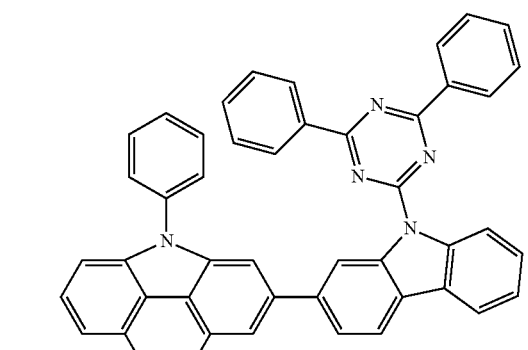
84
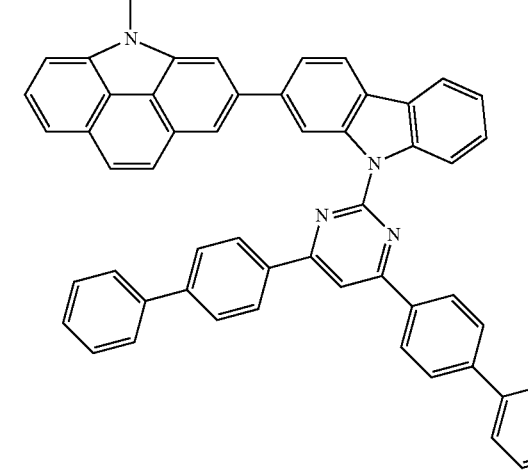
85
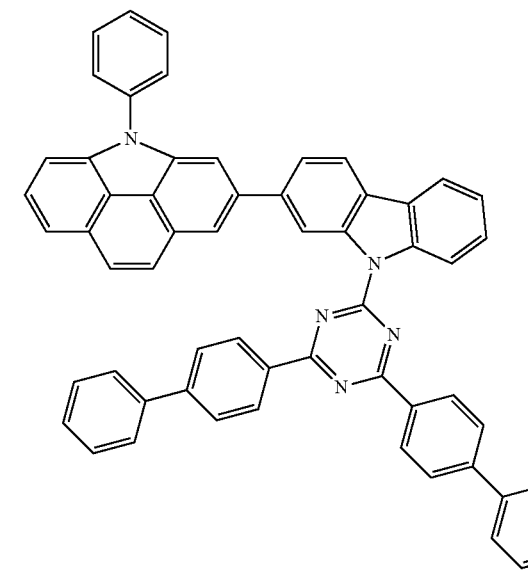

86
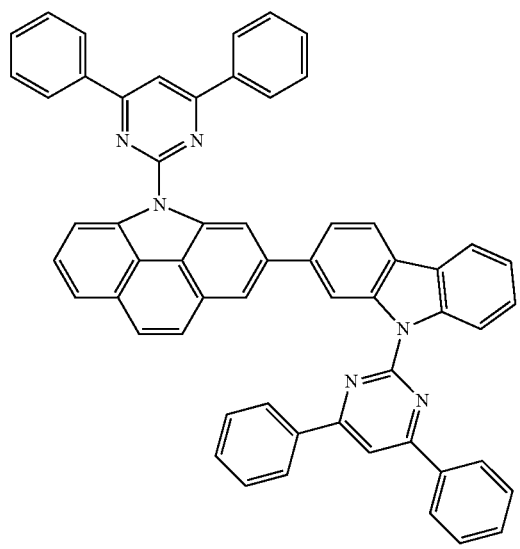
87
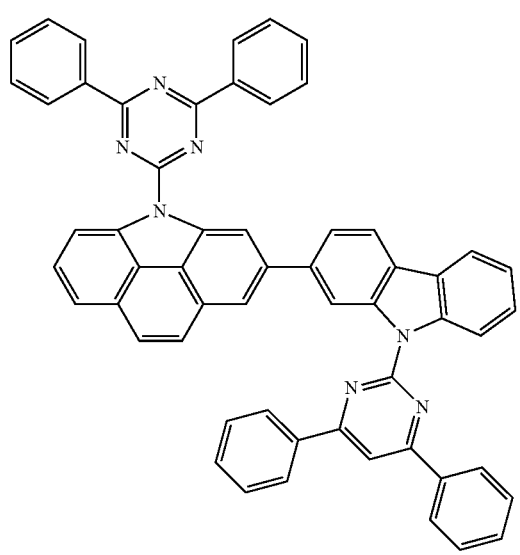
88
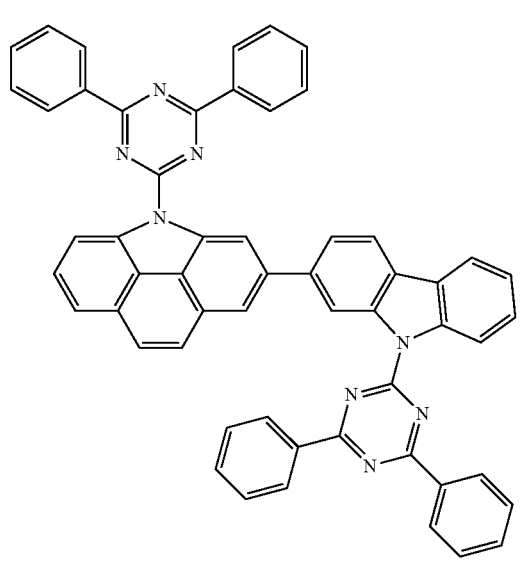
89
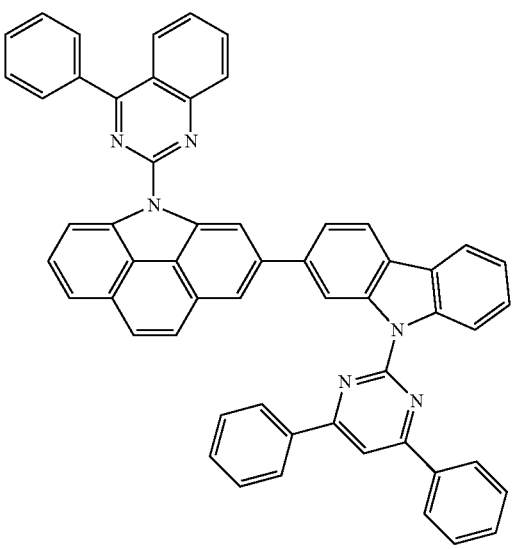
90
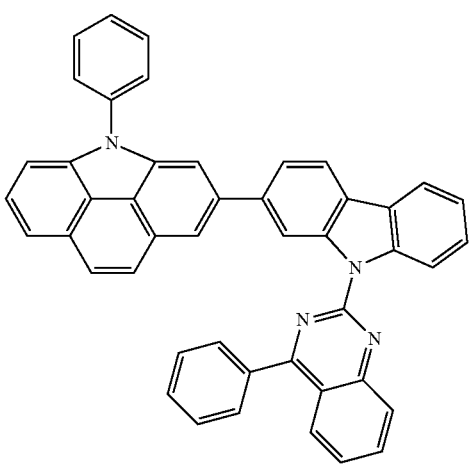
91
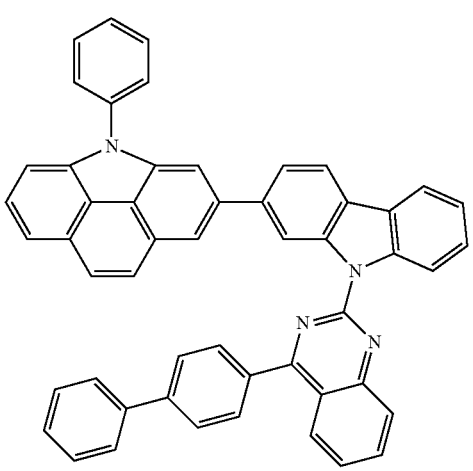

92
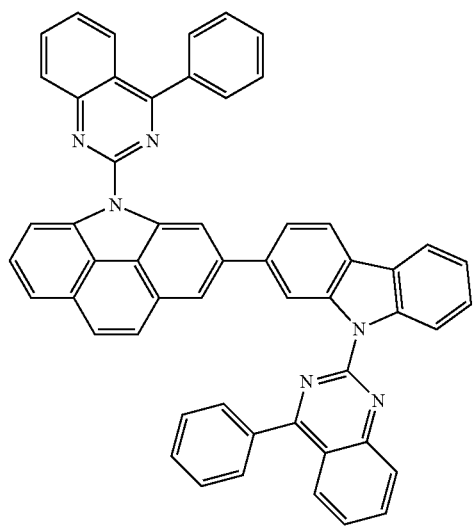
93
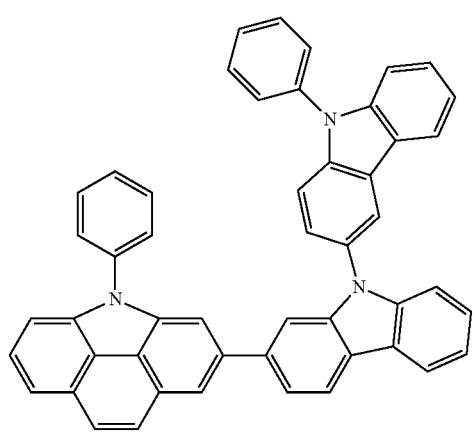
94
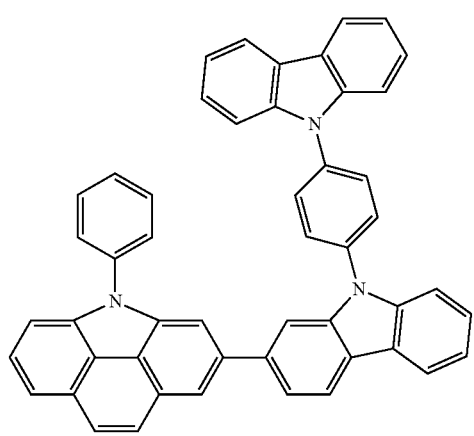
95
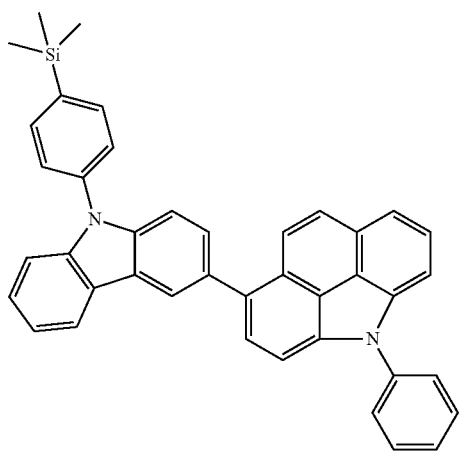
96
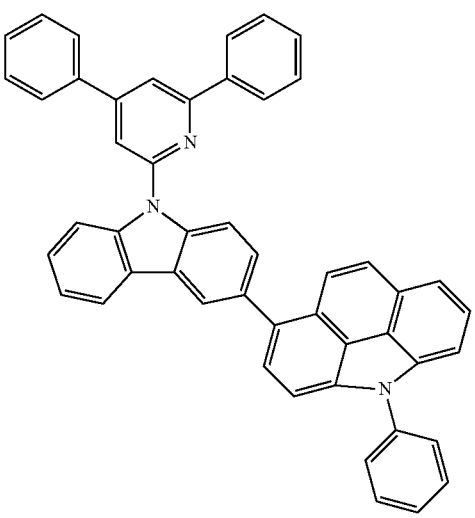
97
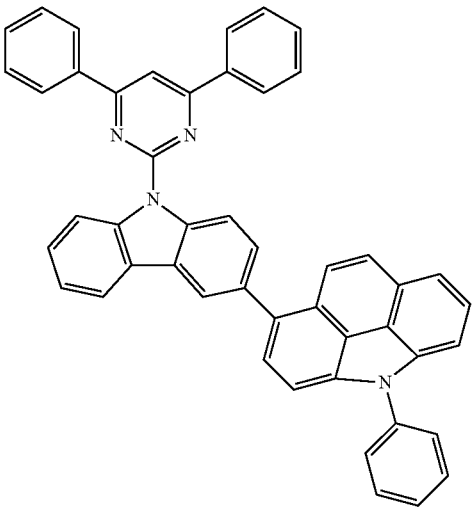

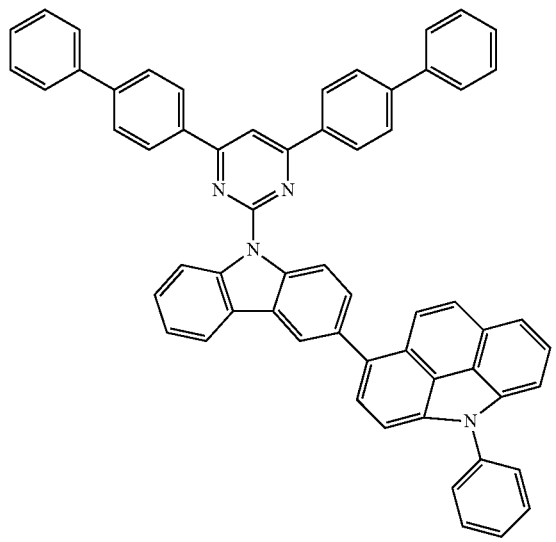
98
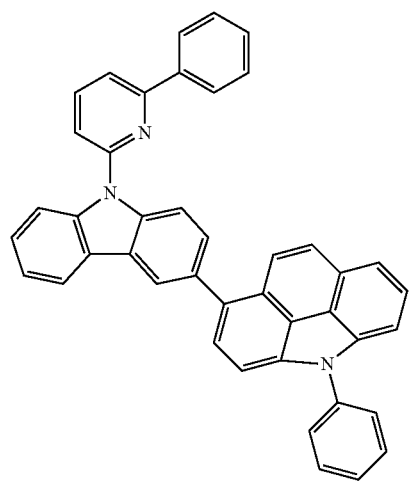
99
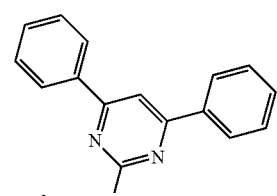
100
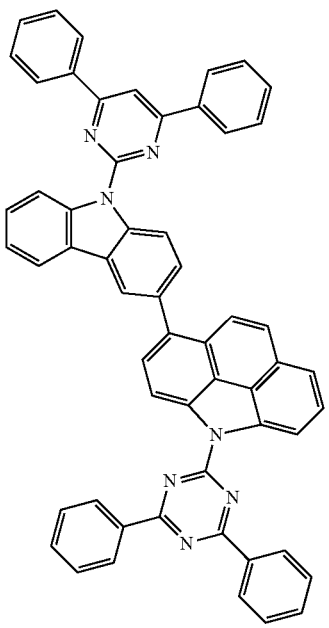
101
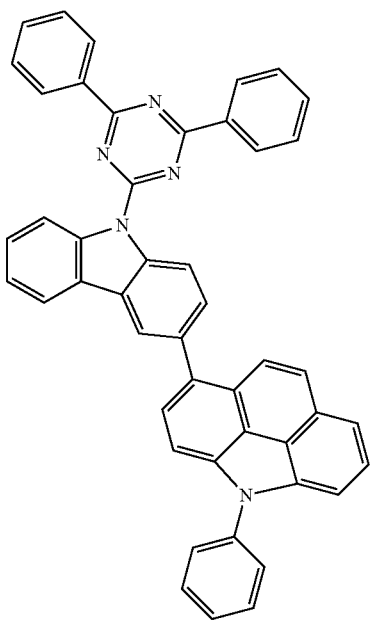
102

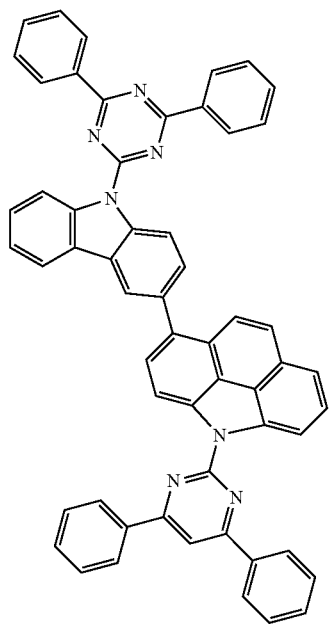
103
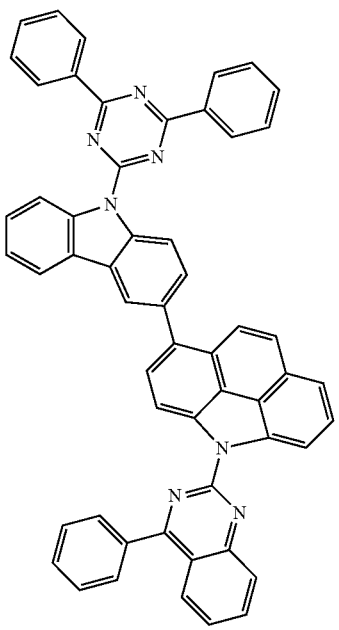
105
104
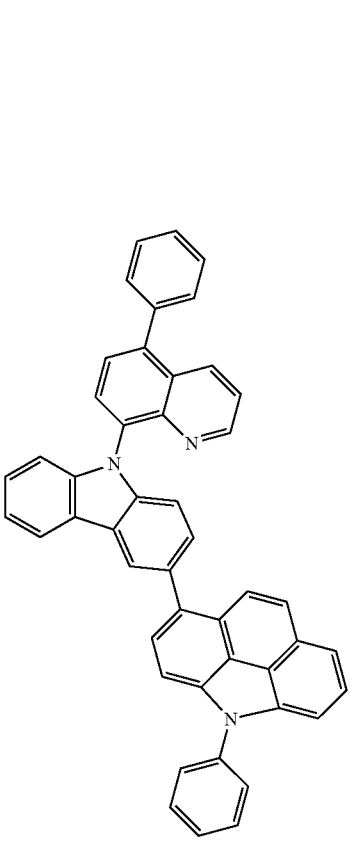
106

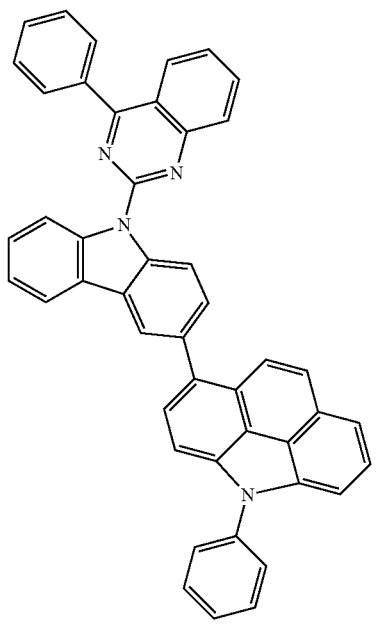
107
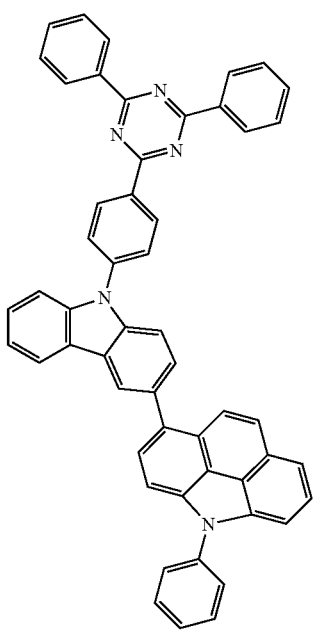
109
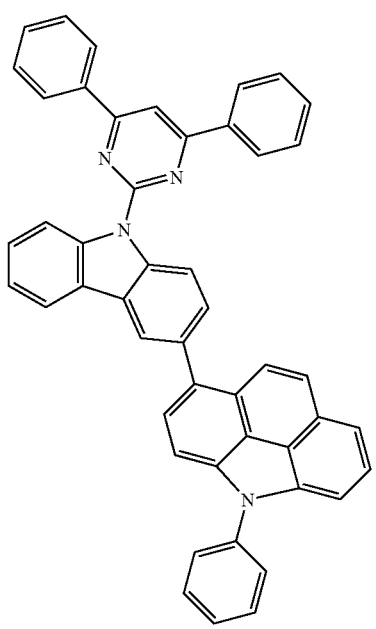
108
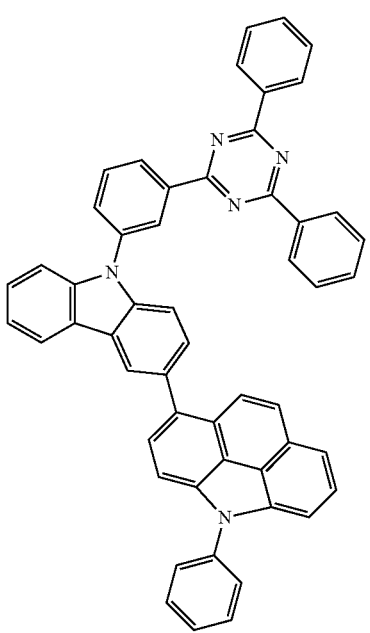
110

111
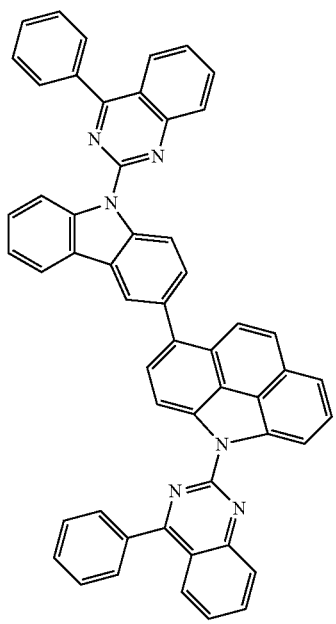
113
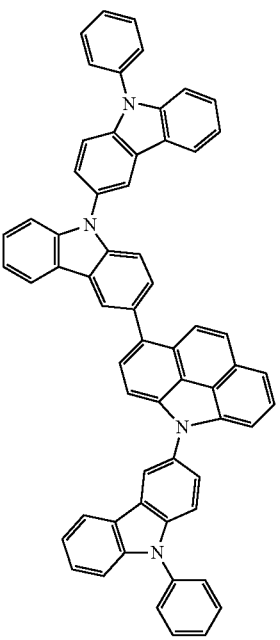
112
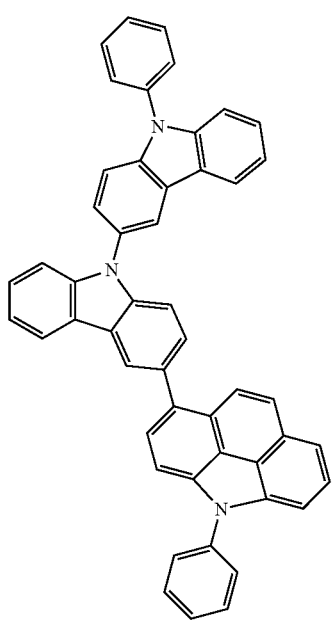
114
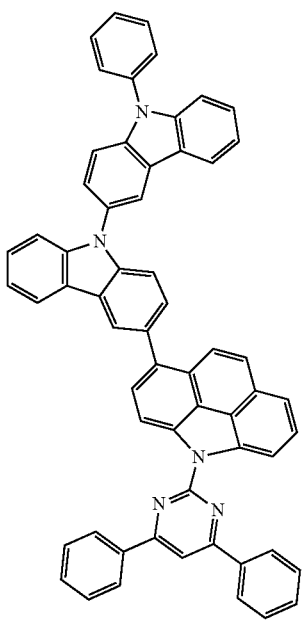

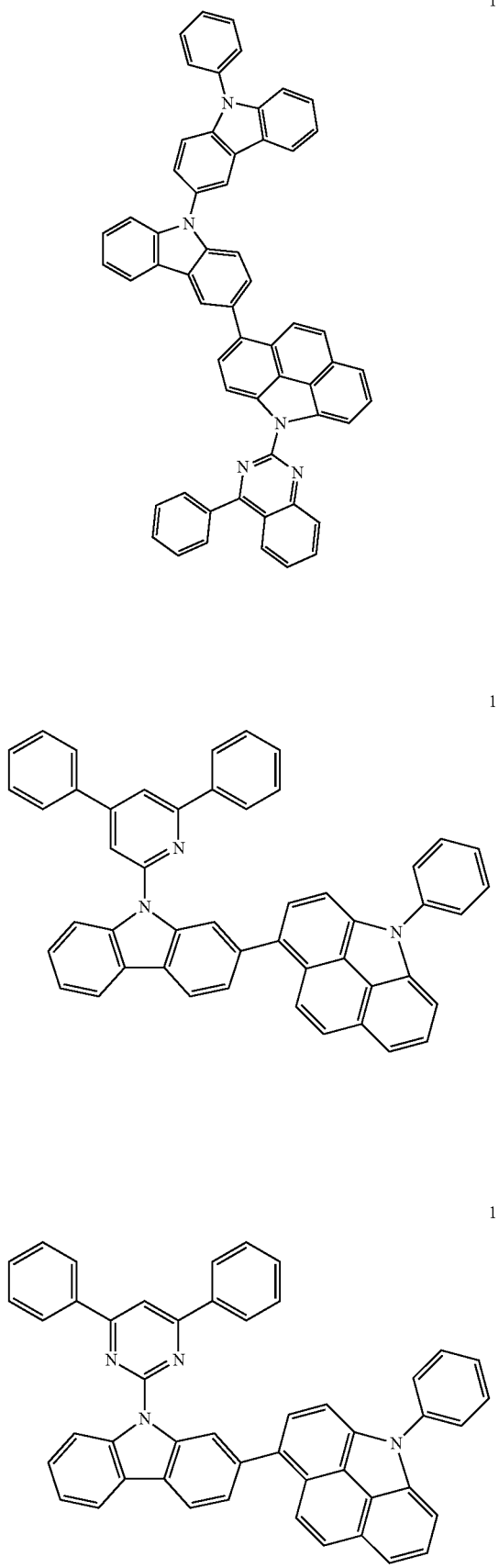
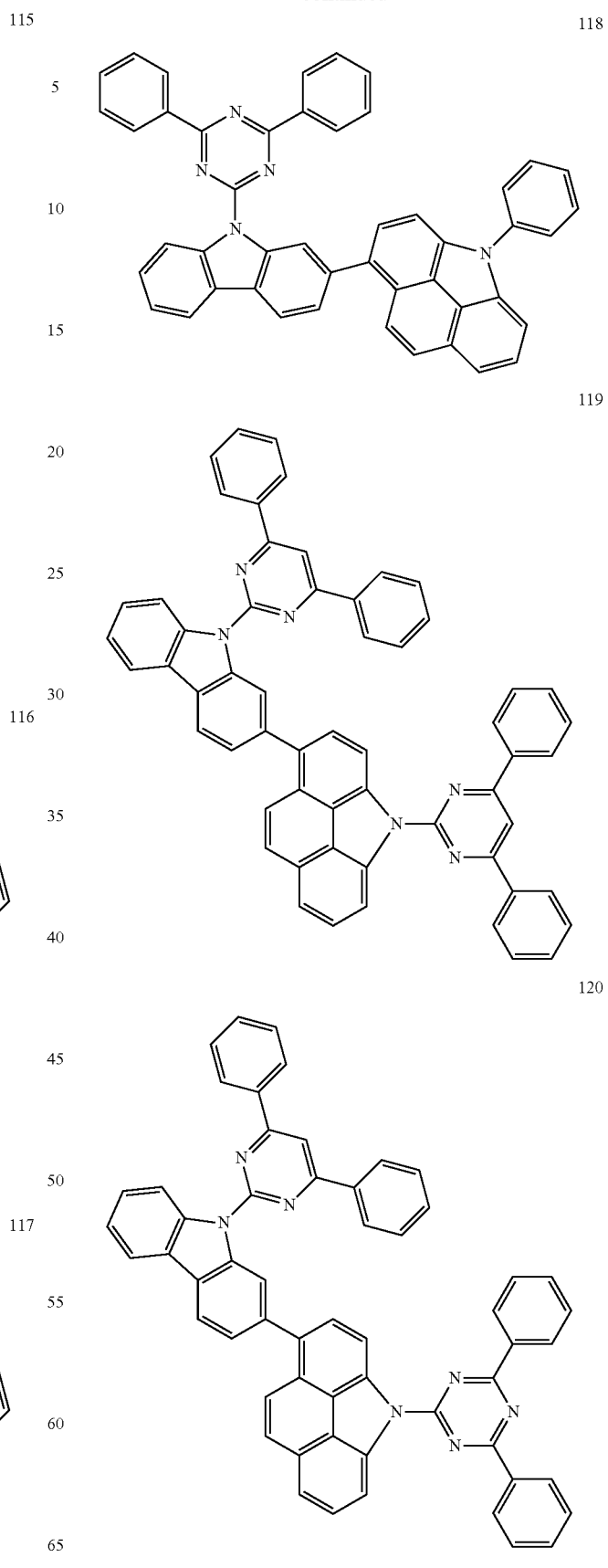

121
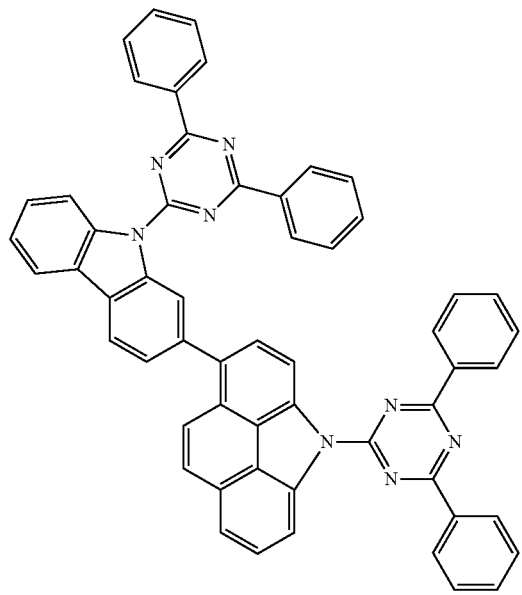
122
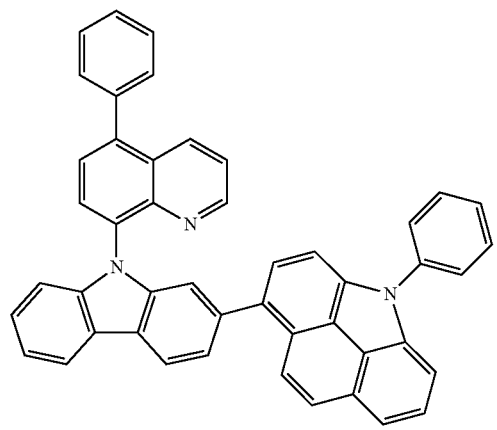
123
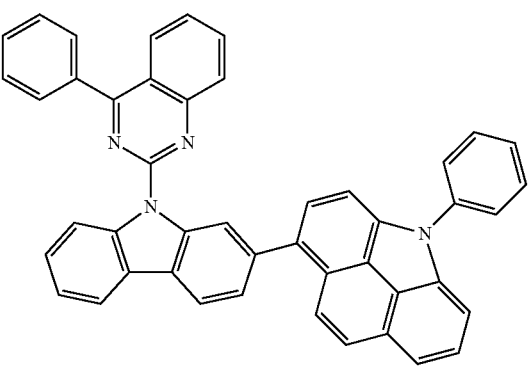
124
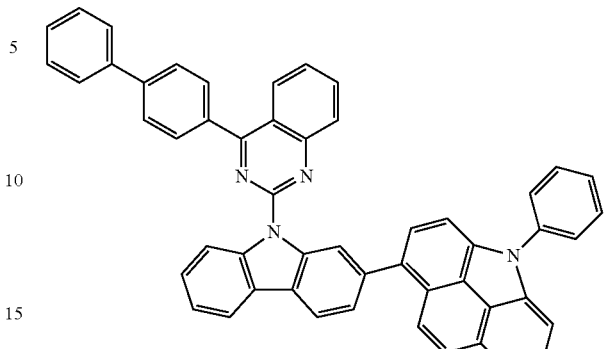
125
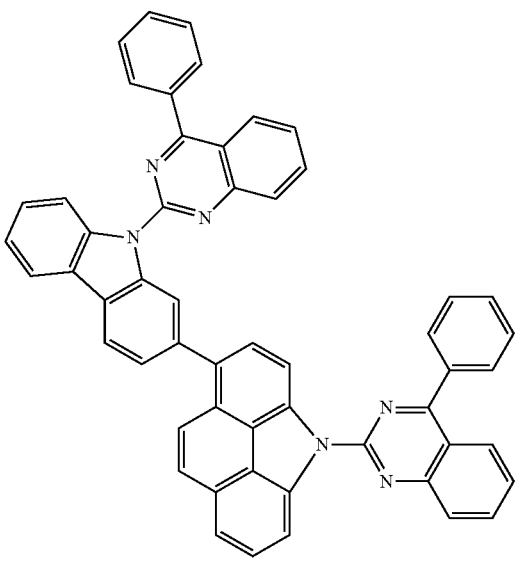
126
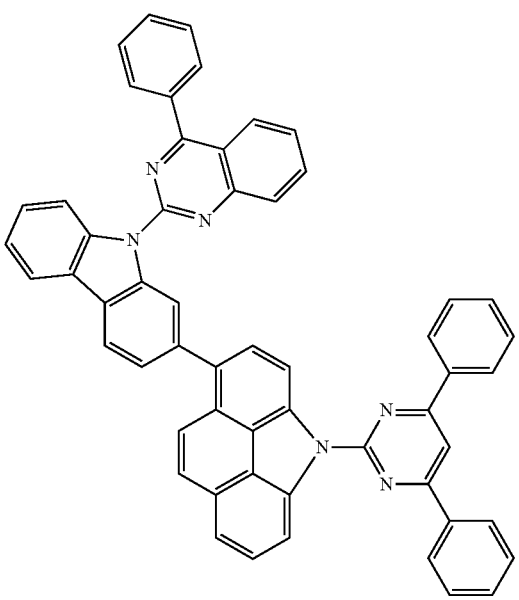

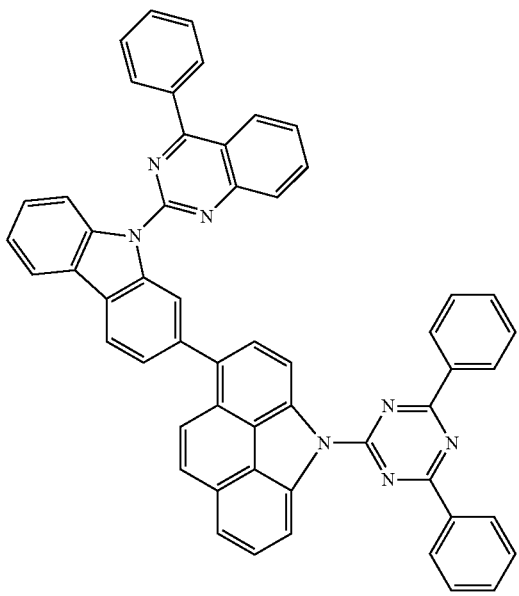

127

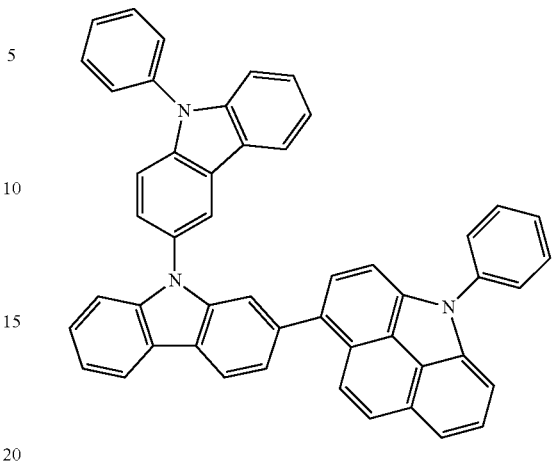

130

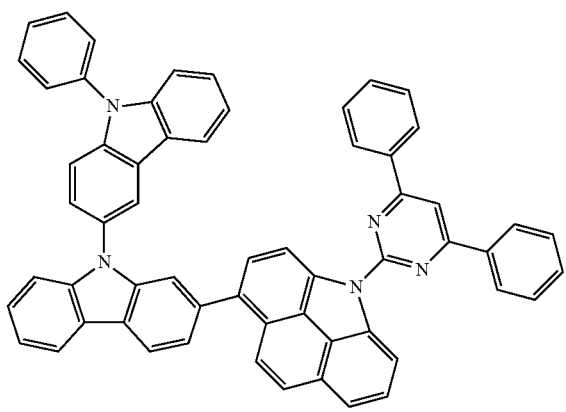

128

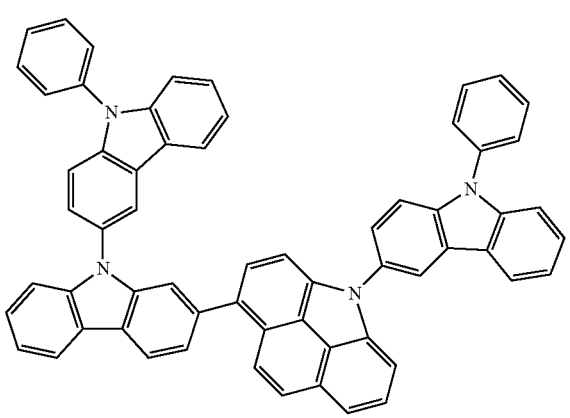

129

An organic light-emitting device according to an embodiment includes a first electrode, a second electrode, and an organic layer interposed between the first electrode and the second electrode, wherein the organic layer includes the heterocyclic compound represented by Formula 1 above.

The organic layer may include at least one layer selected from a hole injection layer, a hole transport layer, a functional layer having a hole injection function and a hole transport function (hereinafter referred to as "H-functional layer"), a buffer layer, an electron blocking layer, an emission layer, a hole blocking layer, an electron transport layer, an electron injection layer, and a functional layer having an electron transport function and an electron injection function (hereinafter referred to as "E-functional layer").

In detail, the organic layer may be an emission layer or an electron transport layer.

According to an embodiment, the organic layer may further include an electron injection layer, an electron transport layer, an emission layer, a hole injection layer, a hole transport layer, or a functional layer having a hole injection capability and a hole transportation capability, and the emission layer may further include an anthracene-based compound, an arylamine-based compound, or a styryl-based compound.

According to another embodiment, the organic layer may include an electron injection layer, an electron transport layer, an emission layer, a hole injection layer, a hole transport layer, or a functional layer having a hole injection capability and a hole transportation capability, and the emission layer may include a red layer, a green layer, a blue layer, or a white layer, and any one of these layers may include a phosphorescent compound, and the hole injection layer, the hole transport layer, or the functional layer having a hole injection capability and a hole transportation capability may include a charge-generation material. Also, the charge-generation material may be a p-dopant, and the p-dopant may be a quinone derivative, a metal oxide, or a cyano group-containing compound.

According to another embodiment, the organic layer may include an electron transport layer that includes an electron-transportable organic compound and a metal complex. The metal complex may be a Li complex.

The term "organic layer" used herein refers to a single layer and/or a plurality of layers interposed between the first electrode and the second electrode of an organic light-emitting device.

The organic layer includes an emission layer, and the emission layer may include the compound represented by Formula 1. The organic layer may include at least one layer selected from a hole injection layer, a hole transport layer, a H-functional layer, and the at least one layer selected from a hole injection layer, a hole transport layer, a H-functional layer may include the compound.

FIG. 1 illustrates a schematic cross-sectional view of an organic light-emitting device according to an embodiment; hereinafter, with reference to FIG. 1, the structure of an organic light-emitting device according to an embodiment, and a method of manufacturing the organic light-emitting device, according to an embodiment, will be described in detail.

A substrate (not shown) may be any one of various substrates that are used in an organic light-emitting device, and may be a glass substrate or a transparent plastic substrate with excellent mechanical strength, thermal stability, transparency, surface smoothness, ease of handling, and water repellency.

A first electrode may be formed by depositing or sputtering a material for a first electrode on the substrate. When the first electrode is an anode, the material for the first electrode may be selected from materials with a high work function to make holes be easily injected. The first electrode may be a reflective electrode or a transmission electrode. The material for the first electrode may be a transparent material with high conductivity, and examples of such a material are indium tin oxide (ITO), indium zinc oxide (IZO), tin oxide ($SnO_2$), and zinc oxide (ZnO). According to an embodiment, to form the first electrode as a reflective electrode, magnesium (Mg), aluminum (Al), aluminum-lithium (Al—Li), calcium (Ca), magnesium-indium (Mg—In), or magnesium-silver (Mg—Ag) may be used.

The first electrode may have a single-layer structure or a multi-layer structure including at least two layers. For example, the first electrode may have a three-layered structure of ITO/Ag/ITO.

An organic layer may be formed on the first electrode.

The organic layer may include a hole injection layer, a hole transport layer, a buffer layer, an emission layer, an electron transport layer, and an electron injection layer.

A hole injection layer (HIL) may be formed on the first electrode by using any one of various methods, for example, by vacuum deposition, spin coating, casting, or Langmuir-Blodgett (LB) deposition.

When a HIL is formed by vacuum deposition, the deposition conditions may vary according to a material that is used to form the HIL, and the structure and thermal characteristics of the HIL. For example, the deposition conditions may include a deposition temperature of about 100° C. to about 500° C., a vacuum pressure of about $10_{-8}$ to about $10^{-3}$ torr, and a deposition rate of about 0.01 to about 100 Å/sec.

When the HIL is formed using spin coating, coating conditions may vary according to the material used to form the HIL, and the structure and thermal properties of the HIL. For example, a coating speed may be from about 2000 rpm to about 5000 rpm, and a temperature at which a heat treatment is performed to remove a solvent after coating may be from about 80° C. to about 200° C.

Exemplary hole injection materials include, for example, N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), TDATA, 2-TNATA, a polyaniline/dodecylbenzenesulfonic acid (pani/DBSA), poly(3,4-ethylenedioxythiophene)/poly(4-styrenesulfonate) (PEDOT/PSS), polyaniline/camphor sulfonicacid (pani/CSA), or (polyaniline)/poly(4-styrenesulfonate) (PANI/PSS).

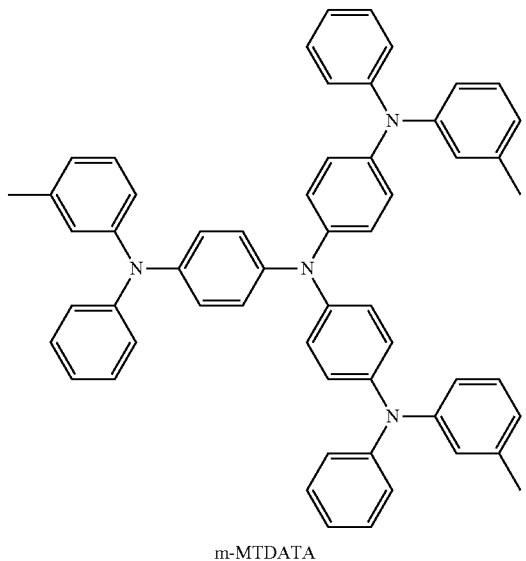

m-MTDATA

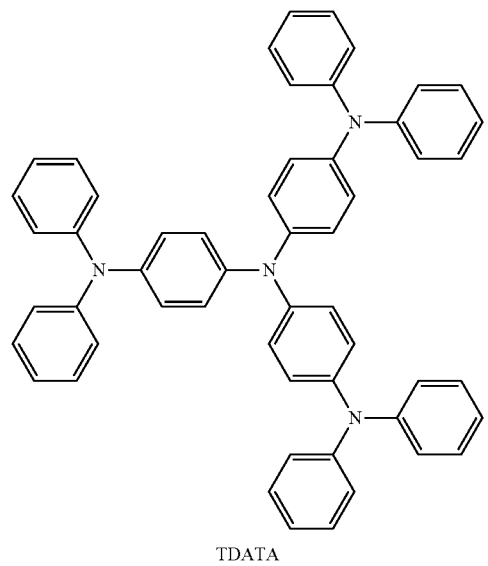

TDATA

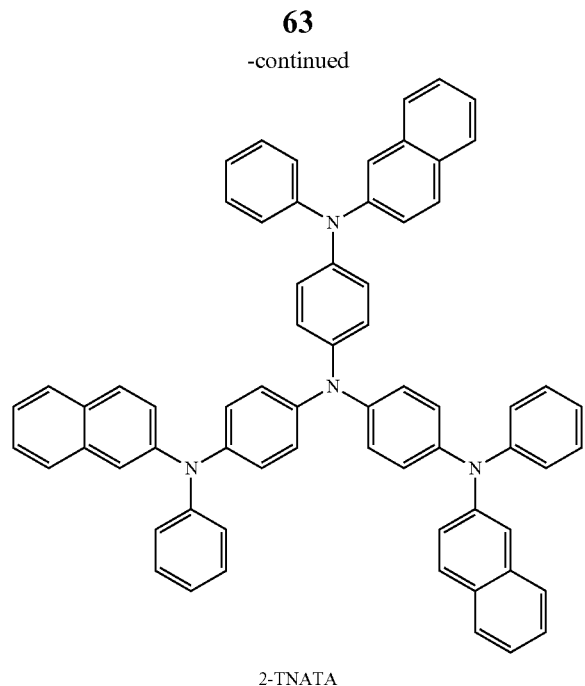

2-TNATA

A thickness of the HIL may be in a range of about 100 Å to about 10,000 Å, for example, about 100 Å to about 1000 Å. Maintaining the thickness of the HIL within the range described above may help provide the HIL with satisfactory hole injection characteristics without a substantial increase in a driving voltage.

Then, a hole transport layer (HTL) may be formed on the HIL by using various methods, for example, by vacuum deposition, spin coating, casting, or Langmuir-Blodgett (LB) deposition. When the HTL is formed by vacuum deposition or spin coating, the deposition or coating conditions may be similar to those applied to form the HIL, although the deposition or coating conditions may vary according to the material that is used to form the HTL.

Exemplary hole transportation materials include, for example, a carbazole derivative, such as N-phenylcarbazole, or polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), or N,N'-di(1-naphthyl)-N,N'-diphenylbenzidine (NPB).

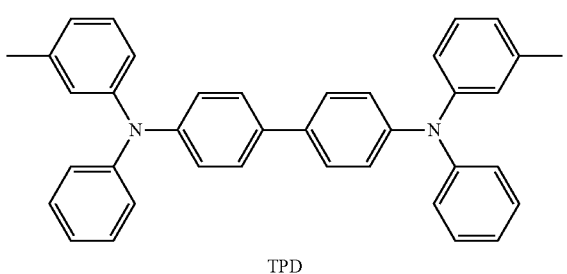

TPD

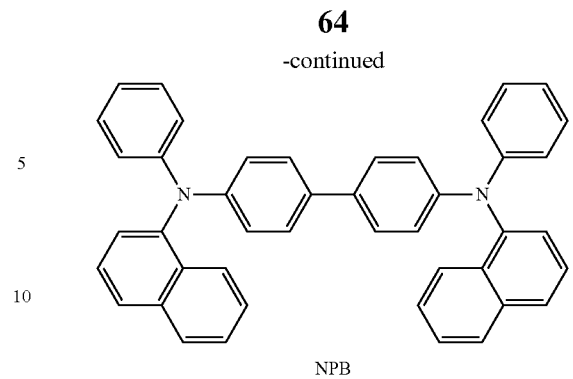

NPB

A thickness of the HTL may be in a range of about 50 Å to about 2,000 Å, for example, about 100 Å to about 1,500 Å. Maintaining the thickness of the HTL within the ranges described above may help provide the HTL with satisfactory hole transportation properties without a substantial increase in a driving voltage.

An H-functional layer (a functional layer having a hole injection ability and a hole transport ability) may include one or more materials selected from the materials for the HIL and the materials for the HTL. A thickness of the H-functional layer may be in a range of about 500 Å to about 10,000 Å, for example, about 100 Å to about 1,000 Å. Maintaining the thickness of the H-functional layer within the range described above may help provide satisfactory hole injection and transportation properties without a substantial increase in driving voltage.

Also, at least one layer selected from the hole injection layer, the hole transport layer, and the H-functional layer may include at least one selected from a compound represented by Formula 300 below and a compound represented by Formula 350 below:

<Formula 300>

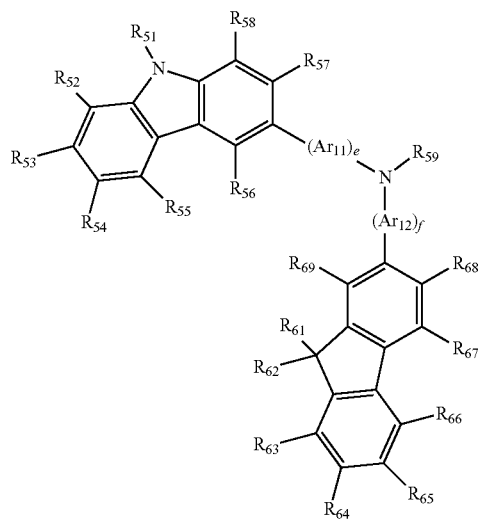

-continued

<Formula 350>

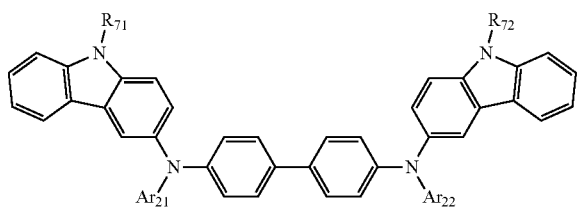

wherein:

Ar$_{11}$ and Ar$_{12}$ in Formula 300 and Ar$_{21}$ and Ar$_{22}$ in Formula 350 are each independently a substituted or unsubstituted C$_5$-C$_{60}$ arylene group;

e and f in Formula 300 are each independently an integer of 0 to 5, or 0, 1 or 2 (for example, e may be 1 and f may be 0);

R$_{59}$ in Formula 300 is selected from a phenyl group; a naphthyl group; an anthryl group; a biphenyl group; a pyridyl group; or a phenyl group, a naphthyl group, an anthryl group, a biphenyl group, or a pyridyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a substituted or unsubstituted C$_1$-C$_{20}$ alkyl group, and a substituted or unsubstituted C$_1$-C$_{20}$ alkoxy group; and R$_{51}$ to R$_{58}$ and R$_{61}$ to R$_{69}$, in Formula 300 and R$_{71}$ and R$_{72}$ in Formula 350 are each independently a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{60}$ cycloalkyl group, a substituted or unsubstituted C$_5$-C$_{60}$ aryl group, a substituted or unsubstituted C$_5$-C$_{60}$ aryoxyl group, or a substituted or unsubstituted C$_5$-C$_{60}$ arylthio group.

For example, R$_{51}$ to R$_{58}$, R$_{61}$ to R$_{69}$, R$_{71}$ and R$_{72}$ may be each independently selected from a hydrogen atom; a deuterium atom; a halogen atom; a hydroxyl group; a cyano group; a nitro group; an amino group; an amidino group; a hydrazine; a hydrazone; a carboxyl group or a salt thereof; a sulfonic acid or a salt thereof; a phosphoric acid or a salt thereof; a C$_1$-C$_{10}$ alkyl group (for example, a methyl group, an ethyl group, a propyl group, a butyl group, a pentyl group, or a hexyl group); a C$_1$-C$_{10}$ alkoxy group (for example, a methoxy group, an ethoxy group, a propoxy group, a butoxy group, or a pentoxy group); a C$_1$-C$_{10}$ alkyl group or a C$_1$-C$_{10}$ alkoxy group, each substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid or a salt thereof and a phosphoric acid or a salt thereof; a phenyl group; a naphthyl group; an anthryl group; a fluorenyl group; a pyrenyl group; or a phenyl group, a naphthyl group, an anthryl group, a fluorenyl group, or a pyrenyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid or a salt thereof, a phosphoric acid or a salt thereof, a C$_1$-C$_{10}$ alkyl group, and a C$_1$-C$_{10}$ alkoxy group.

According to an embodiment, the compound represented by Formula 300 may be represented by Formula 300A:

<Formula 300A>

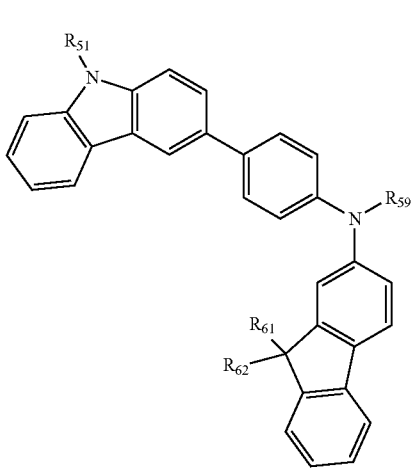

wherein R$_{51}$, R$_{60}$, R$_{61}$, and R$_{59}$ are as described above.

For example, at least one layer of the HIL, the HTL, and the H-functional layer may include at least one of Compounds 301 to 320 below.

301

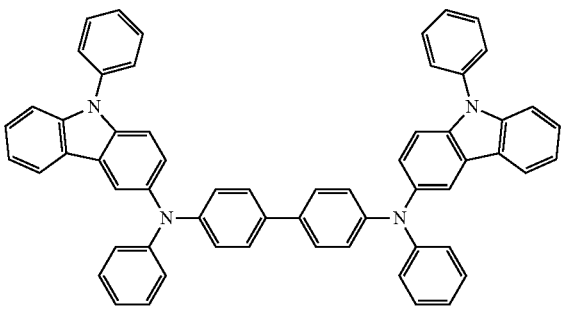

302

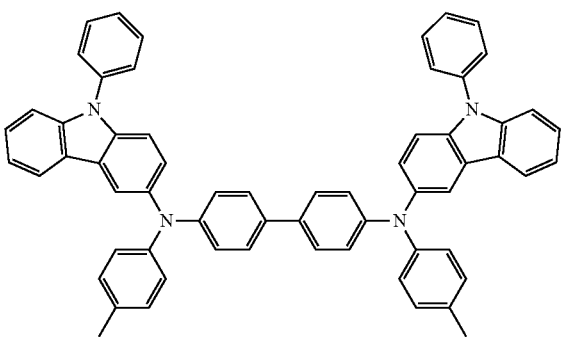

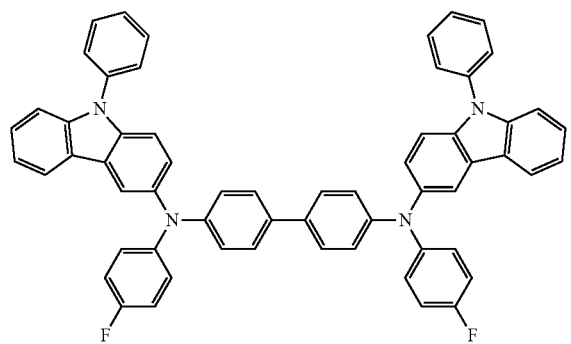
303
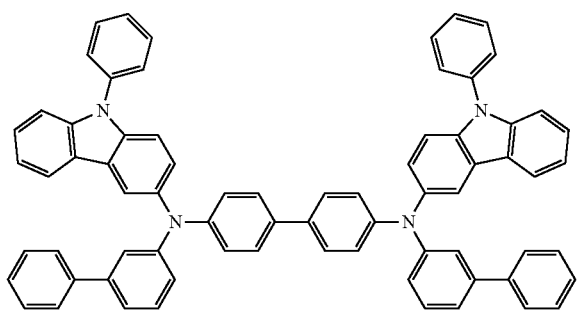
307
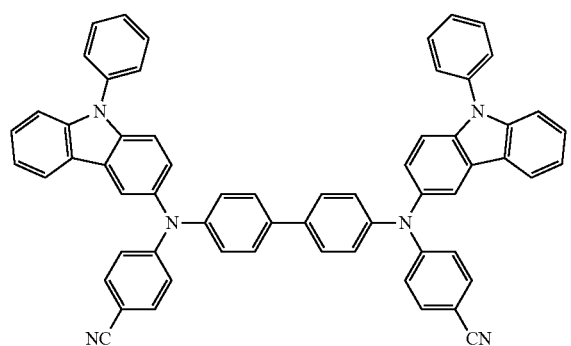
304
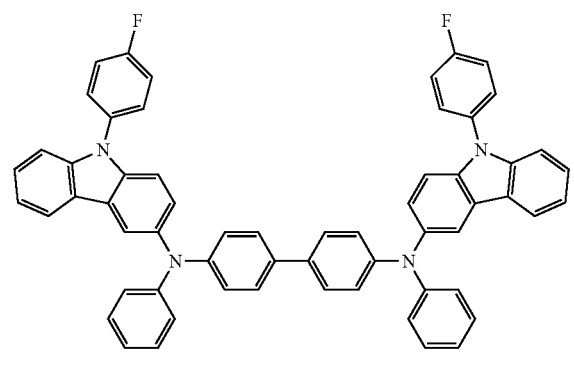
308
305
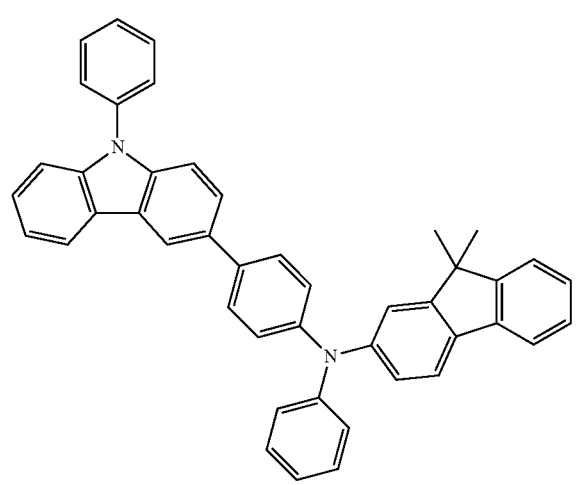
309
306

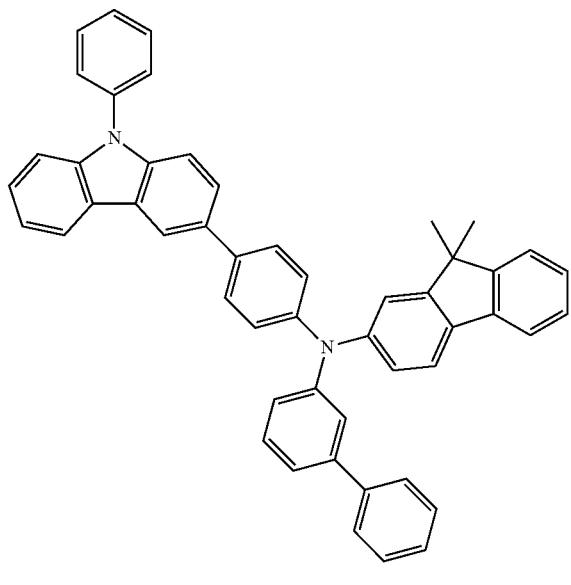
310
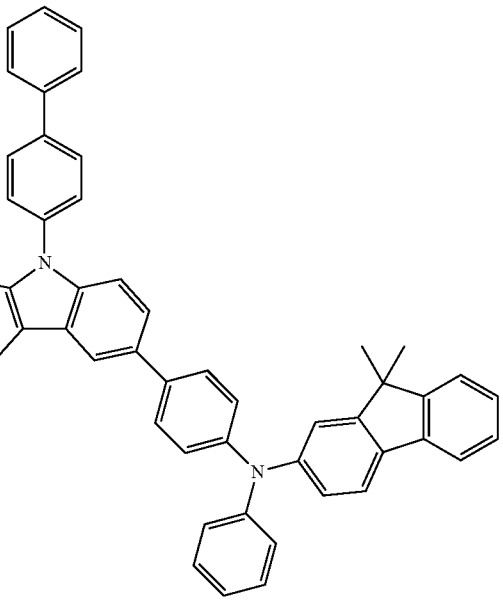
312
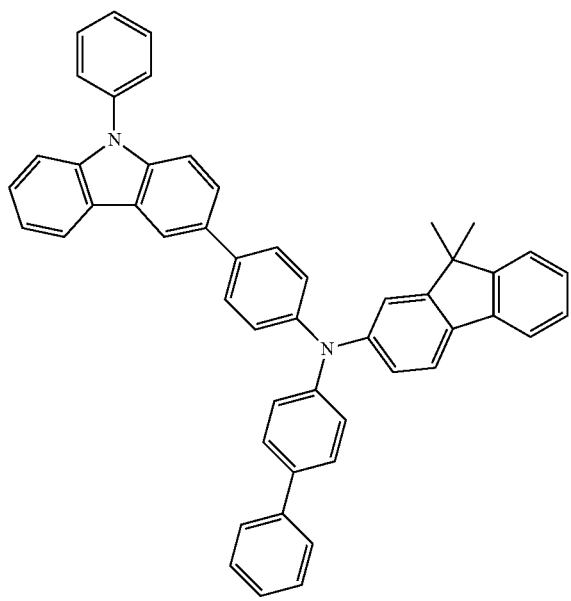
311
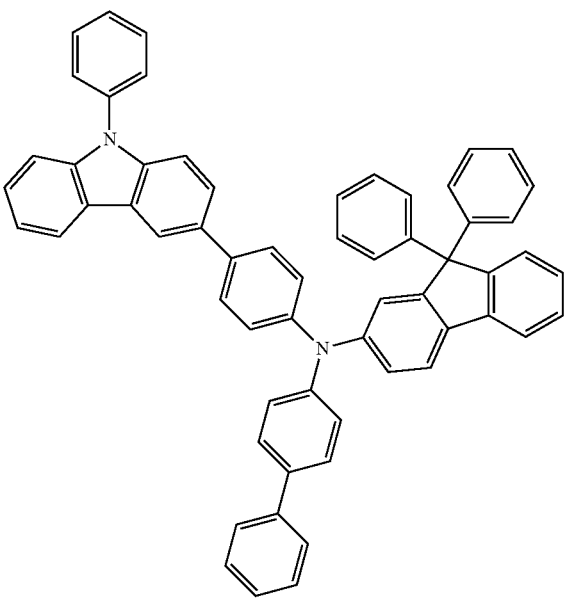
313

314
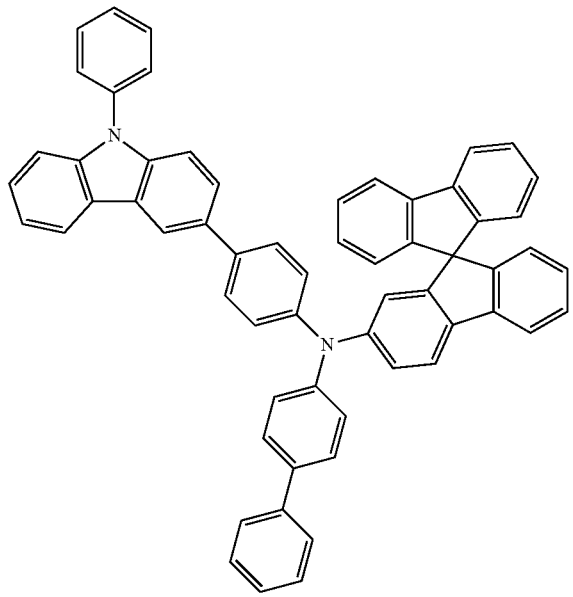
315
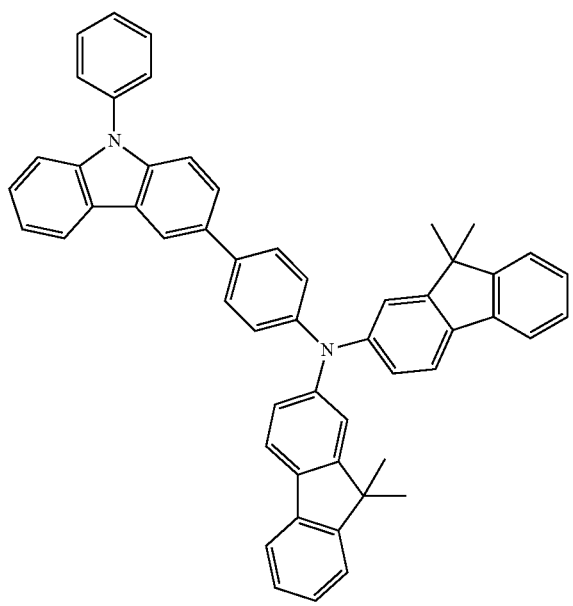
316
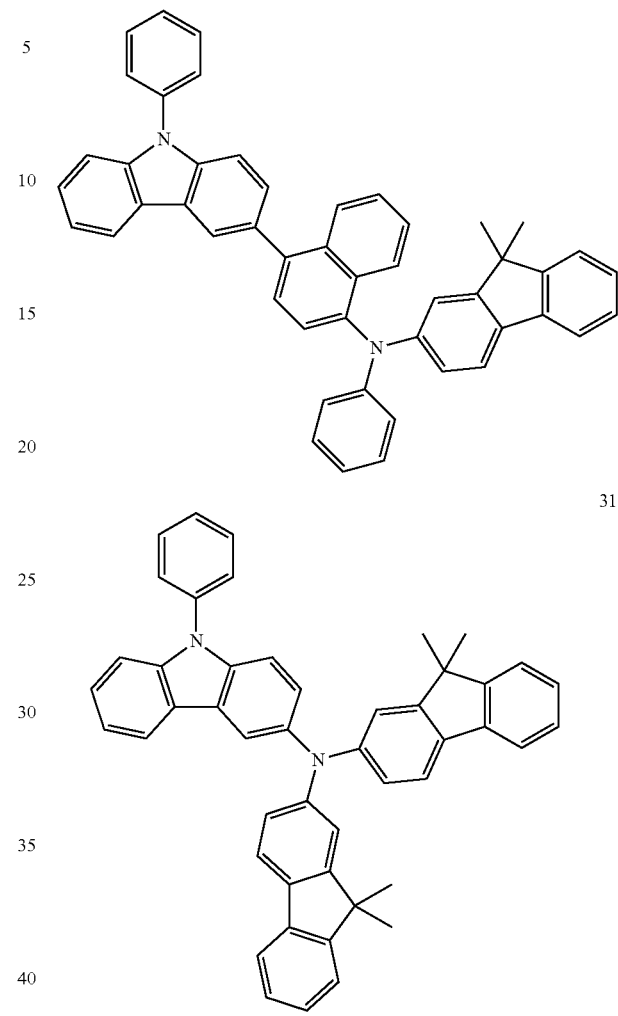
317
318
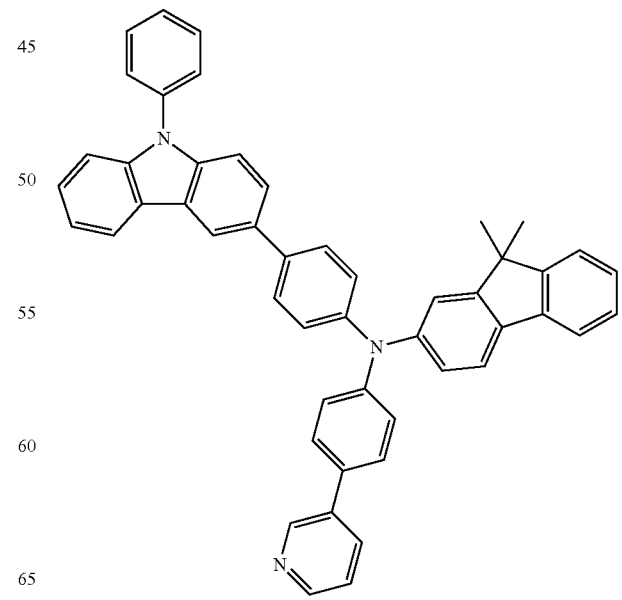

-continued

319

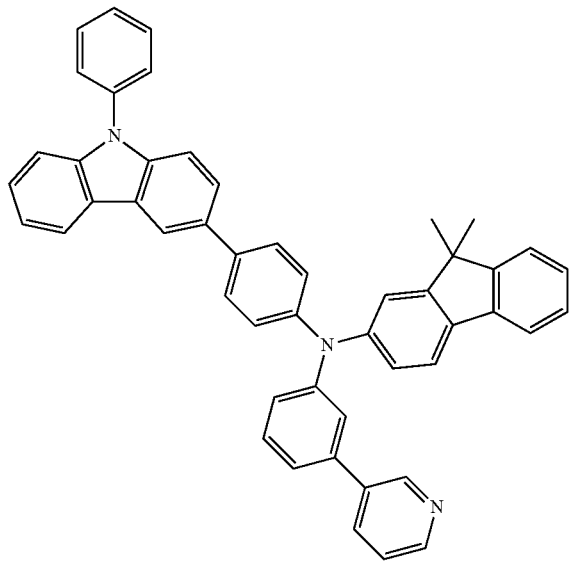

320

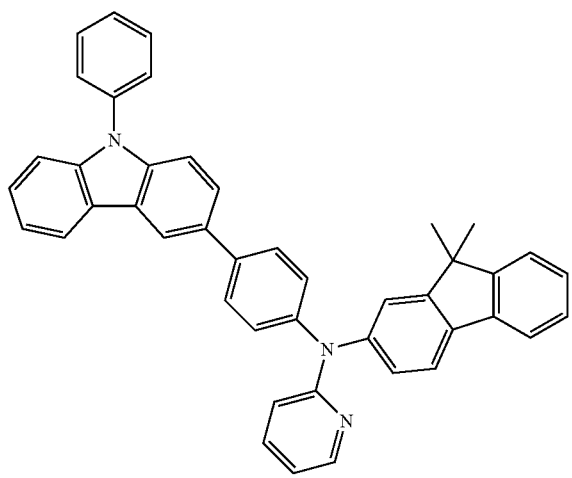

At least one of the HIL, the HTL, and the H-functional layer may further include a charge-generation material to increase conductivity of a layer, in addition to the hole injecting material, the hole transport material, and/or materials having both hole injection and hole transport capabilities.

The charge-generation material may be, for example, a p-dopant. The p-dopant may be, for example, a quinone derivative, such as tetracyanoquinonedimethein (TCNQ) or 2,3,5,6-tetrafluoro-tetracyano-1,4-benzoquinonedimethein (F4-TCNQ), a metal oxide, such as a tungsten oxide or a molybdenum oxide, or a cyano group-containing compound, such as Compound 200 below.

<Compound 200>

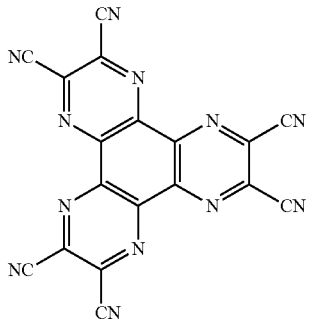

<F4-TCNQ>

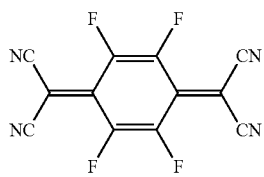

When the hole injection layer, the hole transport layer, or the H-functional layer further includes a charge-generation material, the charge-generation material may be homogeneously dispersed or non-homogeneously distributed in the hole injection layer, the hole transport layer, and the H-functional layer.

A buffer layer may be disposed between at least one of the HIL, the HTL, and the H-functional layer, and an emission layer. The buffer layer may compensate for an optical resonance distance of light according to a wavelength of the light emitted from the emission layer, and thus may increase efficiency. The buffer layer may include any hole injecting material or hole transporting material. In some other embodiments, the buffer layer may include the same material as one of the materials included in the HIL, HTL, and H-functional layer which are disposed under the buffer layer.

Subsequently, an emission layer (EML) may be formed on the hole transport layer, the H-functional layer, or the buffer layer by vacuum deposition, spin coating, casting, LB deposition, etc. If the EML is formed by vacuum deposition or spin coating, the deposition or coating conditions may be similar to those applied to form the HIL, although the deposition or coating conditions may vary according to the material that is used to form the EML.

The EML may be formed by using the compound according to an embodiment or various hosts and dopants. A dopant for use in the EML may be, for example, a fluorescent dopant and/or a phosphorescent dopant.

Exemplary hosts include, for example, $Alq_3$, 4,4'-N,N'-dicarbazole-biphenyl (CBP), poly(n-vinylcarbazole)(PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), E3, distyrylarylene (DSA), dmCBP (see the following chemical structure), or Compounds 501 to 509 illustrated below.

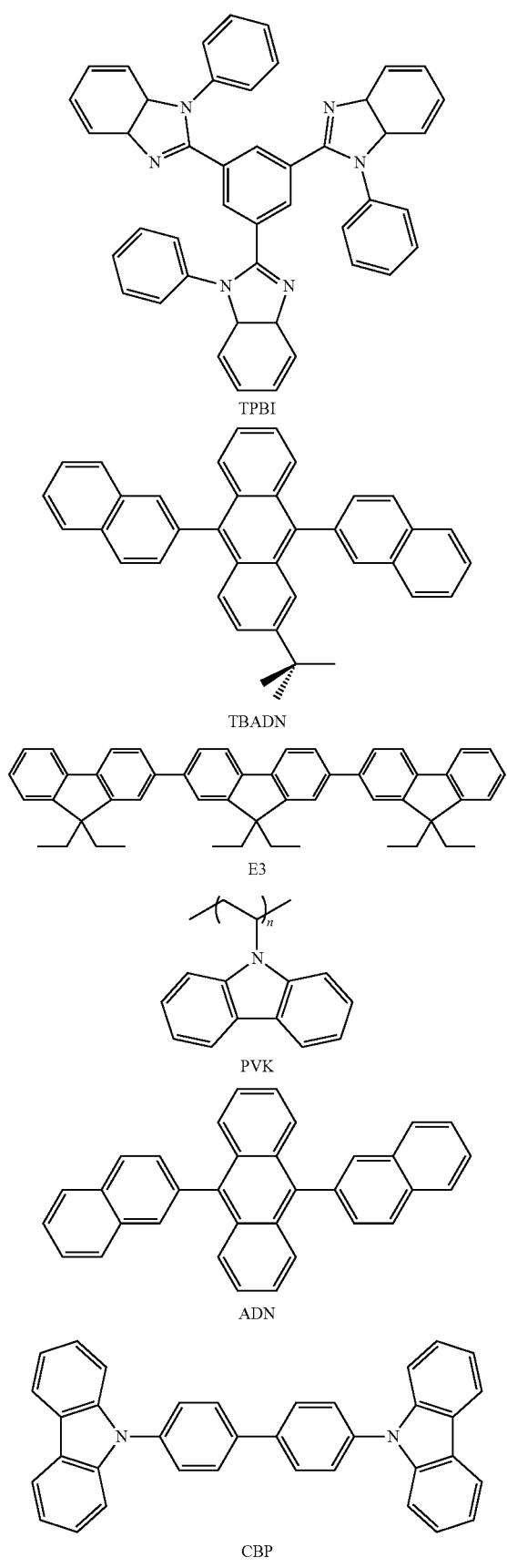
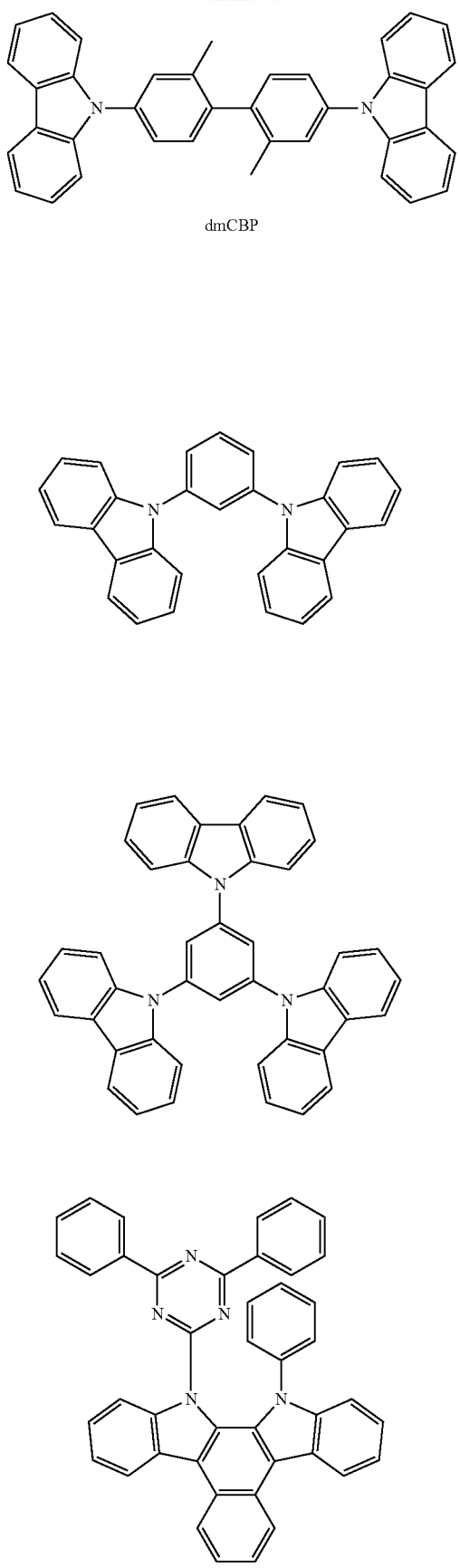

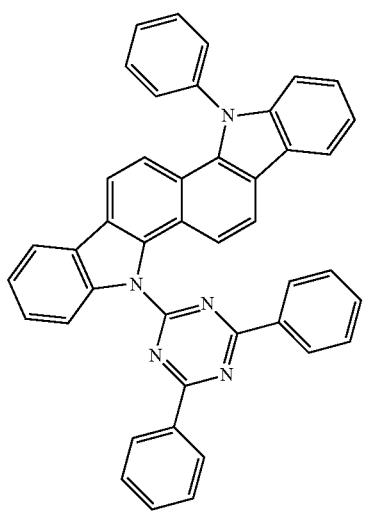 504
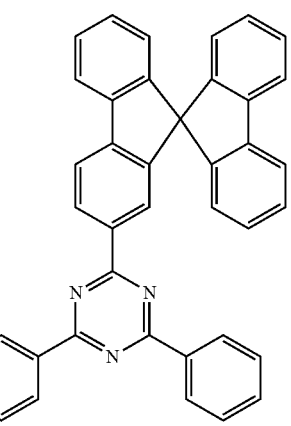 507
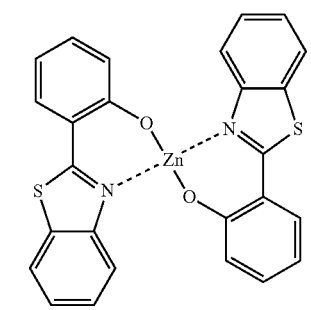 508
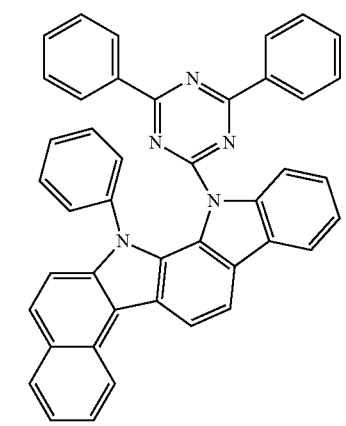 505
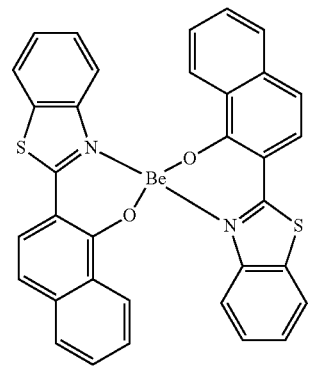 509
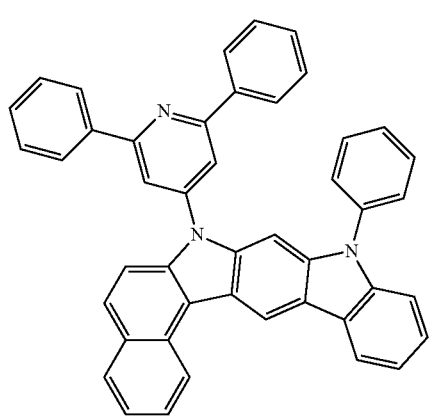 506
Also, the host may be an anthracene-based compound represented by Formula 400 below.
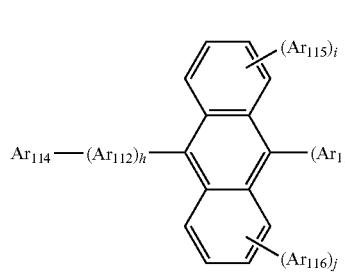
<Formula 400>
wherein:
$Ar_{111}$ and $Ar_{112}$ are each independently a substituted or unsubstituted $C_5$-$C_{60}$ arylene group;

$Ar_{113}$ to $Ar_{116}$ are each independently a substituted or unsubstituted $C_1$-$C_{10}$ alkyl group, or a substituted or unsubstituted $C_5$-$C_{60}$ aryl group; and g, h, i, and j are each independently an integer of 0 to 4.

For example, $Ar_{111}$ and $Ar_{112}$ in Formula 400 may be each independently a phenylene group, a naphthylene group, a phenanthrenyl group, or a pyrenylene group; or a phenylene group, a naphthylene group, a phenanthrenyl group, a fluorenyl group, or a pyrenylene group, each substituted with at least one of a phenyl group, a naphthyl group, and an anthryl group.

Further, g, h, i, and j in Formula 400 may each be independently 0, 1, or 2.

Additionally, $Ar_{113}$ to $Ar_{116}$ in Formula 400 may be each independently a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; or a phenyl group, a naphthyl group, an anthryl group, a pyrenyl group, a phenanthrenyl group, or a fluorenyl group, each substituted with at least one of a deuterium atom, a halogen atom, a hydroxyl group, a cyano group, a nitro group, an amino group, an amidino group, a hydrazine, a hydrazone, a carboxyl group or salt thereof, a sulfonic group or salt thereof, a phosphoric acid group or salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, pyrenyl group, a phenanthrenyl group, a fluorenyl group, and

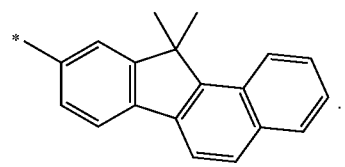 [SMILES: Cc1ccc2c(c1)C(C)(C)c1c-2ccc2ccccc12]

For example, the anthracene-based compound represented by Formula 400 may be one of the following compounds:

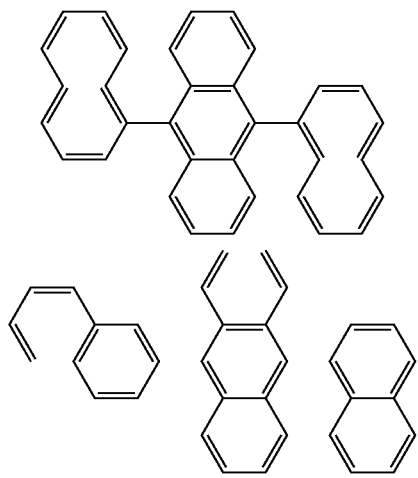

-continued

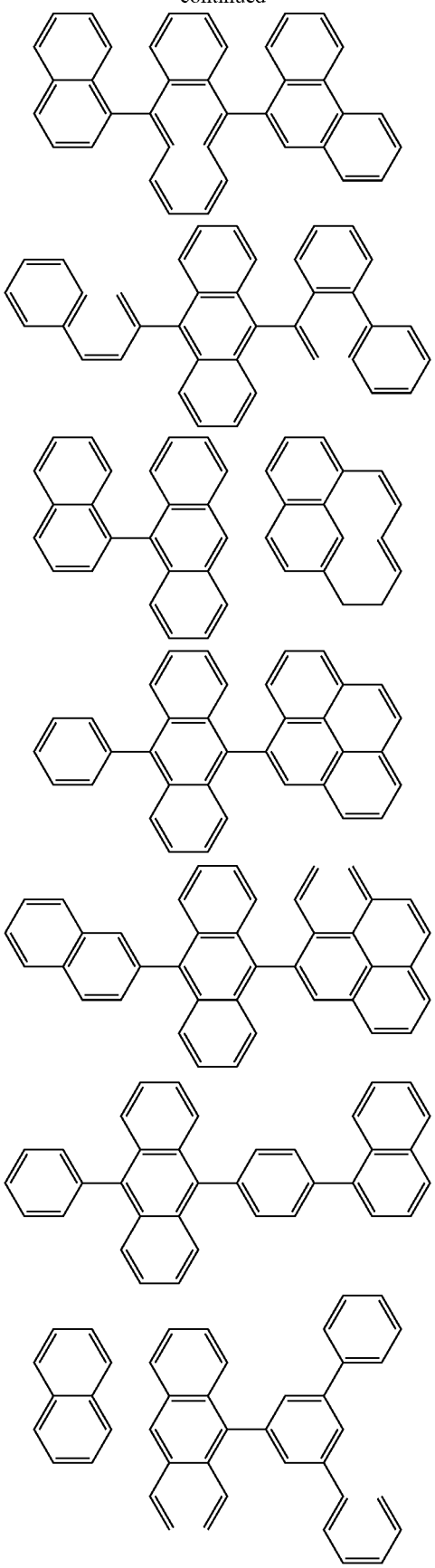

81
-continued
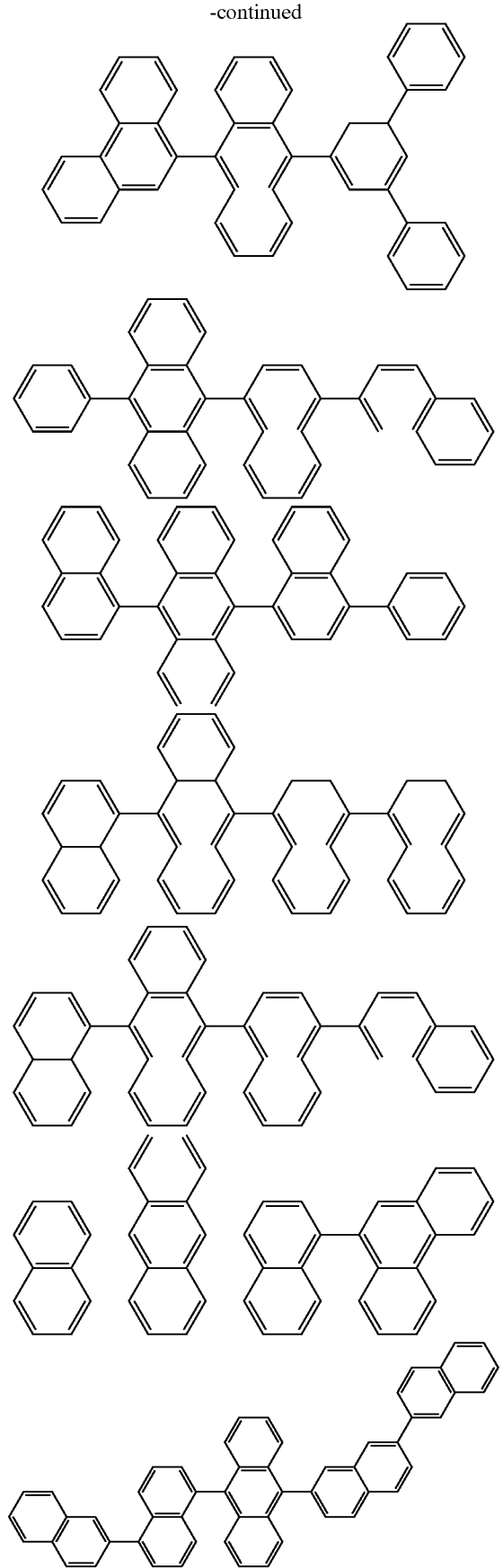
82
-continued
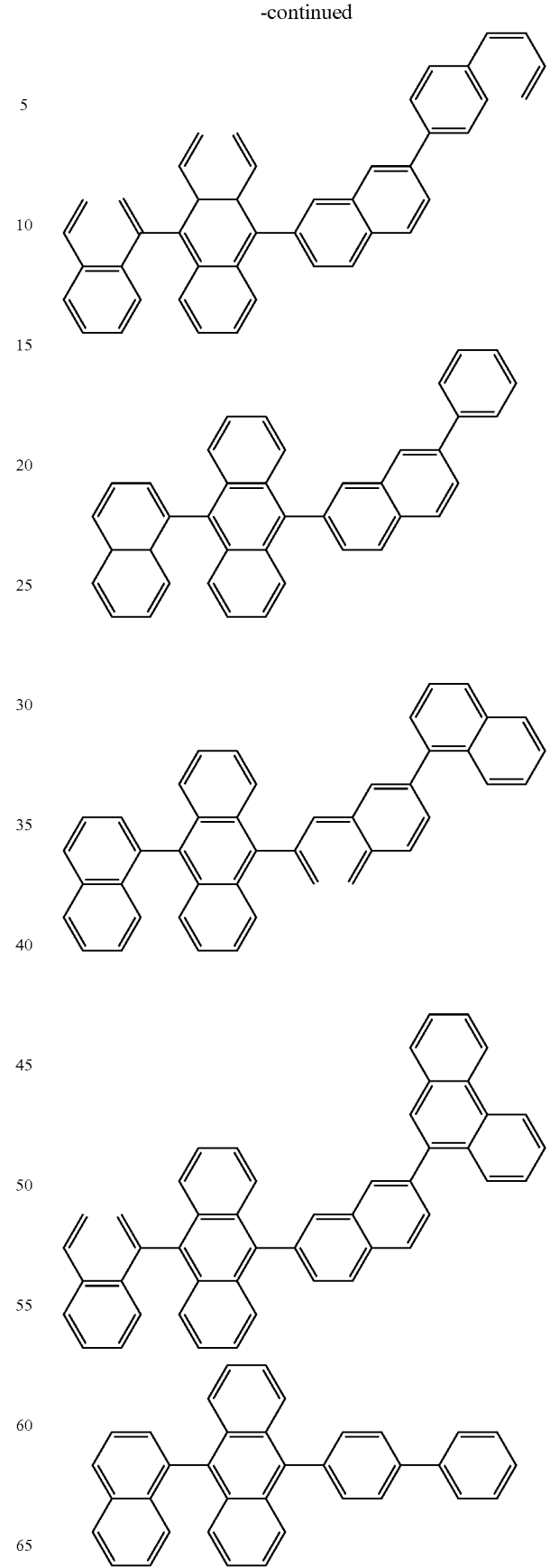

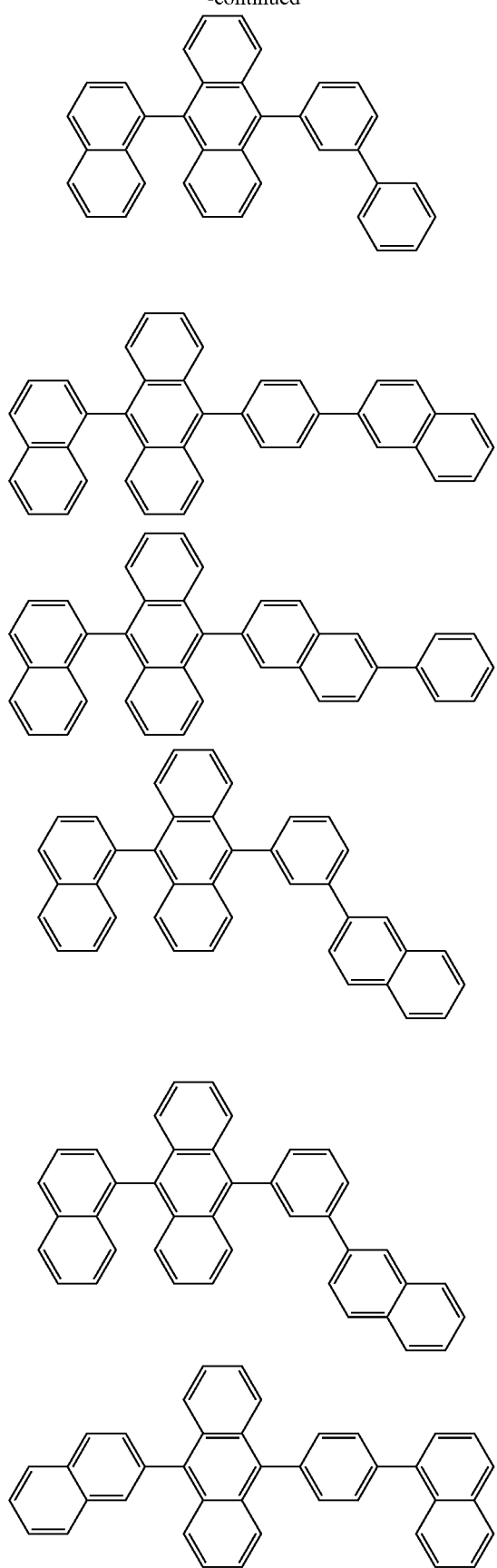

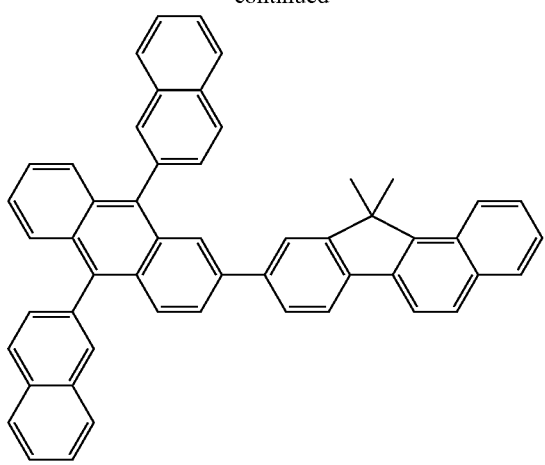

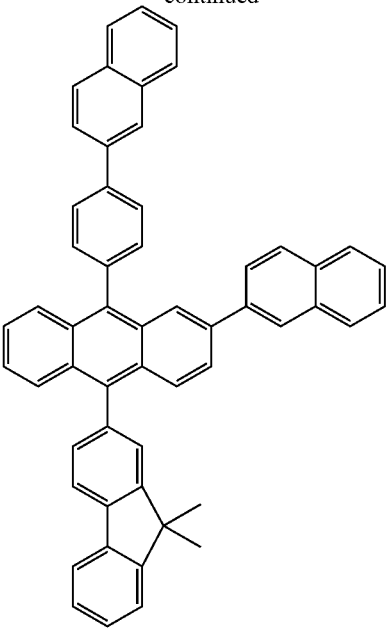

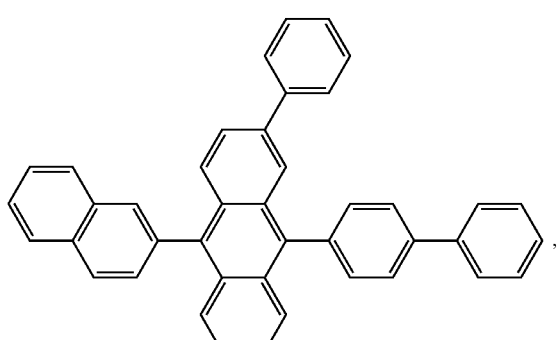

,

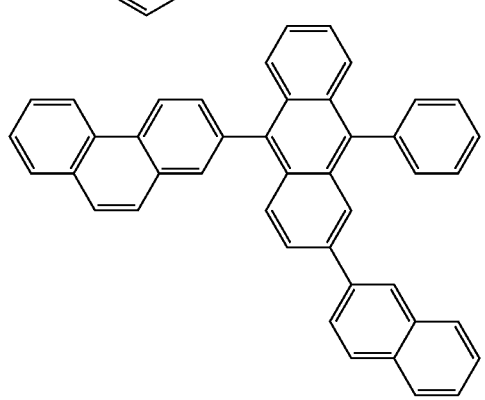

Also, the host may be an anthracene-based compound represented by Formula 401 below.

<Formula 401>

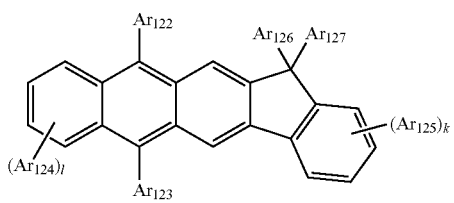

wherein:

$Ar_{122}$ to $Ar_{125}$ in Formula 401 are the same as described in detail in connection with $Ar_{113}$ in Formula 400;

$Ar_{126}$ and $Ar_{127}$ in Formula 401 are each independently a $C_1$-$C_{10}$ alkyl group (for example, a methyl group, an ethyl group, or a propyl group); and k and l in Formula 401 are each independently an integer of 0 to 4.

For example, k and l may be 0, 1, or 2.

The anthracene-based compound represented by Formula 401 may be one of the following compounds:

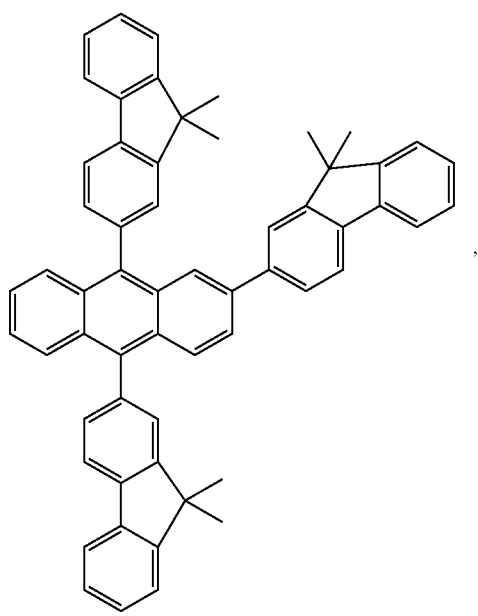

,

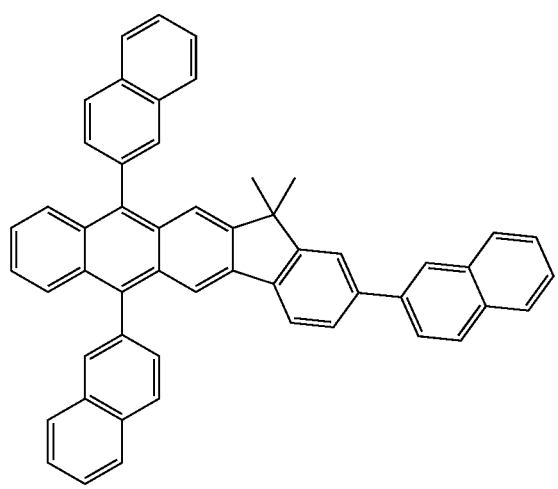
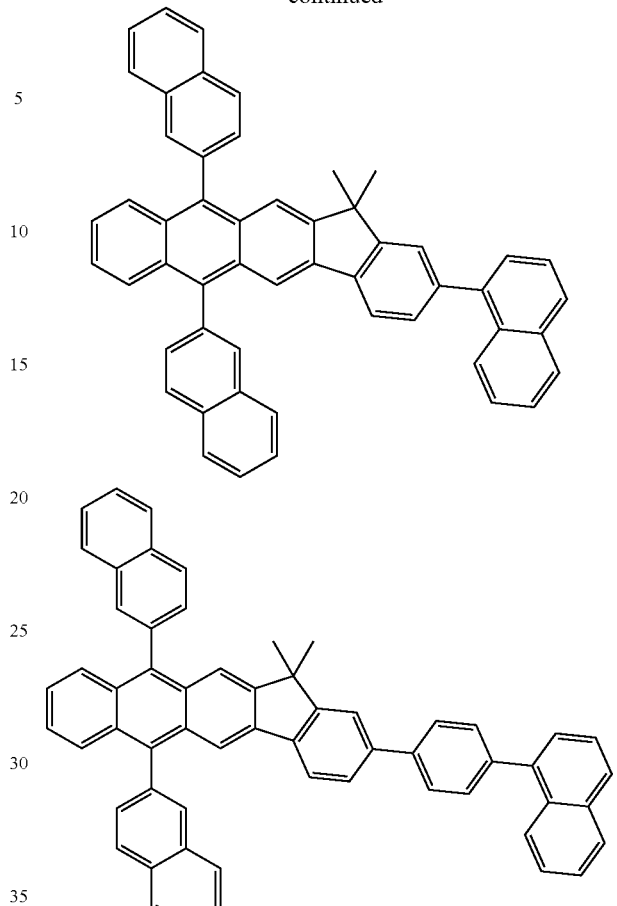
When the organic light-emitting device is a full color organic light-emitting device, the EML may be patterned into a red EML, a green EML, and a blue EML.
Also, at least one of the red EML, the green EML, and the blue EML may include phenylpyridine (ppy) as a dopant.
For example, the following compounds may be used as a blue dopant.
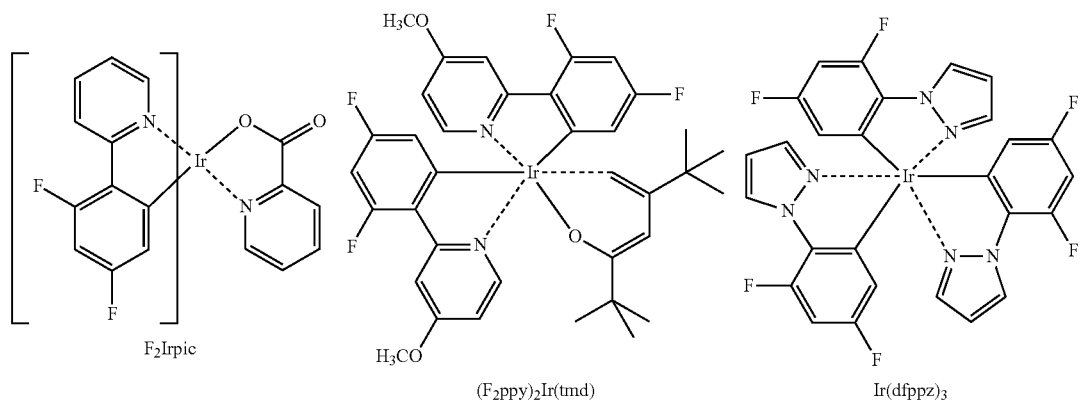

-continued
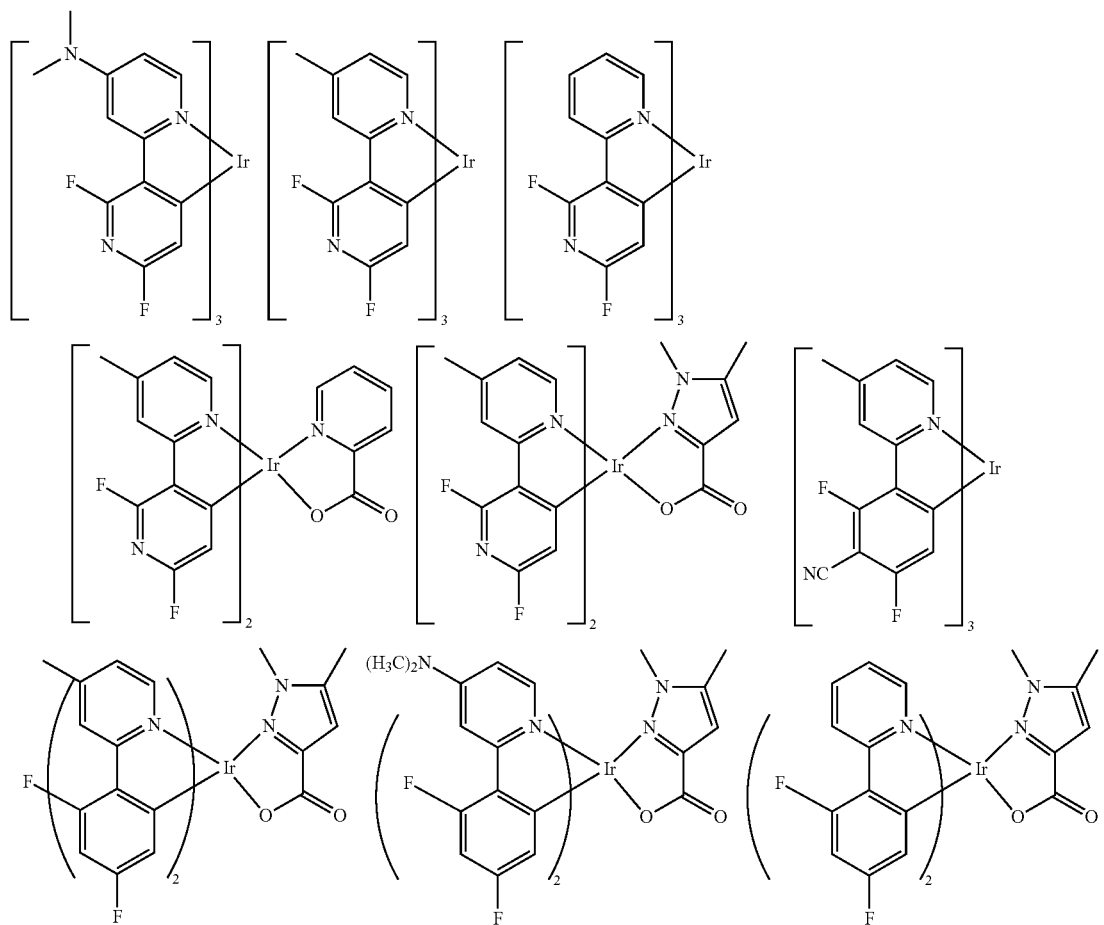
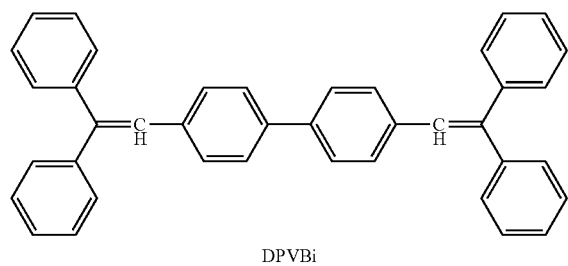
DPVBi
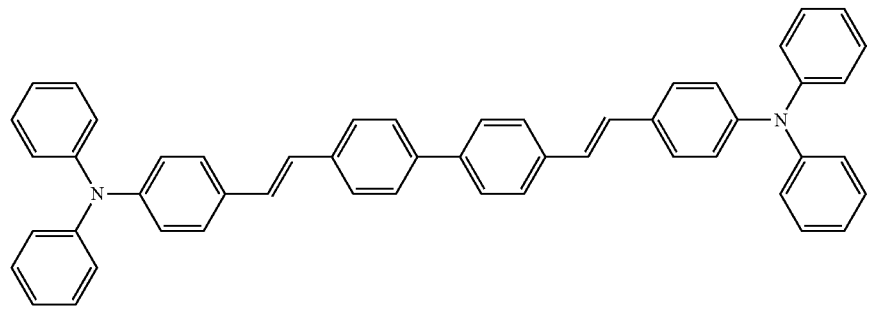
DPAVBi

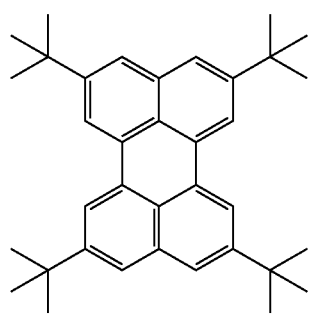
TBPe
For example, compounds illustrated below may be used as a red donant.
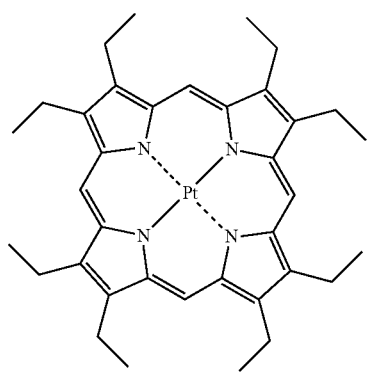
PtOEP
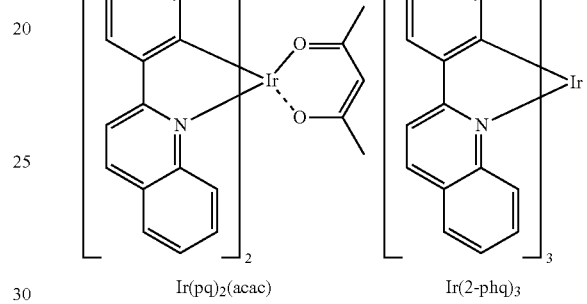
Ir(pq)₂(acac)   Ir(2-phq)₃
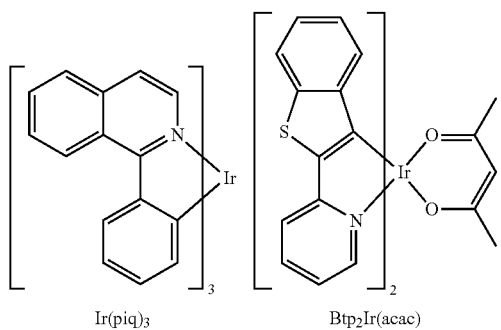
Ir(piq)₃   Btp₂Ir(acac)
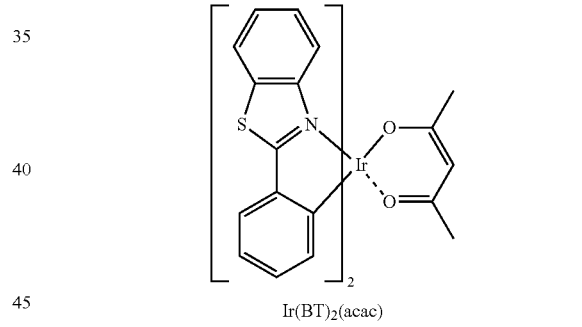
Ir(BT)₂(acac)
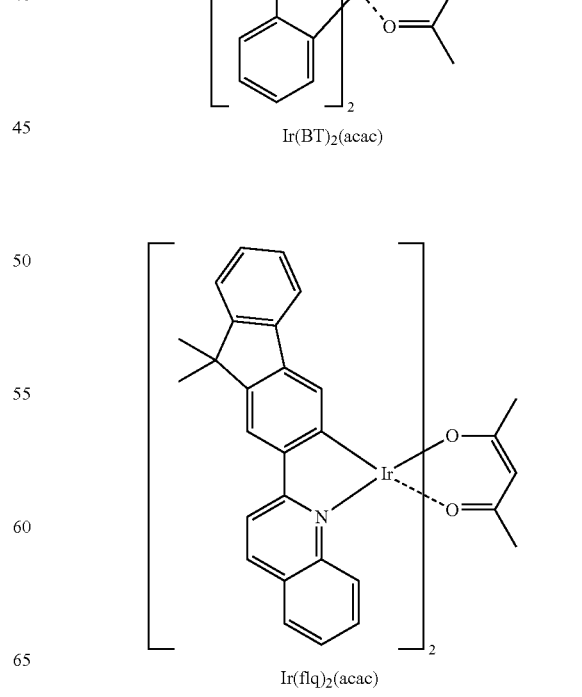
Ir(flq)₂(acac)

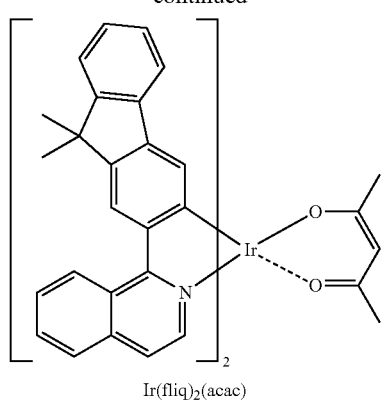
Ir(fliq)₂(acac)
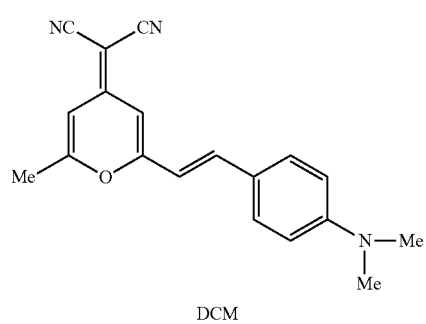
DCM
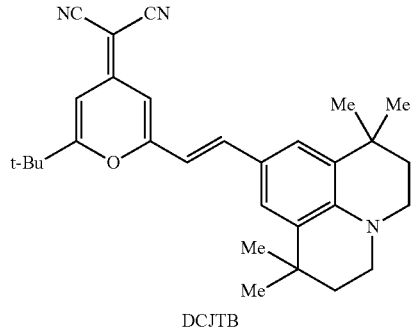 [SMILES: CC(C)(C)C1=CC(=C(C#N)C#N)C=C(/C=C/c2cc3c4c(c2)C(C)(C)CCN4CCC3(C)C)O1]
DCJTB
For example, compounds illustrated below may be used as a green dopant.
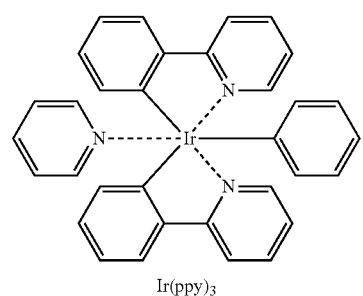
Ir(ppy)₃
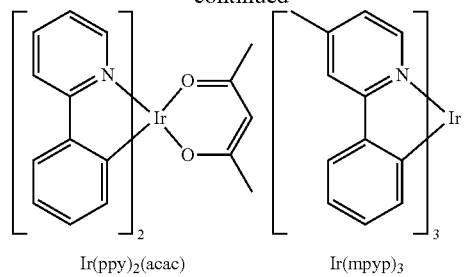
Ir(ppy)₂(acac)        Ir(mpyp)₃
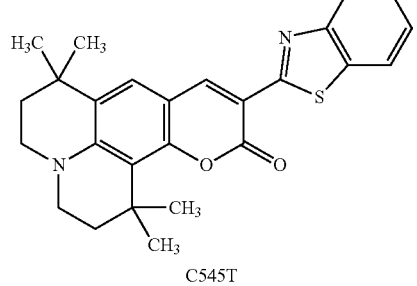
C545T
Another example of the dopant included in the EML is a Pd-complex or Pt-complex compound illustrated below:
D1
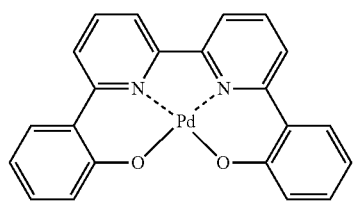
D2
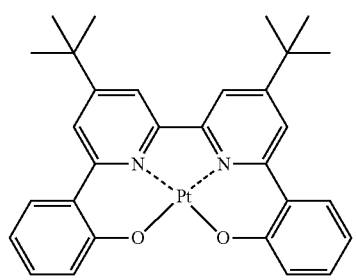
D3
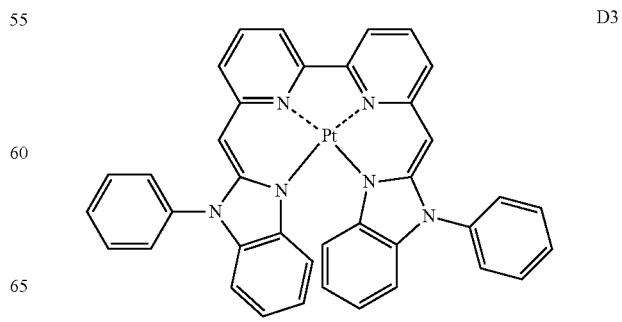

-continued
D4
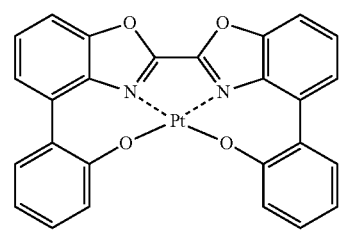
D5
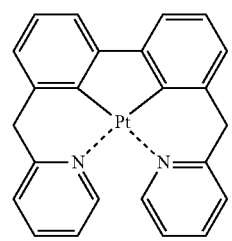
D6
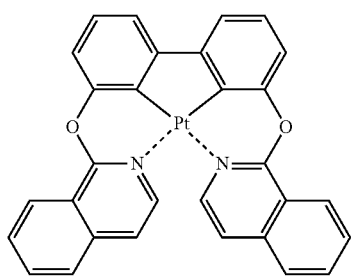
D7
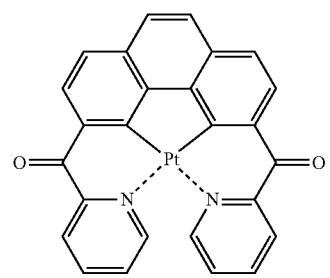
D8
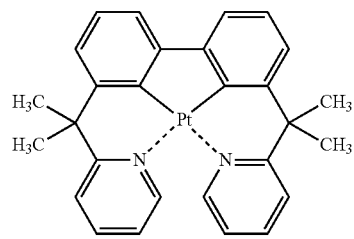
D9
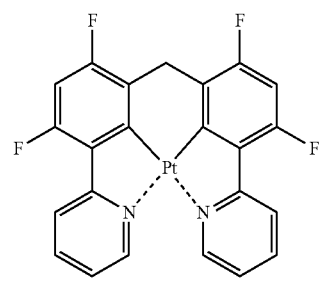
-continued
D10
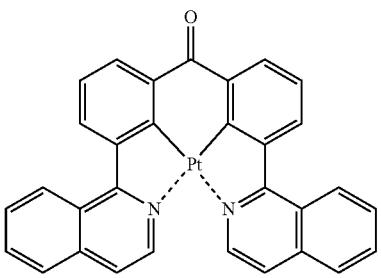
D11
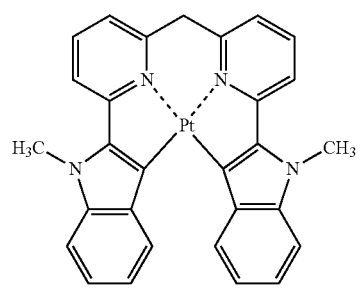
D12
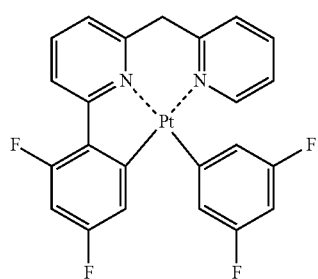
D13
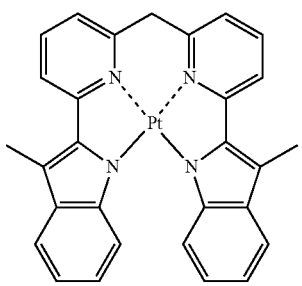
D14
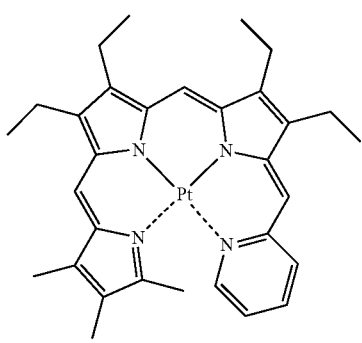

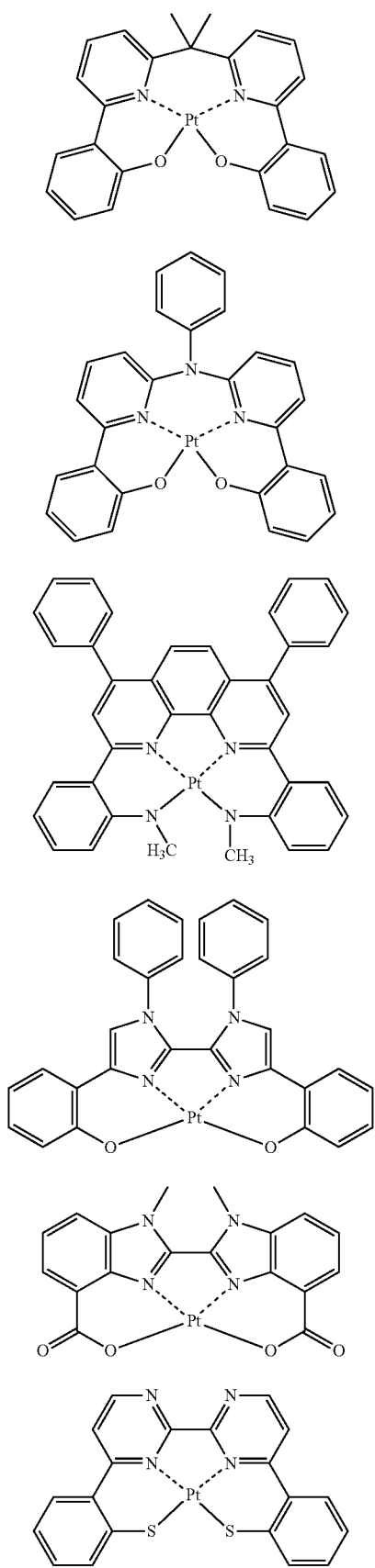
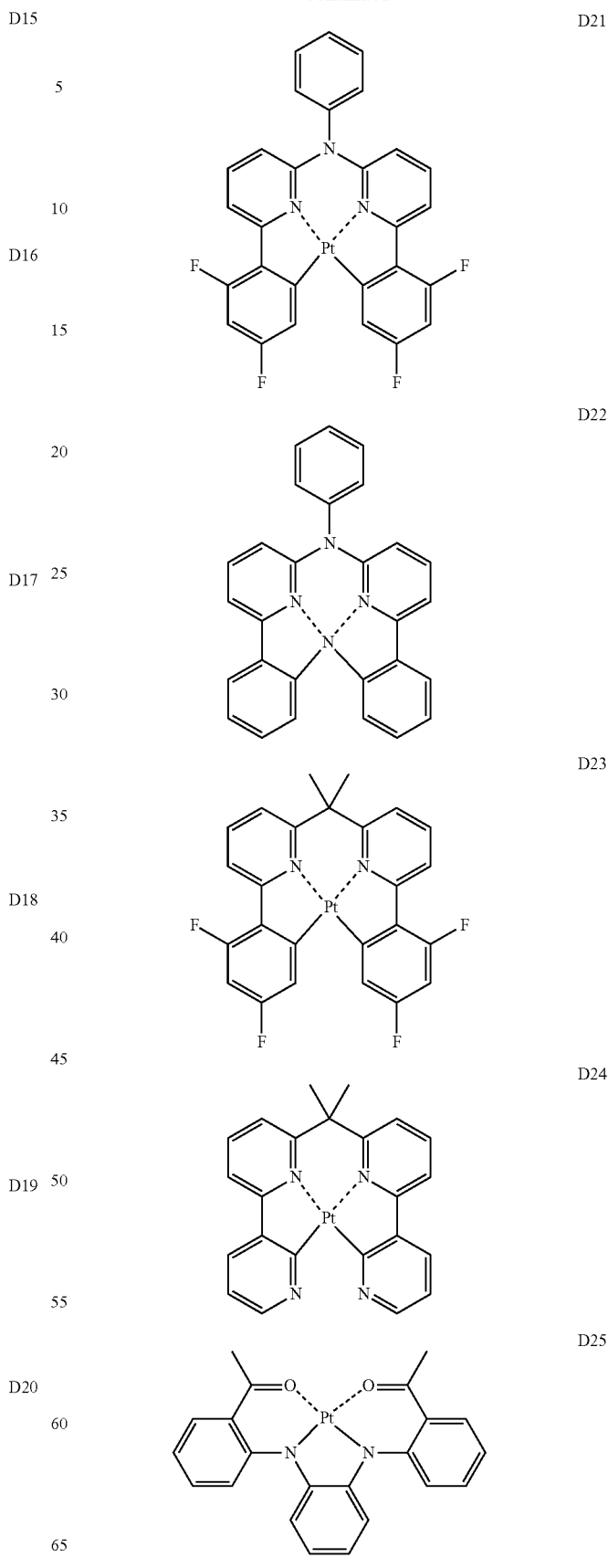

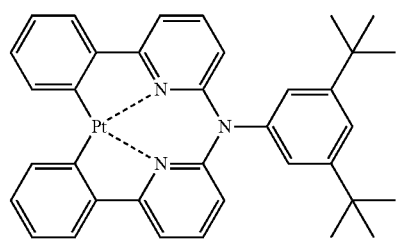
D26
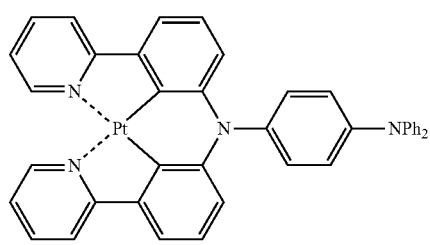
D32
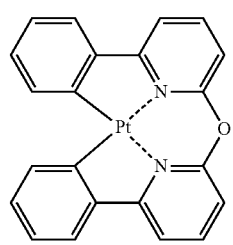
D27
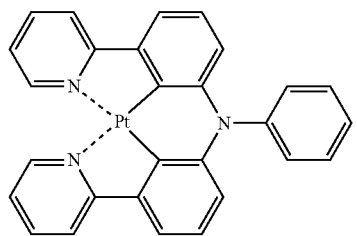
D28
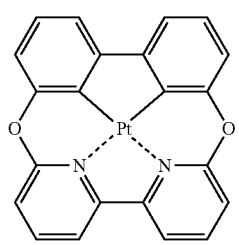
D33
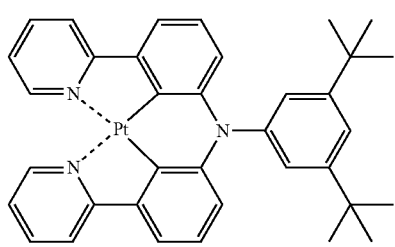
D29
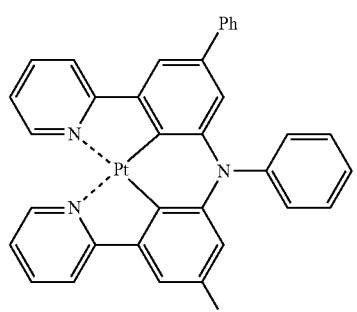
D34
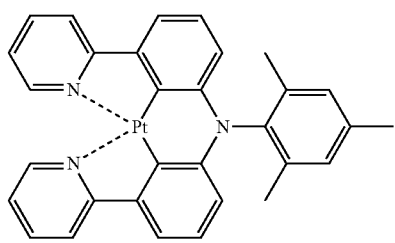
D30
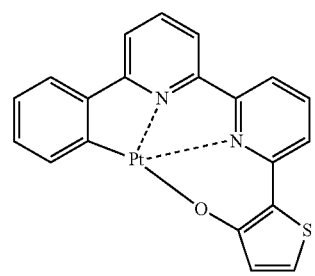
D35
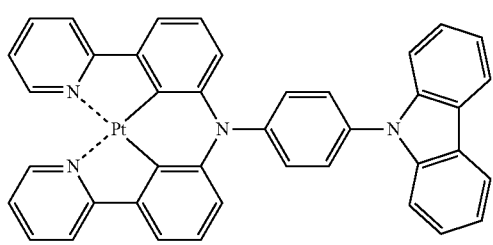
D31
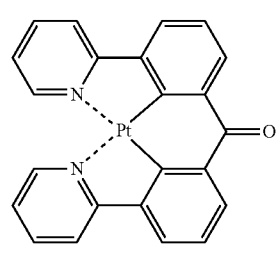
D36

-continued
D37
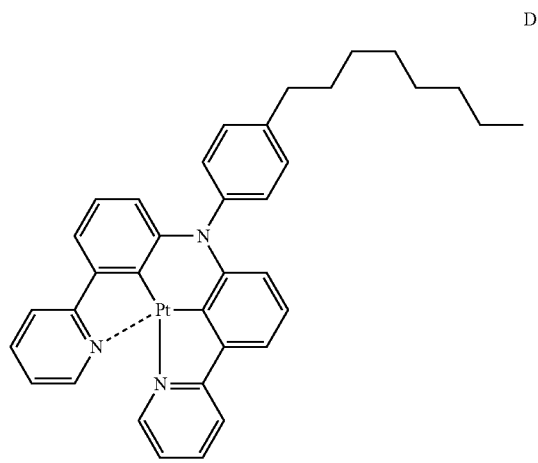
D38
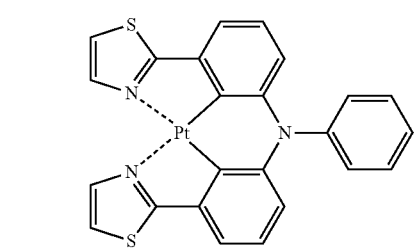
D39
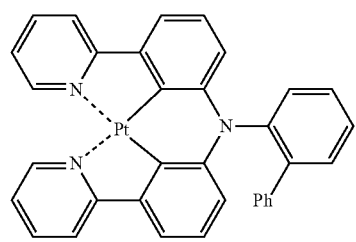
D40
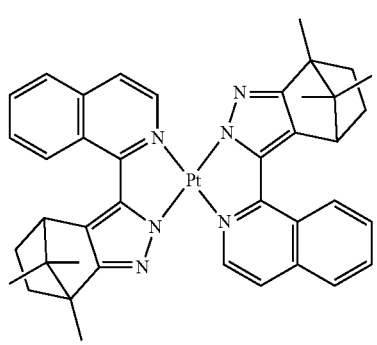
D41
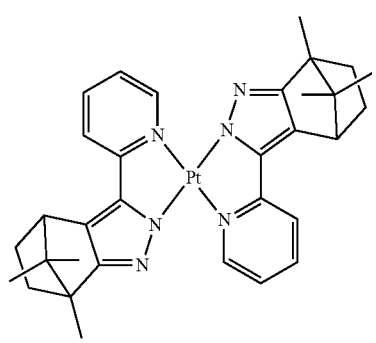
-continued
D42
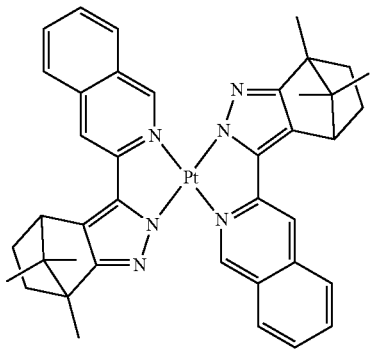
D43
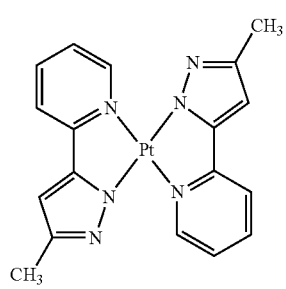
D44
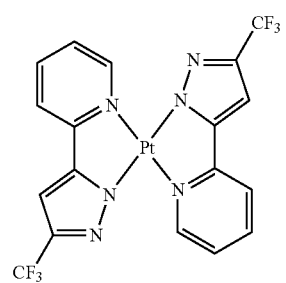
D45
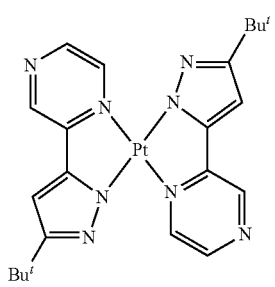
D46
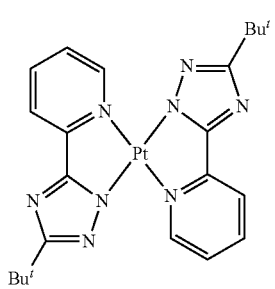

-continued

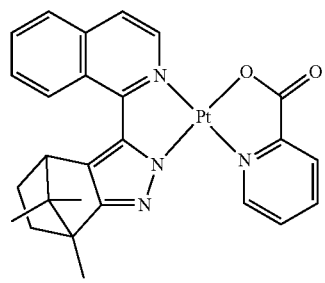
D47

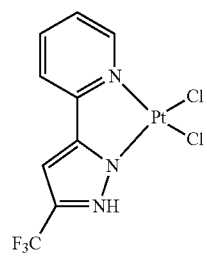
D48

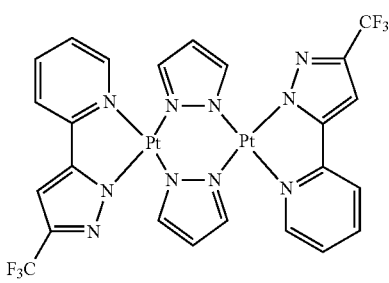
D49

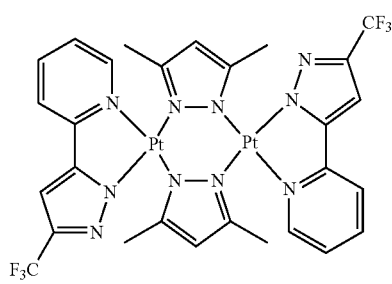
D50

Another example of the dopant included in the EML is an Os-complex compound illustrated below:

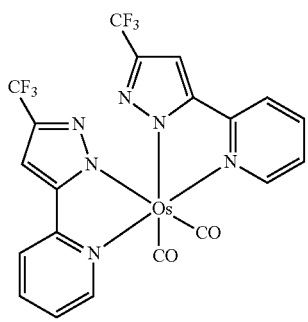

Os(fppz)₂(CO)₂

-continued

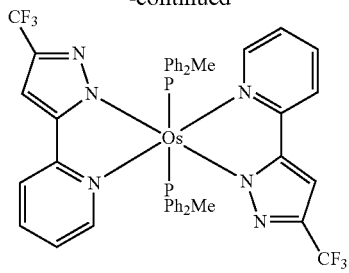

Os(fppz)₂(PPh₂Me)₂

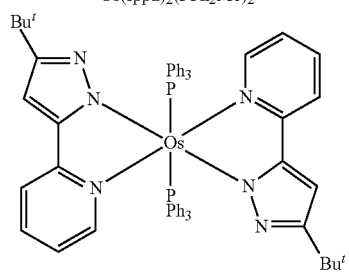

Os(bppz)₂(PPh₃)₂

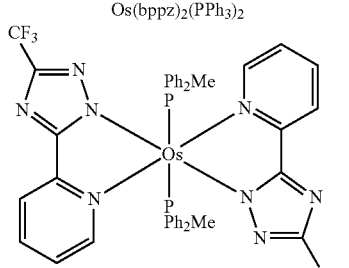

Os(fptz)₂(PPh₂Me)₂

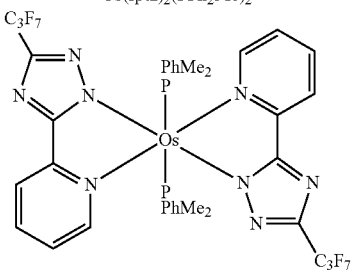

Os(hptz)₂(PPh₂Me₂)₂

When the EML includes a host and a dopant, an amount of the dopant may be, for example, from about 0.01 to about 15 parts by weight based on about 100 parts by weight of the host.

A thickness of the EML may be in a range of about 100 Å to about 10,000 Å, for example, about 200 Å to about 600 Å. Maintaining the thickness of the EML within these ranges may help provide excellent luminescent characteristics without a substantial increase in driving voltage.

Next, an electron transport layer (ETL) is formed on the EML by using various methods, for example, by vacuum deposition, spin coating, or casting. If the ETL is formed by vacuum deposition or spin coating, the deposition or coating conditions may be similar to those applied to form the HIL, although the deposition or coating conditions may vary according to the material that is used to form the ETL.

A material for forming the ETL may be a material that stably transports electrons injected from an electron injection electrode (cathode), and such a material may be the compound according to an embodiment or an electron transport material.

Exemplary electron transport material include, for example, a quinoline derivative, such as tris(8-quinolinolate)aluminium (Alq3), TAZ, Balq, beryllium bis(benzoquinolin-10-olate) (Bebq₂), ADN, Compound 201, and Compound 202.

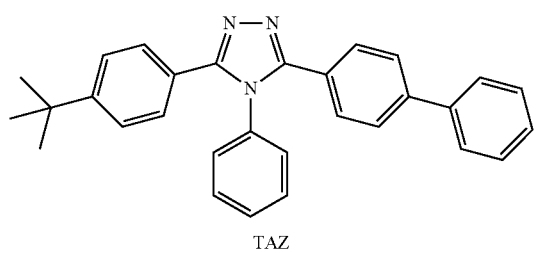

TAZ

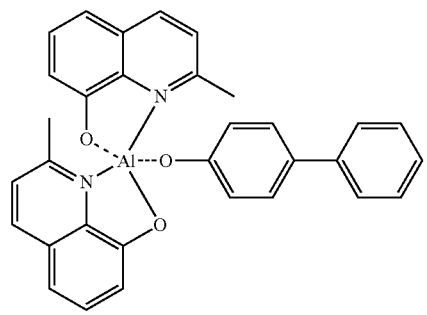

BAlq

<Compound 201>

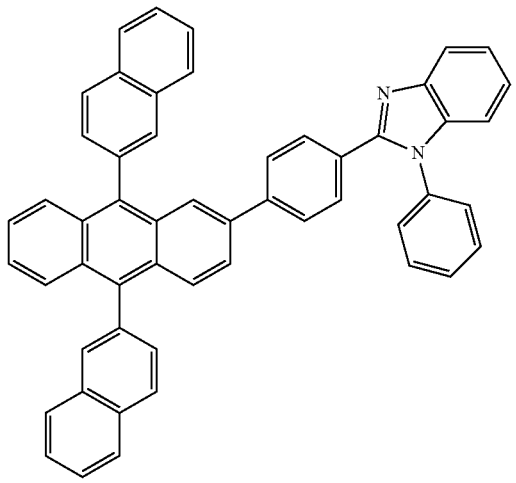

<Compound 202>

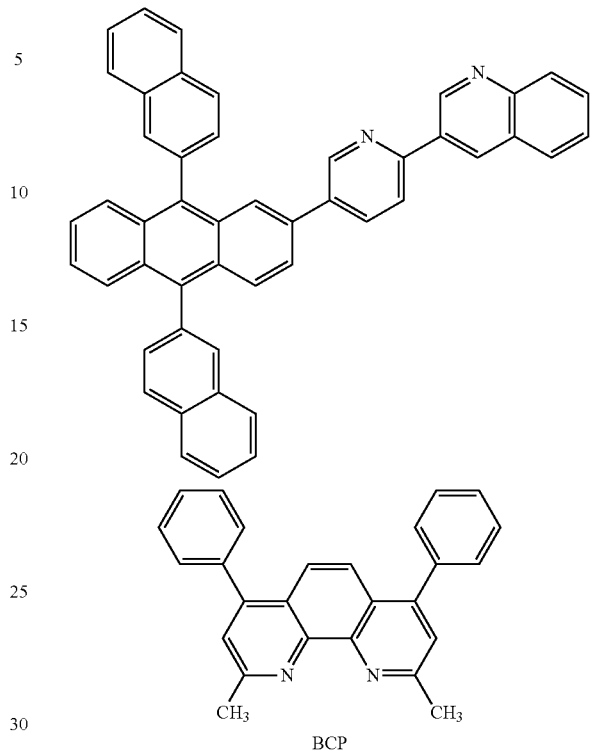

BCP

A thickness of the ETL may be in a range of about 100 Å to about 1,000 Å, for example, about 150 Å to about 500 Å. Maintaining the thickness of the ETL within the range described above may help provide the ETL with satisfactory electron transport characteristics without a substantial increase in driving voltage.

Also, the ETL may include, in addition to an electron transport organic compound, a metal-containing material.

The metal-containing material may include a lithium (Li) complex. Examples of the Li complex are lithium quinolate (LiQ) and Compound 203 below:

<Compound 203>

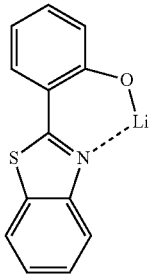

Also, a material that may allow electron to be easily injected from an anode may be deposited on the electron transport layer to form an electron injection layer (EIL).

The material for forming the EIL may be, for example, LiF, NaCl, CsF, $Li_2O$, or BaO. The deposition conditions of the EIL may vary according to a material that is used to form the EIL, and may be similar to those applied to form the HIL.

A thickness of the EIL may be in a range of about 1 Å to about 100 Å, for example, about 3 Å to about 90 Å.

Maintaining the thickness of the EIL within the ranges described above may help provide the EIL with satisfactory electron transport characteristics without a substantial increase in a driving voltage.

The second electrode may be disposed on the organic layer. The second electrode may be a cathode, which is an electron injection electrode. A material for forming the second electrode may be a metal, an alloy, an electrically conductive compound, each having a low-work function, or a mixture thereof. In detail, lithium (Li), magnesium (Mg), aluminum (Al), aluminum-lithium (Al—Li), calcium (Ca), magnesium-indium (Mg—In), magnesium-silver (Mg—Ag), etc. may be formed as a thin film for use as a transmissive electrode. In some embodiments, to manufacture a top-emission light-emitting device, a transmissive electrode may be formed of indium tin oxide (ITO) or indium zinc oxide (IZO).

Hereinbefore, the organic light-emitting device has been described with reference to FIG. 1. Additional embodiments include omission of one or more of the layers illustrated in FIG. 1 (i.e., EIL, ETL, EML, HTL, and HIL) and/or rearrangement of one or more of the layers illustrated in FIG. 1.

Also, when the EML includes a phosphorescent dopant, a hole blocking layer (HBL) may be formed between the ETL and the EML or between the E-functional layer and the EML by vacuum deposition, spin coating, casting, LB deposition, etc. so as to prevent diffusion of triplet excitons or holes into the ETL. When the HBL is formed by vacuum deposition or spin coating, the deposition or coating conditions may be similar to those applied to form the HIL, although the deposition or coating conditions may vary according to the material that is used to form the HBL. Exemplary hole blocking material include, for example, an oxadiazole derivative, a triazole derivative, a phenanthroline derivative, etc. For example, bathocuproine (BCP) illustrated below may be used as a hole-blocking material.

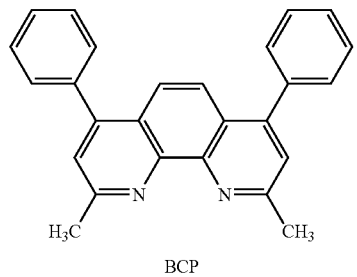 [SMILES: Cc1cc(-c2ccccc2)c2ccc3c(-c4ccccc4)cc(C)nc3c2n1 ; "BCP"]

BCP

A thickness of the HBL may be in a range of about 20 Å to about 1,000 Å, for example, about 30 Å to about 300 Å. Maintaining a thickness of the HBL within the ranges described above may help provide excellent hole blocking properties without a substantial increase in driving voltage.

An organic light-emitting device according to an embodiment may be included in various flat panel display apparatuses, for example, a passive matrix organic light-emitting display apparatus and an active matrix organic light-emitting display apparatus. For example, when the organic light-emitting device is included in an active matrix organic light-emitting display apparatus, the first electrode disposed on a substrate may function as a pixel and may be electrically connected to a source electrode or a drain electrode of a thin film transistor. In addition, the organic light-emitting device may be included in a flat panel display apparatus that emits light in opposite directions.

The organic layer of an organic light-emitting device according to an embodiment may be formed by depositing a compound according to an embodiment, or by coating a compound according to an embodiment prepared as a solution. The latter method is a wet method.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Synthesis Example 1

Synthesis of Compound 4

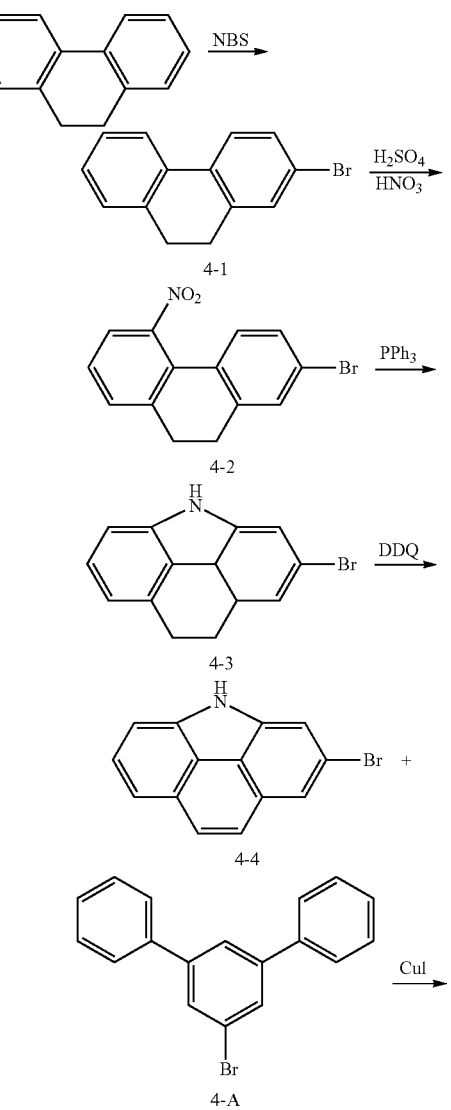

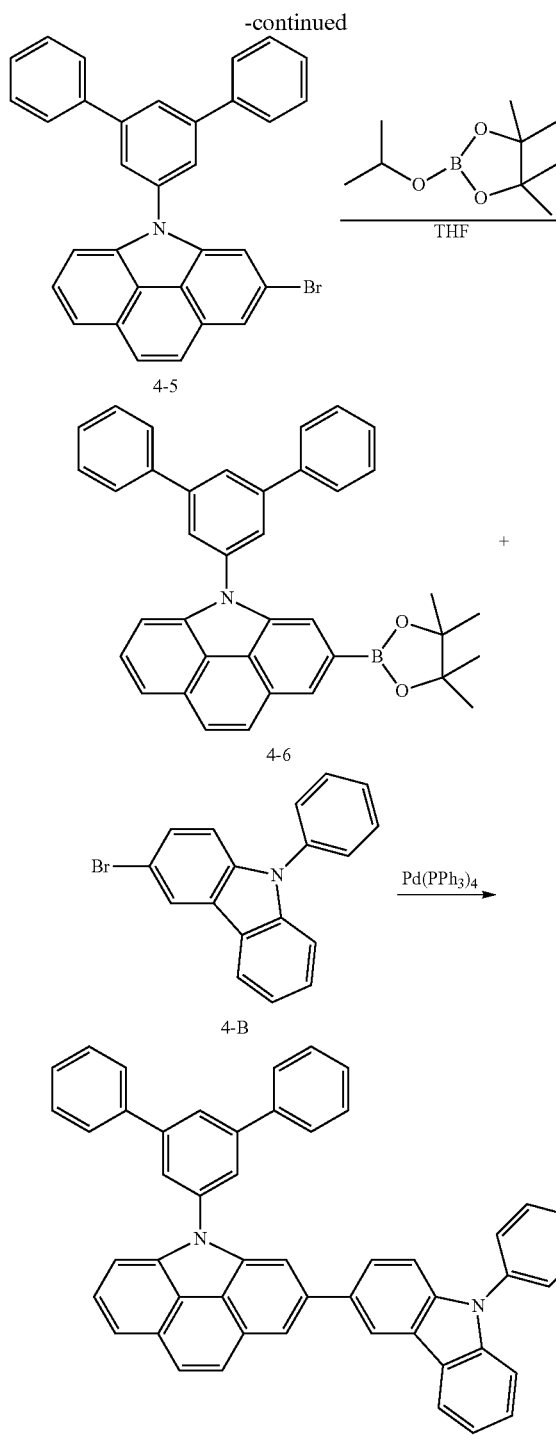

filter, and then washed with methanol, whereby 6.4 g (Yield: 45%) of Intermediate 4-1 was obtained as a gray crystal. The obtained compound was identified by LC-MS. $C_{14}H_{11}Br$ $M^+$ 258.0

Synthesis of Intermediate 4-2

3.9 g (15.0 mmol) of Intermediate 4-1 was completely dissolved in 50 mL of dichloromethane, and 1.7 g (30.0 mmol) of a nitric acid was added thereto at room temperature, and then, 1.5 g (15.0 mmol) of a sulfuric acid was slowly dropped thereto and the mixture was stirred at a temperature of 30° C. for 6 hours. When the reaction was terminated, the reaction solution was cooled to room temperature, and then, 50 mL of methanol was added thereto and the result was stirred for 2 hours to precipitate crystals. The crystals were collected by using a reduced-pressure filter, and then washed with methanol, whereby 4.1 g (Yield: 90%) of Intermediate 4-2 was obtained as a yellow crystal. The obtained compound was identified by LC-MS. $C_{14}H_{10}BrNO_2 M^+$ 302.9

Synthesis of Intermediate 4-3

3.6 g (12.0 mmol) of Intermediate 4-2 was melted in 30 mL of o-dichlorobenzene and then completely dissolved by heating, and then, 4.7 g (18.0 mmol) of triphenylphosphine was added thereto, and the mixture was stirred at a temperature of 180° C. for 3 hours. The reaction solution was cooled to room temperature, and then, the residual obtained by evaporating the solvent was separation-purified by using a silica gel column chromatography and then, the result was washed with methanol to obtain 2.3 g (Yield: 70%) of Intermediate 4-3, which was a white crystal. The obtained compound was identified by LC-MS. $C_{14}H_{12}BrN$ $M^+$ 273.0

Synthesis of Intermediate 4-4

2.7 g (10.0 mmol) of Intermediate 4-3 was dissolved in 100 mL of toluene in an oxygen atmosphere, and then, at room temperature, 0.6 g (0.3 mmol) of 2,3-dichloro-5,6-dicyano-1,4-benzoquinone and 0.2 g (0.3 mmol) of $NaNO_2$ were added thereto and the mixture was stirred at a temperature of 110° C. for 6 hours. When the reaction was terminated, the reaction solution was cooled at room temperature, and the residual obtained by evaporating a solvent was separation-purified by using silica gel column chromatography to obtain 2.4 g (Yield: 90%) of Intermediate 4-4. The obtained compound was identified by LC-MS. $C_{14}H_8BrN$ $M^+$ 268.9

Synthesis of Intermediate 4-5

2.6 g (10.0 mmol) of Intermediate 4-4, 3.7 g (12.0 mmol) of Compound 4-A, 0.2 g (1.0 mmol) of 1,10-phenanthroline, 0.2 g (2.0 mmol) of CuI, and 4.1 g (30.0 mmol) of $K_2CO_3$ were dissolved in 30 mL of N,N-dimethylformamide (DMF), and then, the mixture was stirred at a temperature of 80° C. for 24 hours. The reaction solution was cooled to room temperature, and then extracted three times with 30 mL of water and 40 mL of diethylether. A collected organic layer was dried by using magnesium sulfate, and then the residual obtained by evaporating a solvent was separation-purified by using silica gel column chromatography to obtain 4.4 g (Yield: 89%) of Intermediate 4-5. The obtained compound was identified by LC-MS. $C_{32}H_{20}BrN$ $M^+$ 497.0

Synthesis of Intermediate 4-1

10.0 g (55.4 mmol) of 9,10-dihydrophenanthrene, 10.9 g (60.5 mmol) of N-bromosuccinimide, and 0.3 g (1.4 mmol) of p-TsOH were dissolved in 30 mL of acetonitrile, and then, the mixture was stirred at a temperature of 50° C. for 12 hours. The reaction solution was cooled to room temperature, and then, stirred for 30 minutes to precipitate crystals. The crystals were collected by using a reduced-pressure

Synthesis of Intermediate 4-6

12.0 g (23.6 mmol) of Intermediate 4-5 was dissolved in 100 ml of THF, and then, at a temperature of −78° C., n-BuLi 10 mL (25.0 mmol, 2.5M in hexane) was slowly dropped thereto. At the same temperature, after the mixture was stirred for one hour, 9.3 mL (50.0 mmol) of 2-isoproxy-4,4,5,5,-tetramethyl-1,3,2-dioxaborolane was slowly dropped thereto, and then, the reaction solution was stirred at a temperature of −78° C. for 1 hour, and then, the result was additionally stirred for 24 hours at room temperature. When the reaction was terminated, 50 mL of 10% HCl aqueous solution and 50 mL of H$_2$O were added thereto, and then the result was extracted three times with 80 mL of diethylether. A collected organic layer was dried by using magnesium sulfate, and then the residual obtained by evaporating the solvent was separation-purified by using silica gel column chromatography to obtain 8.1 g (Yield: 73%) of Intermediate 1-6. The obtained compound was identified by LC-MS. C$_{38}$H$_{32}$BNO$_2$: M$^+$ 545.2

Synthesis of Compound 4

2.7 g (5.0 mmol) of Intermediate 4-6, 1.9 g (6.0 mmol) of Compound 4-B, 0.09 g (0.1 mmol) of Pd$_2$(dba)$_3$, 0.01 g (0.1 mmol) of Pt—Bu$_3$, and 1.0 g (10.0 mmol) of KOt-Bu were dissolved in 20 mL of toluene, and then, the mixture was stirred at a temperature of 85° C. for 4 hours. The reaction solution was cooled to room temperature, and then, extracted three time with 20 mL of water and 20 mL of diethylether. A collected organic layer was dried by using magnesium sulfate, and then the residual obtained by evaporating the solvent was separation-purified by using silica gel column chromatography to obtain 2.8 g (Yield: 85%) of Compound 4. The produced compound was identified by MS/FAB and $^1$H NMR. C$_{50}$H$_{32}$N$_2$ cal. 660.25. found 661.23.

$^1$H NMR (CDCl$_3$, 400 MHz) δ 8.13-8.10 (m, 1H), 8.00 (d, 1H), 7.87-7.85 (m, 1H), 7.73 (d, 1H), 7.67-7.65 (ss, 1H), 7.62-7.58 (m, 3H), 7.53 (ss, 1H), 7.49-7.45 (m, 9H), 7.29-7.25 (s, 1H), 7.20 (d, 1H), 7.08-7.02 (m, 6H), 6.75-6.72 (m, 2H), 6.66-6.58 (m, 4H), 6.32-6.27 (m, 5H), 6.06-6.03 (m, 2H), 1.63 (s, 6H)

Synthesis Example 2

Synthesis of Compound 31

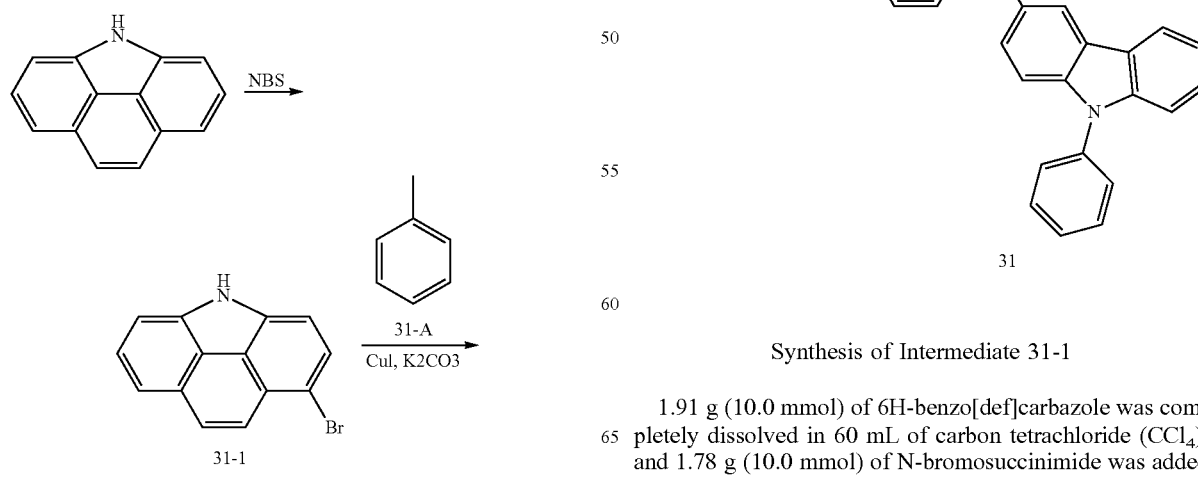

Synthesis of Intermediate 31-1

1.91 g (10.0 mmol) of 6H-benzo[def]carbazole was completely dissolved in 60 mL of carbon tetrachloride (CCl$_4$), and 1.78 g (10.0 mmol) of N-bromosuccinimide was added thereto, and then the mixture was stirred at a temperature of 80° C. for 30 minutes. The reaction solution was cooled to room temperature, and then, stirred for 30 minutes to precipitate crystals. The crystals were collected by using a reduced-pressure filter, and then washed with methanol, whereby 1.1 g (Yield: 45%) of Intermediate 1-9 was obtained as a white crystal. The obtained compound was identified by LC-MS. $C_{14}H_8BrN$: $M^+$ 268.9

Synthesis of Intermediate 31-2

Intermediate 31-2 was synthesized in the same manner as used to synthesize Intermediate 4-5, except that Intermediate 31-1 was used instead of Intermediate 4-4, and iodine benzene was used instead of Compound 4-5. The obtained compound was identified by LC-MS. $C_{20}H_{12}BrN$: $M^+$ 345.0

Synthesis of Intermediate 31-3

Intermediate 31-3 was synthesized in the same manner as used to synthesize Intermediate 4-6, except that Intermediate 31-2 was used instead of Intermediate 4-5. The obtained compound was identified by LC-MS. $C_{26}H_{24}BNO_2$: $M^+$ 393.2

Synthesis of Compound 31

1.9 g (5.0 mmol) of Intermediate 31-3, 1.9 g (6.0 mmol) of Compound 31-μ, 0.09 g (0.1 mmol) of $Pd_2(dba)_3$, 0.01 g (0.1 mmol) of Pt—$Bu_3$, and 1.0 g (10.0 mmol) of KOt-Bu were dissolved in 20 mL of toluene, and then, the mixture was stirred at a temperature of 85° C. for 4 hours. The reaction solution was cooled to room temperature, and then, extracted three time with 20 mL of water and 20 mL of diethylether. A collected organic layer was dried by using magnesium sulfate, and then the residual obtained by evaporating the solvent was separation-purified by using silica gel column chromatography to obtain 2.2 g (Yield: 85%) of Compound 31. The produced compound was identified by MS/FAB and $^1$H NMR. $C_{38}H_{24}N_2$ cal. 508.19. found 509.11.

$^1$H NMR (CDCl$_3$, 400 MHz) δ 8.13-8.10 (m, 1H), 8.00 (d, 1H), 7.87-7.85 (m, 1H), 7.73 (d, 1H), 7.67-7.65 (ss, 1H), 7.62-7.58 (m, 3H), 7.53 (ss, 1H), 7.49-7.45 (m, 9H), 7.29-7.25 (s, 1H), 7.20 (d, 1H), 7.08-7.02 (m, 6H), 6.75-6.72 (m, 2H), 6.66-6.58 (m, 4H), 6.32-6.27 (m, 5H), 6.06-6.03 (m, 2H), 1.63 (s, 6H)

Additional compounds were synthesized by using the same synthesis method as described above and appropriate intermediate materials, and $^1$H NMR and MS/FAB results of the synthetic compounds are shown in Table 1 below.

Methods of synthesizing compounds other than the compound shown in Table 1 are obvious to one of skill in the art by referring to the synthesis path and source materials described above.

TABLE 1

| Compound | $^1$H NMR (CDCl$_3$, 400 MHz) δ | MS/FAB found | MS/FAB calc. |
|---|---|---|---|
| 2 | 8.11 (d, 1H), 8.00-7.95 (m, 2H), 7.83 (dd, 1H), 7.78-7.76 (d, 1H), 7.62-7.54 (m, 3H), 7.51-7.46 (m, 5H), 7.40-7.35 (m, 4H), 7.32-7.19 (m, 6H), 0.26(s, 9H) | 581.21 | 580.23 |
| 4 | 8.11 (d, 1H), 8.00-7.95 (m, 2H), 7.83 (dd, 1H), 7.80-7.76 (m, 5H), 7.56-7.47 (m, 12H), 7.44-7.19 (m, 11H) | 661.28 | 660.25 |
| 9 | 8.40-8.35 (m, 4H), 8.24-8.17 (m, 4H), 7.94 (d, 1H), 7.86-7.82 (m, 2H), 7.74-7.64 (m, 7H), 7.54-7.47 (m, 4H), 7.42-7.19 (m, 7H) | 664.22 | 663.24 |
| 13 | 8.21 (d, 1H), 8.11 (d, 1H), 8.05 (d, 1H), 7.91-7.89 (m, 1H), 7.83 (dd, 1H), 7.73 (d, 1H), 7.55 (d, 1H), 7.50-7.46 (m, 9H), 7.39-7.19 (m, 14H), 7.11 (d, 1H), | 674.33 | 673.25 |
| 14 | 8.24-8.20 (m, 2H), 8.14-8.07 (m, 4H), 7.99 (d, 1H), 7.94-7.79 (m, 7H), 7.74-7.58 (m, 6H), 7.54-7.47 (m, 6H), 7.42-7.19 (m, 7H) | 713.35 | 712.26 |
| 19 | 8.22-8.21 (m, 1H), 8.04-8.00 (m, 2H), 7.85 (d, 1H), 7.80-7.75 (m, 6H), 7.64 (d, 1H), 7.58-7.48 (m, 13H), 7.44-7.27 (m, 7H), 7.20 (d, 1H) | 661.31 | 660.25 |
| 22 | 8.17-8.01 (m, 6H), 8.04-8.00 (m, 2H), 7.83 (s, 1H), 7.88-7.79 (m, 4H), 7.74-7.68 (m, 3H), 7.56-7.48 (m, 8H), 7.39-7.26 (m, 5H), 7.20 (d, 1H) | 663.30 | 662.24 |
| 25 | 8.36-8.32 (m, 4H), 8.26 (d, 1H), 8.19-8.10 (m, 3H), 8.01-7.97 (m, 4H), 7.88-7.79 (m, 4H), 7.74-7.66 (m, 3H), 7.61-7.55 (m, 4H), 7.54-7.49 (m, 8H), 7.42-7.27 (m, 5H), 7.20 (d, 1H) | 816.29 | 815.30 |
| 26 | 8.44 (s, 1H), 8.27 (d, 1H), 8.14-8.10 (m, 2H), 8.00-7.97 (m, 1H), 7.86-7.75 (m, 5H), 7.64-7.27 (m, 17H), 7.22-7.17 (m, 2H) | 636.21 | 635.23 |
| 29 | 8.34-8.30 (m, 2H), 8.22-8.16 (m, 5H), 8.08-8.04 (m, 2H), 7.96 (s, 1H), 7.85 (d, 1H), 7.80-7.76 (m, 2H), 7.58-7.47 (m, 12H), 7.39-7.27 (m, 8H), 7.21-7.19 (m, 1H) | 739.36 | 738.27 |
| 31 | 8.13 (s, 1H), 8.00 (d, 1H), 7.80-7.70 (m, 4H), 7.62-7.46 (m, 11H), 7.40-7.26 (m, 6H), 7.21-7.19 (m, 1H) | 509.30 | 508.19 |
| 33 | 8.13 (s, 1H), 8.05-7.95 (m, 3H), 7.89 (d, 1H), 7.84-7.78 (m, 2H), 7.73-7.70 (m, 3H), 7.65-7.27 (m, 16H), 7.21-7.19 (m, 1H) | 586.23 | 585.22 |

TABLE 1-continued

| Compound | ¹H NMR (CDCl₃, 400 MHz) δ | MS/FAB found | MS/FAB calc. |
|---|---|---|---|
| 36 | 8.17-8.14 (m, 2H), 8.01-7.97 (m, 2H), 7.90 (s, 1H), 7.85-7.58 (m, 18H), 7.52-7.19 (m, 15H), 7.11-7.09 (m, 1H) | 814.33 | 813.31 |
| 38 | 8.40-8.35 (m, 4H), 8.18-8.06 (m, 4H), 7.90 (d, 1H), 7.80-7.64 (m, 10H), 7.54-7.47 (m, 4H), 7.42-7.28 (m, 5H), 7.21-7.19 (m, 1H) | 664.33 | 663.24 |
| 41 | 8.18-8.06 (m, 4H), 7.99 (d, 1H), 7.91-7.84 (m, 5H), 7.80-7.70 (m, 7H), 7.65-7.59 (m, 3H), 7.51-7.46 (m, 4H), 7.39-7.27 (m, 3H), 7.21-7.19 (m, 1H) | 637.22 | 636.23 |
| 42 | 8.24 (d, 1H), 8.13 (d, 1H), 8.06-8.04 (m, 1H), 7.85-7.78 (m, 4H), 7.60 (dd, 2H), 7.52-7.48 (m, 10H), 7.41-7.26 (m, 10H), 7.21-7.19 (m, 2H) | 674.22 | 673.25 |
| 45 | 8.24 (d, 1H), 8.13 (d, 1H), 8.06-8.04 (m, 1H), 7.80-7.70 (m, 4H), 7.61 (d, 1H), 7.55 (d, 1H) 7.51-7.46 (m, 6H), 7.39-7.25 (m, 13H), 7.21-7.14 (m, 3H) | 674.32 | 673.25 |
| 48 | 8.18-8.12 (d, 3H), 8.02-7.97 (m, 1H), 7.92-7.80 (m, 3H), 7.75-7.49 (m, 11H), 7.44-7.27 (m, 7H), 7.21-7.19 (m, 2H) | 586.33 | 585.22 |
| 49 | 8.14-8.12 (m, 1H), 7.92-7.85 (m, 2H), 7.81-7.73 (m, 3H), 7.62-7.58 (m, 3H), 7.54-7.47 (m, 5H), 7.41-7.27 (m, 8H), 7.21-7.19 (m, 1H), 0.26 (s, 9H), | 581.22 | 580.23 |
| 52 | 8.14-8.12 (m, 1H), 8.09-7.99 (m, 4H), 7.92-7.85 (m, 2H), 7.80-7.77 (m, 2H), 7.73-7.70 (m, 1H), 7.66-7.44 (m, 16H), 7.39-7.27 (m, 4H), 7.21-7.19 (m, 1H) | 662.32 | 661.25 |
| 54 | 8.47-8.40 (m, 4H), 8.21-8.15 (m, 4H), 7.92-7.85 (m, 2H), 7.74-7.64 (m, 8H), 7.54-7.48 (m, 4H), 7.42-7.27 (m, 6H), 7.21-7.19 (m, 1H) | 664.22 | 663.24 |
| 56 | 8.29-8.12 (m, 8H), 7.95-7.85 (m, 7H), 7.75-7.68 (m, 3H), 7.62-7.58 (m, 4H), 7.54-7.48 (m, 8H), 7.42-7.27 (m, 7H), 7.21-7.19 (m, 1H) | 815.31 | 814.30 |
| 59 | 8.37-8.32 (m, 1H), 8.14-8.12 (m, 1H), 7.92-7.85 (m, 4H), 7.78-7.73 (m, 2H), 7.61 (d, 1H), 7.54-7.46 (m, 9H), 7.41-7.27 (m, 11H), 7.21-7.19 (m, 2H) | 674.22 | 673.25 |
| 62 | 8.34-8.30 (m, 2H), 8.24-8.12 (m, 4H), 8.01-7.85 (m, 7H), 7.75-7.68 (m, 4H), 7.64-7.59 (m, 3H), 7.54-7.48 (m, 6H), 7.42-7.27 (m, 5H), 7.21-7.19 (m, 1H) | 713.22 | 712.26 |
| 65 | 8.35-8.32 (m, 1H), 8.17-7.14 (m, 4H), 7.92 (d, 1H), 7.85-7.76 (m, 9H), 7.65-7.31 (m, 24H) | 814.33 | 813.31 |
| 68 | 8.41 (d, 1H), 8.37-8.30 (m, 4H), 8.20-8.18 (m, 1H), 8.14 (d, 1H), 8.08-8.03 (m, 2H), 7.93 (dd, 1H), 7.74 (d, 1H), 7.70-7.65 (m, 4H), 7.60-7.30 (m, 14H) | 664.21 | 663.24 |
| 69 | 8.70 (d, 1H), 8.42-8.40 (m, 1H), 8.26-8.17 (m, 11H), 8.06 (d, 1H), 7.96-7.92 (m, 4H), 7.71-7.66 (m, 4H), 7.60-7.52 (m, 9H), 7.42-7.38 (m, 1H), 7.30-7.25 (m, 4H) | 817.28 | 816.30 |
| 71 | 8.63-8.60 (m, 1H), 8.55-8.50 (m, 8H), 8.43-8.41 (m, 1H), 8.26-8.13 (m, 4H), 7.98-7.92 (m, 2H), 7.80 (d, 1H), 7.74-7.56 (m, 11H), 7.60-7.58 (d, 1H), 7.42-7.38 (m, 5H) | 819.31 | 818.29 |
| 73 | 8.63 (d, 1H), 8.43-8.41 (m, 1H), 8.25 (d, 1H), 8.16-8.14 (m, 1H), 8.07-7.95 (m, 3H), 7.90-7.84 (m, 7H), 7.64-7.30 (m, 14H), | 637.21 | 636.23 |
| 75 | 8.43-8.41 (m, 2H), 8.26-8.24 (m, 1H), 8.17-8.12 (m, 2H), 8.00-7.97 (m, 2H), 7.89-7.79 (m, 7H), 7.64-7.41 (m, 17H), 7.37-7.33 (m, 1H), 7.21-7.17 (m, 2H) | 763.22 | 762.27 |
| 78 | 8.37-8.33 (m, 1H), 8.28-8.26 (m, 1H), 8.23-8.20 (m, 2H), 7.95-7.93 (m, 1H), 7.87 (dd, 1H), 7.77 (d, 1H), 7.58-7.45 (m, 11H), 7.40-7.26 (m, 12H), 7.21-7.19 (m, 1H) | 674.23 | 673.25 |
| 79 | 8.37-8.33 (m, 2H), 8.28-8.26 (m, 1H), 8.23-8.20 (m, 2H), 7.95-7.93 (m, 1H), 7.87 (dd, 1H), 7.77 (d, 1H), 7.57 (d, 1H), 7.52-7.46 (m, 10H), 7.40-7.20 (m, 17H), 7.12-7.10 (m, 1H) | 839.28 | 838.30 |
| 80 | 8.00 (d, 1H), 7.95 (d, 1H), 7.89 (d, 1H), 7.80 (dd, 1H), 7.76 (d, 1H), 7.58-7.45 (m, 7H), 7.40-7.26 (m, 18H), 7.20-7.18 (m, 1H) | 674.18 | 673.25 |
| 83 | 8.81 (d, 1H), 8.64-8.60 (m, 4H), 8.33-8.31 (m, 1H), 8.24-8.18 (m 2H), 7.99-7.97 (m, 1H), 7.80-7.76 (m, 2H), 7.69-7.65 (m, 4H), 7.60-7.30 (m, 14H) | 664.21 | 663.24 |

TABLE 1-continued

| Compound | $^1$H NMR (CDCl$_3$, 400 MHz) δ | MS/FAB found | MS/FAB calc. |
|---|---|---|---|
| 84 | 8.73 (d, 1H), 8.32-8.16 (m, 7H), 7.99-7.90 (m, 6H), 7.80-7.76 (m, 2H), 7.60-7.30 (m, 22H) | 815.25 | 814.30 |
| 86 | 8.63 (d, 1H), 8.27-8.15 (m, 12H), 7.99-7.94 (m, 4H), 7.81-7.52 (m, 14H), 7.44-7.42 (m, 1H), 7.31-7.26 (m, 4H) | 817.28 | 816.30 |
| 88 | 8.50 (d, 1H), 8.37-8.30 (m, 8H), 8.26-8.18 (m, 4H), 8.00-7.99 (m, 1H), 7.89-7.79 (m, 3H), 7.74-7.56 (m, 12H), 7.44-7.38 (m, 5H) | 819.31 | 818.29 |
| 91 | 8.41 (d, 1H), 8.34-8.30 (m, 3H), 8.24-8.18 (m, 2H), 8.01-7.99 (m, 2H), 7.94-7.86 (m, 4H), 7.80-7.75 (m, 2H), 7.64-7.30 (m, 18H) | 713.24 | 712.26 |
| 92 | 8.41 (d, 1H), 8.26-8.18 (m, 4H), 8.00-7.97 (m, 3H), 7.90-7.56 (m, 23H), 7.44-7.40 (m, 1H) | 765.31 | 764.26 |
| 95 | 8.11 (d, 1H), 7.95 (d, 1H), 7.81-7.70 (m, 4H), 7.65-7.47 (m, 9H), 7.42-7.27 (m, 7H), 7.20-7.18 (m, 1H), 0.26(s, 9H) | 581.22 | 580.23 |
| 99 | 8.27 (d, 1H), 8.19-8.16 (m, 3H), 7.91-7.73 (m, 6H), 7.62-7.30 (m 17H) | 586.20 | 585.22 |
| 104 | 8.71 (d, 1H), 8.45-8.43 (m, 1H), 8.28-8.19 (m, 7H), 8.02-7.84 (m, 9H), 7.76-7.70 (m, 5H), 7.64-7.52 (m, 7H), 7.42-7.38 (m, 1H), 7.30-7.26 (m, 3H) | 791.22 | 790.28 |
| 106 | 8.45-8.40 (m, 2H), 8.29 (d, 1H), 8.24-8.18 (m, 3H), 7.85-7.73 (m, 4H), 7.66-7.28 (m, 18H), 7.17 (d, 1H) | 636.20 | 635.23 |
| 107 | 8.71 (d, 1H), 8.45-8.42 (m, 1H), 8.20 (d, 1H), 8.02-7.84 (m, 7H), 7.76-7.72 (m, 4H), 7.64-7.47 (m, 10H), 7.42-7.30 (m, 4H) | 637.19 | 636.23 |

Example 1

An anode was manufactured as follows: a substrate, on which ITO, Ag, and ITO were respectively deposited to thicknesses of 70 Å, 1000 Å, and 70 Å, was cut to a size of 50 mm×50 mm×0.5 mm, and then sonicated with isopropyl alcohol and pure water each for 5 minutes, and then washed by irradiation of ultraviolet ray for 30 minutes and ozone, and the result glass substrate was provided to a vacuum deposition apparatus.

2-TNATA was vacuum deposited on the substrate to form a HIL having a thickness of 600 Å, and then, 4,4'-bis[N-(1-naphthyl)-N-phenylamino]biphenyl (NPB), a hole transportation compound, was vacuum deposited thereon to form a HTL having a thickness of 1000 Å.

Compound 4, which is a green phosphorescent host, and Ir(ppy)$_3$, which is a dopant, were co-deposited on the HTL at a weight ratio of 91 to 9 to form an EML having a thickness of 250 Å. Then, BCP, which is a hole blocking compound, was vacuum deposited on the EML to form a HBL having a thickness of 50 Å to form a hole block layer. Subsequently, Alq$_3$ was deposited thereon to form an ETL having a thickness of 350 Å, and then, LiF, which is a halogenated alkali metal, was deposited on the ETL to form an EIL having a thickness of 10 Å, and Mg and Ag were deposited at weight ratio of 90 to 10 to a thickness of 120 Å to form an electrode, thereby completing manufacturing of an organic electroluminescent (EL) light-emitting device.

The device had, at a current density of 10 mA/cm$^2$, a driving voltage of 5.5 V, a luminescence brightness of 5430 cd/m$^2$, a luminescence efficiency of 54.3 cd/A, and a half-lifespan(hr @100 mA/cm$^2$) of 82 hours.

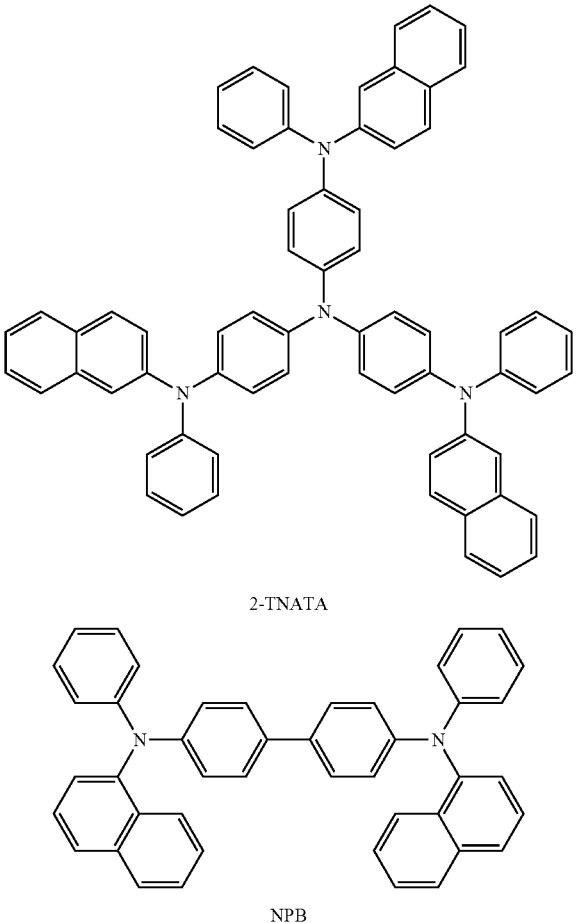

2-TNATA

NPB

-continued

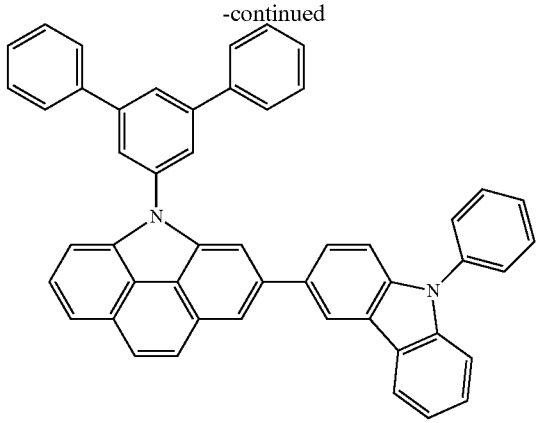

4

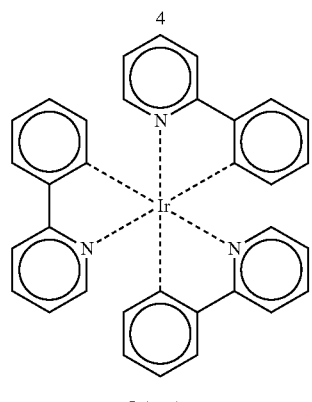

Ir(ppy)₃

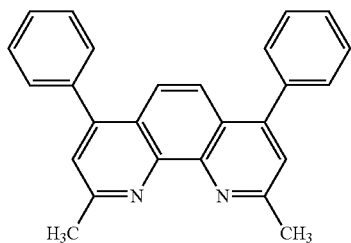

BCP

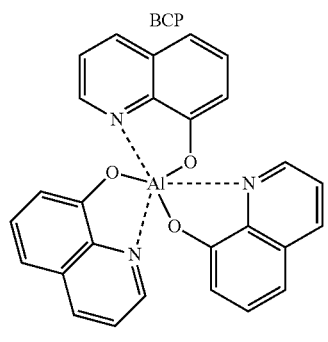

Alq₃

Example 2

An organic EL device was manufactured in the same manner as in Example 1, except that in forming the EML, Compound 29 was used instead of Compound 4.

The device had, at a current density of 10 mA/cm², a driving voltage of 5.4 V, a luminescence brightness of 5,290 cd/m², a luminescence efficiency of 53.0 cd/A, and a half-lifespan(hr @100 mA/cm²) of 68 hours.

Example 3

An organic EL device was manufactured in the same manner as in Example 1, except that in forming the EML, Compound 31 was used instead of Compound 4.

The device had, at a current density of 10 mA/cm², a driving voltage of 5.4 V, a luminescence brightness of 5,307 cd/m², a luminescence efficiency of 53.1 cd/A, and a half-lifespan(hr @100 mA/cm²) of 78 hours.

Example 4

An organic EL device was manufactured in the same manner as in Example 1, except that in forming the EML, Compound 52 was used instead of Compound 4.

The device had, at a current density of 10 mA/cm², a driving voltage of 5.6 V, a luminescence brightness of 5,523 cd/m², a luminescence efficiency of 55.2 cd/A, and a half-lifespan(hr @100 mA/cm²) of 73 hours.

Example 5

An organic EL device was manufactured in the same manner as in Example 1, except that in forming the EML, Compound 65 was used instead of Compound 4.

The device had, at a current density of 10 mA/cm², a driving voltage of 5.6 V, a luminescence brightness of 5,712 cd/m², a luminescence efficiency of 57.1 cd/A, and a half-lifespan(hr @100 mA/cm²) of 85 hours.

Example 6

An organic EL device was manufactured in the same manner as in Example 1, except that in forming the EML, Compound 83 was used instead of Compound 4.

The device had, at a current density of 10 mA/cm², a driving voltage of 5.5 V, a luminescence brightness of 5,168 cd/m², a luminescence efficiency of 51.7 cd/A, and a half-lifespan(hr @100 mA/cm²) of 65 hours.

Example 7

An organic EL device was manufactured in the same manner as in Example 1, except that in forming the EML, Compound 95 was used instead of Compound 4.

The device had, at a current density of 10 mA/cm², a driving voltage of 5.3 V, a luminescence brightness of 5,420 cd/m², a luminescence efficiency of 54.2 cd/A, and a half-lifespan(hr @100 mA/cm²) of 92 hours.

Example 8

An organic EL device was manufactured in the same manner as in Example 1, except that in forming the EML, Compound 110 was used instead of Compound 4.

The device had, at a current density of 10 mA/cm², a driving voltage of 5.4 V, a luminescence brightness of 5,854 cd/m², a luminescence efficiency of 58.5 cd/A, and a half-lifespan(hr @100 mA/cm²) of 102 hours.

Example 9

An organic EL device was manufactured in the same manner as in Example 1, except that in forming the EML, Compound 117 was used instead of Compound 4.

The device had, at a current density of 10 mA/cm², a driving voltage of 5.3 V, a luminescence brightness of 5,914 cd/m$^2$, a luminescence efficiency of 59.1 cd/A, and a half-lifespan(hr @100 mA/cm$^2$) of 111 hours.

Example 10

An organic EL device was manufactured in the same manner as in Example 1, except that in forming the HTL, 4,4'-bis[N-(1-naphthyl)-N-phenylamino]biphenyl (NPB), which was a hole transportation material, was vacuum deposited to a thickness of 1,350 Å to form the HTL, and Compound 14, which is a red phosphorescent host, and BtpIr (bis(2-(2'-benzo[4,5-a]thienyl) pyridinato-N, C3') iridium acetylacetonate), which is a dopant, were co-deposited on the HTL at a weight ratio of 94 to 6 to form the EML having a thickness of 400 Å.

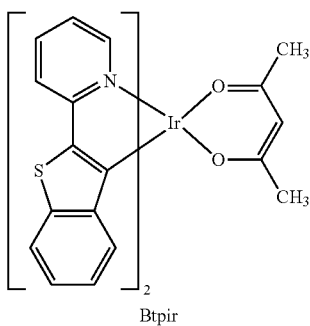

Btpir

The device had, at a current density of 10 mA/cm$^2$, a driving voltage of 5.7 V, a luminescence brightness of 2,762 cd/m$^2$, a luminescence efficiency of 27.6 cd/A, and a half-lifespan (hr @100 mA/cm$^2$) of 96 hours.

Example 11

An organic EL device was manufactured in the same manner as in Example 10, except that in forming the EML, Compound 26 was used instead of Compound 14.

The device had, at a current density of 10 mA/cm$^2$, a driving voltage of 5.8 V, a luminescence brightness of 2,616 cd/m$^2$, a luminescence efficiency of 26.2 cd/A, and a half-lifespan(hr @100 mA/cm$^2$) of 89 hours.

Example 12

An organic EL device was manufactured in the same manner as in Example 10, except that in forming the EML, Compound 41 was used instead of Compound 14.

The device had, at a current density of 10 mA/cm$^2$, a driving voltage of 5.6 V, a luminescence brightness of 2,742 cd/m$^2$, a luminescence efficiency of 27.4 cd/A, and a half-lifespan(hr @100 mA/cm$^2$) of 91 hours.

Example 13

An organic EL device was manufactured in the same manner as in Example 10, except that in forming the EML, Compound 69 was used instead of Compound 14.

The device had, at a current density of 10 mA/cm$^2$, a driving voltage of 5.5 V, a luminescence brightness of 2,660 cd/m$^2$, a luminescence efficiency of 26.6 cd/A, and a half-lifespan(hr @100 mA/cm$^2$) of 78 hours.

Example 14

An organic EL device was manufactured in the same manner as in Example 10, except that in forming the EML, Compound 91 was used instead of Compound 14.

The device had, at a current density of 10 mA/cm$^2$, a driving voltage of 5.7 V, a luminescence brightness of 2,742 cd/m$^2$, a luminescence efficiency of 27.4 cd/A, and a half-lifespan(hr @100 mA/cm$^2$) of 94 hours.

Example 15

An organic EL device was manufactured in the same manner as in Example 10, except that in forming the EML, Compound 104 was used instead of Compound 14.

The device had, at a current density of 10 mA/cm$^2$, a driving voltage of 5.6 V, a luminescence brightness of 2,816 cd/m$^2$, a luminescence efficiency of 28.2 cd/A, and a half-lifespan(hr @100 mA/cm$^2$) of 97 hours.

Example 16

An organic EL device was manufactured in the same manner as in Example 10, except that in forming the EML, Compound 107 was used instead of Compound 14.

The device had, at a current density of 10 mA/cm$^2$, a driving voltage of 5.7 V, a luminescence brightness of 2,542 cd/m$^2$, a luminescence efficiency of 25.4 cd/A, and a half-lifespan(hr @100 mA/cm$^2$) of 86 hours.

Example 17

An organic EL device was manufactured in the same manner as in Example 10, except that in forming the EML, Compound 111 was used instead of Compound 14.

The device had, at a current density of 10 mA/cm$^2$, a driving voltage of 5.6 V, a luminescence brightness of 2,956 cd/m$^2$, a luminescence efficiency of 29.6 cd/A, and a half-lifespan(hr @100 mA/cm$^2$) of 120 hours.

Example 18

An organic EL device was manufactured in the same manner as in Example 10, except that in forming the EML, Compound 126 was used instead of Compound 14.

The device had, at a current density of 10 mA/cm$^2$, a driving voltage of 5.8 V, a luminescence brightness of 2,516 cd/m$^2$, a luminescence efficiency of 25.2 cd/A, and a half-lifespan(hr @100 mA/cm$^2$) of 87 hours.

Example 19

An organic EL device was manufactured in the same manner as in Example 1, except that in forming the ETL, Compound 69 was used instead of Alq$_3$.

The device had, at a current density of 10 mA/cm$^2$, a driving voltage of 5.3 V, a luminescence brightness of 5,790 cd/m$^2$, a luminescence efficiency of 57.9 cd/A, and a half-lifespan(hr @100 mA/cm$^2$) of 119 hours.

Example 20

An organic EL device was manufactured in the same manner as in Example 19, except that in forming the ETL, Compound 103 was used instead of Compound 69.

The device had, at a current density of 10 mA/cm$^2$, a driving voltage of 5.2 V, a luminescence brightness of 5,917 cd/m², a luminescence efficiency of 59.2 cd/A, and a half-lifespan(hr @100 mA/cm²) of 85 hours.

Comparative Example 1

An organic EL device was manufactured in the same manner as in Example 1, except that in forming the EML, 4,4'-N, N'-dicarbazolbiphenyl (CBP), which is a green phosphorescent host, was used instead of Compound 4.

electron transport material. As a result, compared with CBP, the compounds had a high driving voltage, high efficiency, and excellent I-V-L characteristics, and in particular, lifespan improvement effects were high and thus, a lifespan was substantially prolonged. Representative characteristics and lifespan results were summarized and results thereof are shown in Table 2.

TABLE 2

| | Host or electron transport material | Driving voltage (V) | Current density (mA/cm²) | Brightness (cd/m²) | Efficiency (cd/A) | Emission color | Lifespan LT97 (hours) |
|---|---|---|---|---|---|---|---|
| Example 1 | Compound 4 | 5.5 | 10 | 5,430 | 54.3 | Green | 82 |
| Example 2 | Compound 29 | 5.4 | 10 | 5,290 | 53.0 | Green | 68 |
| Example 3 | Compound 31 | 5.4 | 10 | 5,307 | 53.1 | Green | 78 |
| Example 4 | Compound 52 | 5.6 | 10 | 5,523 | 55.2 | Green | 73 |
| Example 5 | Compound 65 | 5.6 | 10 | 5,712 | 57.1 | Green | 85 |
| Example 6 | Compound 83 | 5.5 | 10 | 5,168 | 51.7 | Green | 65 |
| Example 7 | Compound 95 | 5.3 | 10 | 5,420 | 54.2 | Green | 92 |
| Example 8 | Compound 110 | 5.4 | 10 | 5,854 | 58.5 | Green | 102 |
| Example 9 | Compound 117 | 5.3 | 10 | 5,914 | 59.1 | Green | 111 |
| Example 10 | Compound 14 | 5.7 | 10 | 2,762 | 27.6 | Red | 96 |
| Example 11 | Compound 26 | 5.8 | 10 | 2,616 | 26.2 | Red | 89 |
| Example 12 | Compound 41 | 5.6 | 10 | 2,742 | 27.4 | Red | 91 |
| Example 13 | Compound 69 | 5.5 | 10 | 2,660 | 26.6 | Red | 78 |
| Example 14 | Compound 91 | 5.7 | 10 | 2,742 | 27.4 | Red | 94 |
| Example 15 | Compound 104 | 5.6 | 10 | 2,816 | 28.2 | Red | 97 |
| Example 16 | Compound 107 | 5.7 | 10 | 2,542 | 25.4 | Red | 86 |
| Example 17 | Compound 111 | 5.6 | 10 | 2,956 | 29.6 | Red | 120 |
| Example 18 | Compound 126 | 5.8 | 10 | 2,516 | 25.2 | Red | 87 |
| Example 19 | Compound 69 | 5.3 | 10 | 5,790 | 57.9 | Green | 119 |
| Example 20 | Compound 103 | 5.2 | 10 | 5,917 | 59.2 | Green | 85 |
| Comparative Example 1 | CBP | 6.5 | 10 | 3,210 | 32.1 | Green | 32 |
| Comparative Example 2 | CBP | 6.8 | 10 | 1,643 | 16.4 | Red | 45 |

The device had, at a current density of 10 mA/cm², a driving voltage of 6.5 V, a luminescence brightness of 3,210 cd/m², a luminescence efficiency of 32.1 cd/A, and a half-lifespan (hr @100 mA/cm²) of 32 hours.

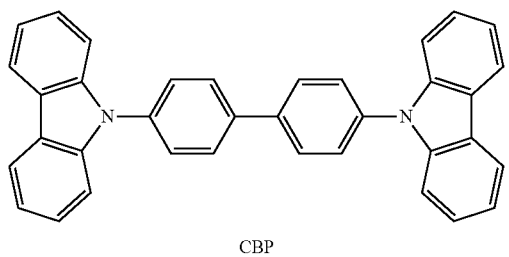 [SMILES: c1ccc2c(c1)c1ccccc1n2-c1ccc(-c2ccc(-n3c4ccccc4c4ccccc43)cc2)cc1 ; "CBP"]

CBP

Comparative Example 2

An organic EL device was manufactured in the same manner as in Example 1, except that in forming the EML, 14,4'-N,N'-dicarbazolbiphenyl (CBP), which is a red phosphorescent host, was used instead of Compound 4.

The device had, at a current density of 10 mA/cm², a driving voltage of 6.8 V, a luminescence brightness of 1,643 cd/m², a luminescence efficiency of 16.4 cd/A, and a half-lifespan(hr @100 mA/cm²) of 45 hours.

Compounds represented by Formula 1 were used as a host material for green and red phosphorescent EMLs or an By way of summation and review, the heterocyclic compound represented by Formula 1 may have excellent electric characteristics, a high charge transporting capability, a high light-emitting capability, a high glass transition temperature, and a crystallization-preventing capability. The material may thus be suitable for use as an electron transport material, an electron injection material, a light-emitting material, or an electron transport material in a full color organic light-emitting fluorescent or phosphorescent device (e.g., a device whose emission layer includes a red layer, a green layer, a blue layer, and a white layer). An organic light-emitting device including the heterocyclic material may have high efficiency, low voltage, high brightness, long lifespan.

An OLED may have a structure including a substrate, and an anode, a hole transport layer, an emission layer, an electron transport layer, and a cathode which are sequentially stacked on the substrate. The hole transport layer, the emission layer, and the electron transport layer are organic thin films formed of organic compounds.

When a voltage is applied between the anode and the cathode, holes injected from the anode pass the hole transport layer and migrate toward the emission layer, and electrons injected from the cathode pass the electron transport layer and migrate toward the emission layer. The holes and the electrons are recombined with each other in the emission layer to generate excitons. Then, the excitons are transitioned from an excited state to a ground state, thereby generating light.

Tris(2-phenylpyridine)iridium(Ir(ppy)₃), which is a phosphorescent material used in OLEDs, emits a spectrum at CIE 0.30, 0.63 and its maximum power efficiency is quantum efficiency of 6%. However, although organic EL devices use "electric-phosphorescence", the low efficiency, lifespan, and stability of tris(2-phenylpyridine)iridium(Ir(ppy)$_3$) may not be suitable for high efficiency and high quality displays.

Accordingly, provided is a phosphorescent material that may provide high efficiency and long lifespan at low voltage and an organic EL device including the phosphorescent material. Further, provided are materials that may have excellent electric stability, a high charge transporting capability, a high light-emitting capability, a high glass transition temperature, and a crystallization-preventing ability, e.g., compared to mono-molecular organic materials.

Compounds according to embodiments may be used as a light-emitting material or an electron transport material for an organic light-emitting device. Also, provided are compounds that include a heteroring and that may have a high glass transition temperature (Tg) or a high melting point. Accordingly, during light-emission, stability against Joule's heat between organic layers or between an organic layer and a metal electrode, and stability under high-temperature environments may increase. An organic EL device manufactured by using the heterocyclic compound according to an embodiment may have high durability during storage and driving.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A heterocyclic compound represented by Formula 1 below:

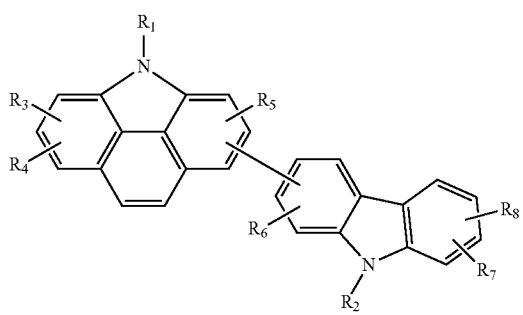

<Formula 1> wherein in Formula 1, $R_1$ to $R_8$ are each independently a hydrogen atom, a deuterium atom, a substituted or unsubstituted $C_1$ to $C_{60}$ alkyl group, a substituted or unsubstituted $C_3$ to $C_{60}$ cycloalkyl group, a substituted or unsubstituted $C_2$ to $C_{60}$ heteroaryl group, a substituted or unsubstituted $C_6$ to $C_{60}$ aryl group, or a substituted or unsubstituted $C_6$ to $C_{60}$ condensed polycyclic group, with the proviso that $R_2$ is not

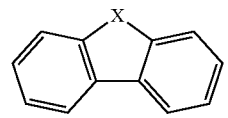

wherein X is O, S, or Se.

2. The heterocyclic compound as claimed in claim 1, wherein:

the heterocyclic compound of Formula 1 is represented by Formula 2 below:

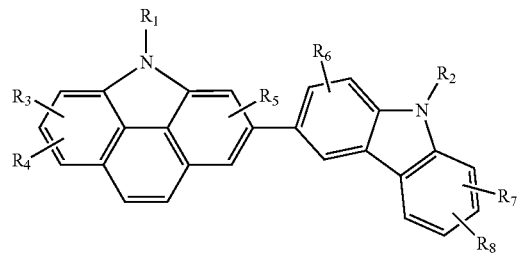

<Formula 2> and $R_1$ to $R_8$ in Formula 2 are the same as defined in claim 1.

3. The heterocyclic compound as claimed in claim 1, wherein:

the heterocyclic compound of Formula 1 is represented by Formula 3 below:

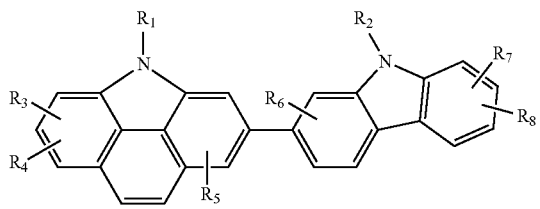

<Formula 3> and $R_1$ to $R_8$ in Formula 3 are the same as defined in claim 1.

4. The heterocyclic compound as claimed in claim 1, wherein:

the heterocyclic compound of Formula 1 is represented by Formula 4 below:

<Formula 4>

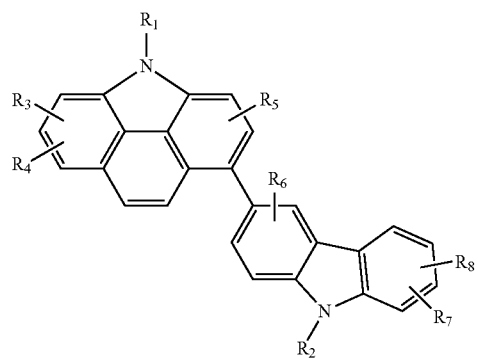

and R₁ to R₈ in Formula 4 are the same as defined in claim 1.

5. The heterocyclic compound as claimed in claim 1, wherein:
the heterocyclic compound of Formula 1 is represented by Formula 5 below:

<Formula 5>

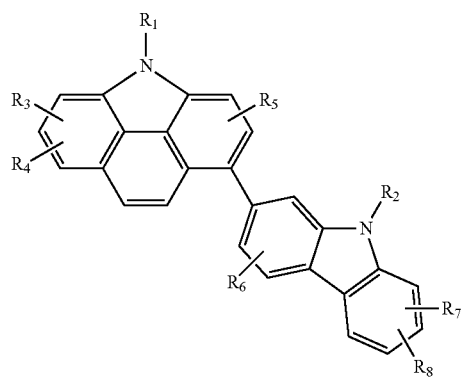

and R₁ to R₈ in Formula 5 are the same as defined in claim 1.

6. The heterocyclic compound as claimed in claim 1, wherein:
R₁ and R₂ in Formula 1 are each independently any one of Formulae 2a to 2d below

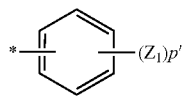

2a

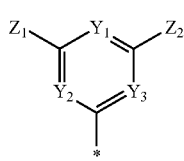

2b

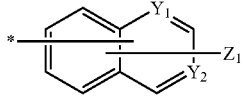

2c

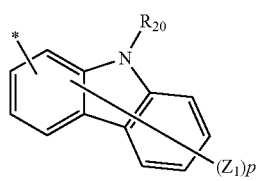

2d and in Formulae 2a to 2d, $Y_1$ to $Y_3$ are each independently N or CH;

$Z_1$, $Z_2$, and $R_{20}$ are each independently a hydrogen atom, a deuterium atom, a substituted or unsubstituted $C_1$ to $C_{20}$ alkyl group, a $C_1$ to $C_{20}$ alkylsilyl group, a $C_1$ to $C_{20}$ arylsilyl, a substituted or unsubstituted $C_6$ to $C_{20}$ aryl group, a substituted or unsubstituted $C_2$ to $C_{20}$ heteroaryl group, a substituted or unsubstituted $C_6$ to $C_{20}$ condensed polycyclic group, an amino group substituted with a $C_6$ to $C_{20}$ aryl group or a $C_2$ to $C_{20}$ heteroaryl group, a halogen group, a cyano group, a nitro group, a hydroxyl group, or a carboxyl group, and each $Z_1$ in Formulae 2a to 2d may be identical to or different from each other;

p' is an integer of 1 to 5, p is an integer of 1 to 7; and

* indicates a binding location.

7. The heterocyclic compound as claimed in claim 1, wherein R₃ to R₈ in Formula 1 are each independently a hydrogen atom or a deuterium atom.

8. The heterocyclic compound as claimed in claim 1, wherein the compound of Formula 1 is any one of compounds below:

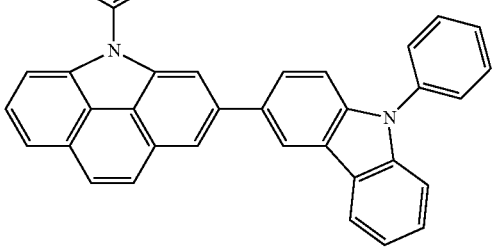

4

-continued
14
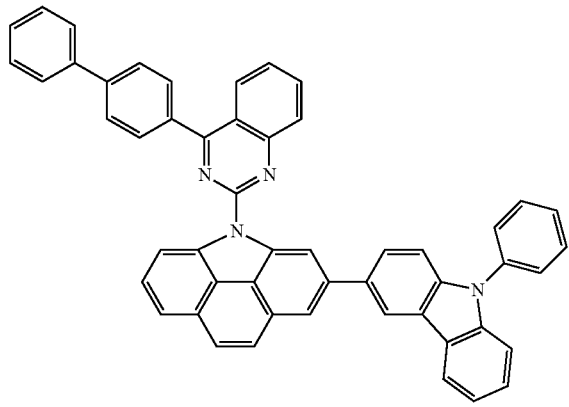
26
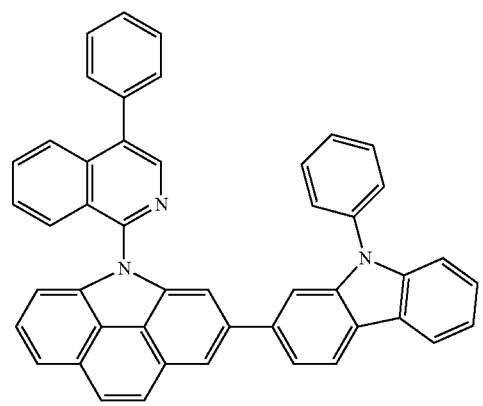
29
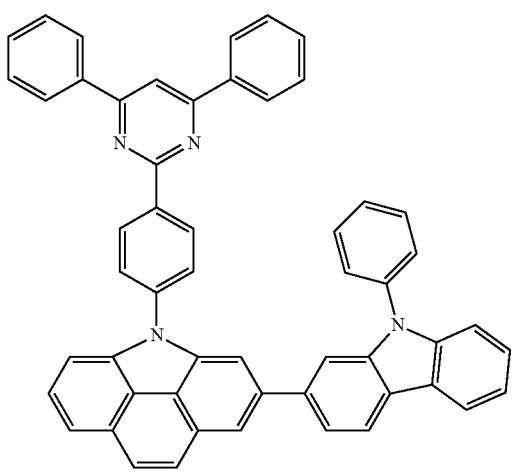
-continued
31
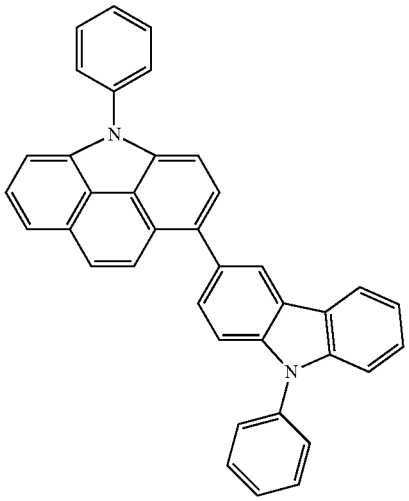
41
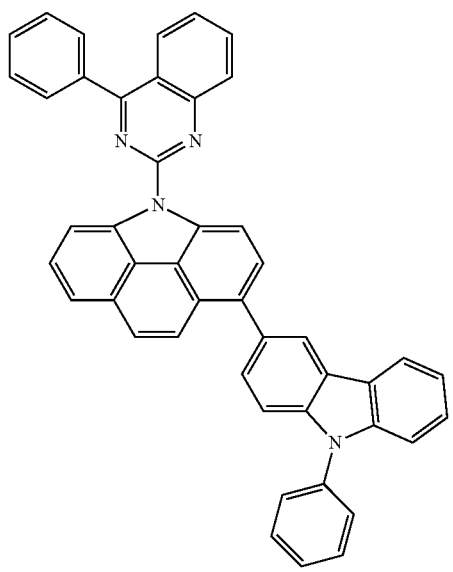
52
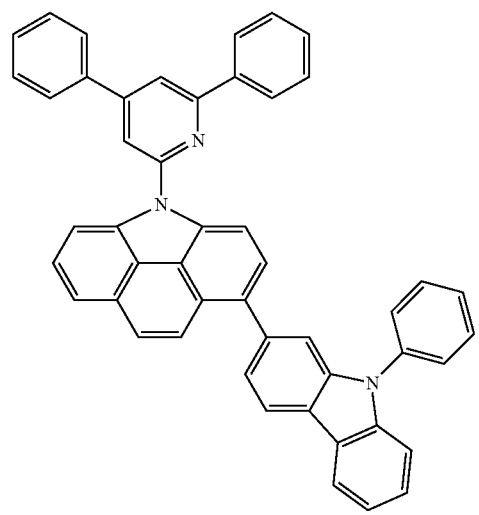

65
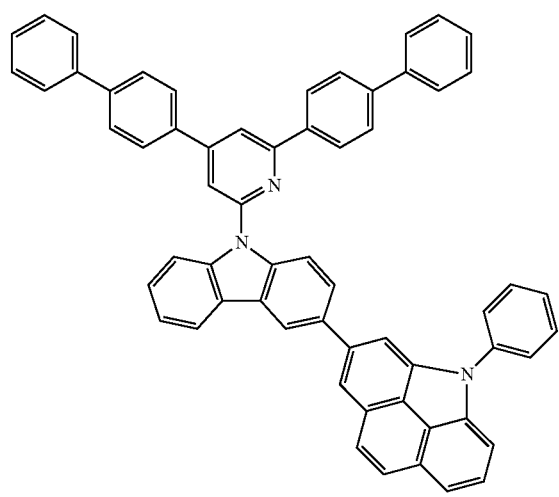
69
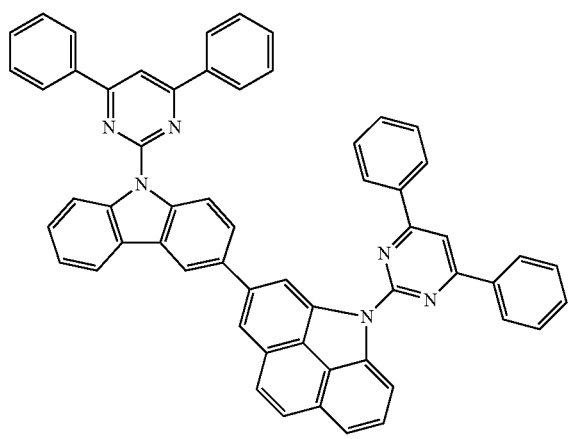
83
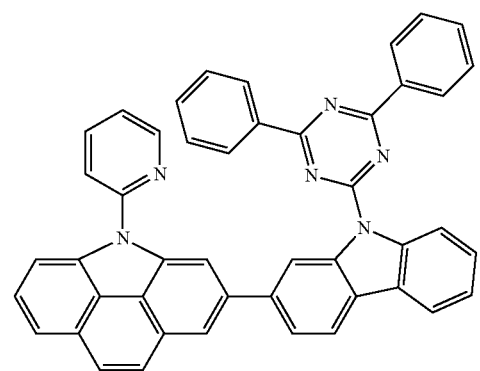
91
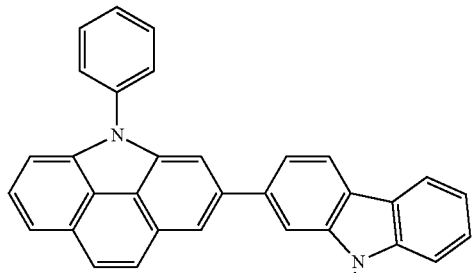
95
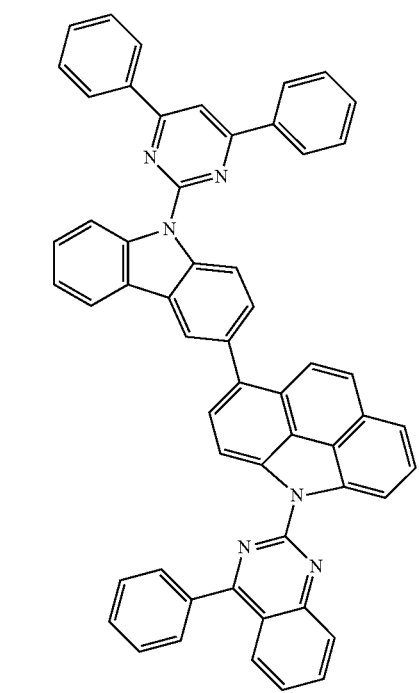
104

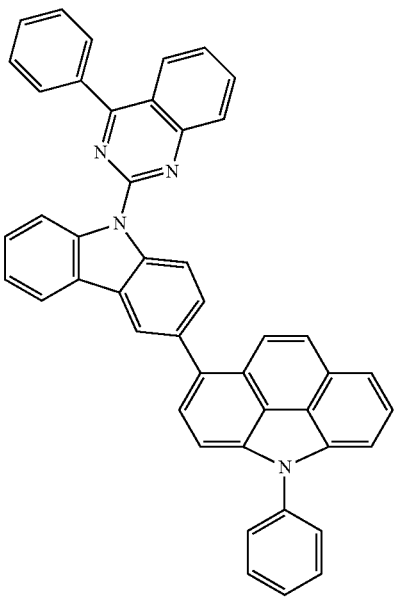

9. An organic light-emitting device, comprising:
a first electrode;
a second electrode; and
an organic layer interposed between the first electrode and the second electrode,
wherein the organic layer includes the heterocyclic compound as claimed in claim 1.

10. The organic light-emitting device as claimed in claim 9, wherein the organic layer is an emission layer or an electron transport layer.

11. The organic light-emitting device as claimed in claim 9, wherein:
the organic layer includes an emission layer, an electron injection layer, an electron transport layer, a functional layer having an electron injection capability and an electron transport capability, a hole injection layer, a hole transport layer, or a functional layer having a hole injection capability and a hole transportation capability, and
the emission layer includes an anthracene-based compound, an arylamine-based compound, or a styryl-based compound.

12. The organic light-emitting device as claimed in claim 9, wherein:
the organic layer includes an emission layer, an electron injection layer, an electron transport layer, a functional layer having an electron injection capability and an electron transport capability, a hole injection layer, a hole transport layer, or a functional layer having a hole injection capability and a hole transportation capability, and
the emission layer includes a red layer, a green layer, a blue layer, or a white layer, one of which includes a phosphorescent compound.

13. The organic light-emitting device as claimed in claim 12, wherein the hole injection layer, the hole transport layer, or the functional layer having a hole injection capability and a hole transport capability includes a charge-generation material.

14. The organic light-emitting device as claimed in claim 13, wherein the charge-generation material is a p-dopant.

15. The organic light-emitting device as claimed in claim 14, wherein the p-dopant is a quinone derivative.

16. The organic light-emitting device as claimed in claim 14, wherein the p-dopant is a metal oxide.

17. The organic light-emitting device as claimed in claim 14, wherein the p-dopant is a compound containing a cyano group.

18. The organic light-emitting device as claimed in claim 9, wherein the organic layer includes an electron transport layer, and the electron transport layer further comprises a metal oxide.

19. The organic light-emitting device as claimed in claim 9, wherein the organic layer is formed by coating the heterocyclic compound.

20. A flat display apparatus comprising the organic light-emitting device of claim 9, wherein the first electrode of the organic light-emitting device is electrically connected to a source electrode or a drain electrode of a thin film transistor.

* * * * *